US009799832B2

(12) United States Patent
Takizawa et al.

(10) Patent No.: US 9,799,832 B2
(45) Date of Patent: Oct. 24, 2017

(54) ORGANIC THIN-FILM TRANSISTOR AND METHOD FOR MANUFACTURING SAME

(71) Applicant: FUJIFILM Corporation, Tokyo (JP)

(72) Inventors: Hiroo Takizawa, Kanagawa (JP); Teruki Niori, Kanagawa (JP); Yasunori Yonekuta, Kanagawa (JP); Syuji Hirano, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/252,898

(22) Filed: Aug. 31, 2016

(65) Prior Publication Data

US 2016/0372662 A1 Dec. 22, 2016

Related U.S. Application Data

(63) Continuation of application No. PCT/JP2015/055707, filed on Feb. 26, 2015.

(30) Foreign Application Priority Data

Mar. 3, 2014 (JP) ................................ 2014-040903

(51) Int. Cl.

| | |
|---|---|
| ***H01L 51/00*** | (2006.01) |
| ***H01L 51/05*** | (2006.01) |
| ***C08F 212/08*** | (2006.01) |
| ***C08F 220/10*** | (2006.01) |

(Continued)

(52) U.S. Cl.

CPC .......... *H01L 51/004* (2013.01); *C08F 212/08* (2013.01); *C08F 220/10* (2013.01);

(Continued)

(58) Field of Classification Search

CPC ............... H01L 51/004; H01L 51/0043; H01L 51/0055; H01L 51/0071; H01L 51/0094

See application file for complete search history.

(56) References Cited

U.S. PATENT DOCUMENTS

2007/0071881 A1* 3/2007 Chua ...................... B82Y 10/00 427/58

2010/0019233 A1* 1/2010 Kawashima ........ H01L 51/0537 257/40

(Continued)

FOREIGN PATENT DOCUMENTS

JP 2004-525501 A 8/2004

JP 2009-524226 A 6/2009

(Continued)

OTHER PUBLICATIONS

International Search Report issued in PCT/JP2015/055707; dated May 19, 2015.

(Continued)

*Primary Examiner* — Christine Enad

(74) *Attorney, Agent, or Firm* — Studebaker & Brackett PC

(57) ABSTRACT

An organic thin-film transistor including: a gate electrode, an organic semiconductor layer, a gate insulating layer, a source electrode, and a drain electrode on a substrate, in which the organic semiconductor layer includes an organic semiconductor and a resin (C) having one or more groups selected from the group consisting of a group having fluorine atoms, a group having silicon atoms, an alkyl group having one or more carbon atoms or having two or more carbon atoms in a case of forming an alkoxycarbonyl group, a cycloalkyl group, an aralkyl group, an aryloxycarbonyl group, an aromatic ring group substituted with at least one alkyl group, and an aromatic ring group substituted with at least one cycloalkyl group; and a method for manufacturing an organic thin-film transistor including: applying a coating solution which contains the organic semiconductor and the resin (C) and causing the resin (C) to be unevenly distributed.

13 Claims, 1 Drawing Sheet

(51) Int. Cl.

| | |
|---|---|
| ***C08F 220/14*** | (2006.01) |
| ***C08F 220/22*** | (2006.01) |
| ***C08F 222/20*** | (2006.01) |

(52) U.S. Cl.

CPC .......... *C08F 220/14* (2013.01); *C08F 220/22* (2013.01); *C08F 222/20* (2013.01); *H01L 51/0043* (2013.01); *H01L 51/0055* (2013.01); *H01L 51/0071* (2013.01); *H01L 51/0094* (2013.01); *H01L 51/052* (2013.01); *H01L 51/0529* (2013.01); *C08F 2500/02* (2013.01); *H01L 51/0003* (2013.01); *H01L 51/0073* (2013.01); *H01L 51/0074* (2013.01); *H01L 51/0541* (2013.01); *H01L 51/0545* (2013.01); *H01L 51/0558* (2013.01)

(56) References Cited

U.S. PATENT DOCUMENTS

2010/0044684 A1* 2/2010 Sirringhaus ......... H01L 51/0012 257/40
2012/0261648 A1* 10/2012 Wu ..................... H01L 51/0074 257/40
2012/0298974 A1* 11/2012 Lee ...................... C08G 65/007 257/40
2015/0060800 A1* 3/2015 Qiu ........................... B05C 1/00 257/40

FOREIGN PATENT DOCUMENTS

| | | | |
|---|---|---|---|
| JP | 2009-177136 | A | 8/2009 |
| JP | 2011-508967 | A | 3/2011 |
| JP | 2012-227518 | A | 11/2012 |
| TW | 201408670 | A | 3/2014 |
| WO | 2005/015982 | A2 | 2/2005 |

OTHER PUBLICATIONS

The extended European search report issued by the European Patent Office dated Feb. 10, 2017, which corresponds to European Patent Application No. 15758485.5-1555 and is related to U.S. Appl. No. 15/252,898.

Peng Gao; "Thiophene-Containing Organic Semiconducting Heteroacenes for Electronic Applications"; Elektronische Publikationen der Universitat Mainz; 2010.

* cited by examiner

ORGANIC THIN-FILM TRANSISTOR AND METHOD FOR MANUFACTURING SAME

CROSS-REFERENCE TO RELATED APPLICATIONS

This application is a Continuation of PCT International Application No. PCT/JP2015/055707 filed on Feb. 26, 2015, which claims priority under 35 U.S.C. §119 (a) to Japanese Patent Application No. JP2014-40903 filed in Japan on Mar. 3, 2014. Each of the above applications is hereby expressly incorporated by reference, in its entirety, into the present application.

BACKGROUND OF THE INVENTION

1. Field of the Invention

The present invention relates to an organic thin-film transistor and a method for manufacturing the same.

2. Description of the Related Art

Most of display devices such as a liquid crystal display, an organic EL display, and an electrophoretic display include a thin-film transistor (hereinafter, also referred to as a "TFT") as a display switching device. A TFT includes a gate electrode, a gate insulating layer, a source electrode, and a drain electrode, and the source electrode and the drain electrode are connected to each other through a semiconductor layer.

As materials forming the semiconductor layer of the TFT, inorganic materials such as silicon have been the mainstream.

However, in recent years, organic materials, which can be efficiently used for film formation at a temperature lower than those of inorganic materials, for example, near room temperature at a high speed and at low cost according to a coating method such as a printing method, have been attracting attention and studied.

As the organic materials, an organic semiconductor such as an organic polymer is known.

Further, a combination of such an organic semiconductor and a polymer other than the organic semiconductor has been reported (JP2004-525501A).

Moreover, in an organic thin-film transistor (also referred to as an OTFT), JP2009-177136A describes a method of forming a semiconductor layer having a three-layer structure by phase-separating an organic material that contains TIPS pentacene and poly(α-methylstyrene) or polystyrene.

SUMMARY OF THE INVENTION

However, since an organic binder or the like combining with an organic semiconductor has insulating properties, even when these are simply used in combination as described in JP2004-525501A or an organic material is phase-separated to form a semiconductor layer as described in JP2009-177136A, the characteristics of the organic thin-film transistor are still not sufficient, and there is a room for improvement for carrier mobility, durability, and a threshold voltage.

An object of the present invention is to provide an organic thin-film transistor which has high carrier mobility and excellent durability and exhibits a low threshold voltage.

Further, another object thereof is to provide a method for manufacturing an organic thin-film transistor having the above-described excellent characteristics.

As a result of research on organic materials forming an organic semiconductor layer conducted by the present inventors, it was found that a charge transfer channel of the organic semiconductor layer may be secured so that high carrier mobility can be maintained, and the threshold voltage can be further reduced when an organic semiconductor is combined with a specific resin.

The present invention was completed based on these findings.

The above-described objects are achieved by the following means.

(1) An organic thin-film transistor comprising, on a substrate: a gate electrode; an organic semiconductor layer; a gate insulating layer provided between the gate electrode and the organic semiconductor layer; and a source electrode and a drain electrode provided in contact with the organic semiconductor layer and connected to each other through the organic semiconductor layer, wherein the organic semiconductor layer includes an organic semiconductor and a resin (C) having one or more groups selected from the group consisting of a group having fluorine atoms, a group having silicon atoms, an alkyl group having one or more carbon atoms or having two or more carbon atoms in a case of forming an alkoxycarbonyl group, a cycloalkyl group, an aralkyl group, an aryloxycarbonyl group, an aromatic ring group substituted with at least one alkyl group, and an aromatic ring group substituted with at least one cycloalkyl group.

(2) The organic thin-film transistor according to (1), in which the resin (C) has a repeating unit represented by any one of the following Formulae (C-Ia) to (C-Id).

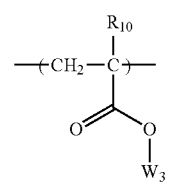

(C-Ia)

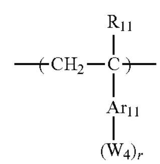

(C-Ib)

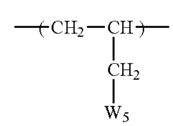

(C-Ic)

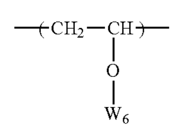

(C-Id)

In the formula, $R_{10}$ and $R_{11}$ represent a hydrogen atom, a fluorine atom, or an alkyl group.

$W_3$ represents an organic group having one or more groups selected from the group consisting of a group having fluorine atoms, a group having silicon atoms, an alkyl group having two or more carbon atoms, a cycloalkyl group, an aryl group, and an aralkyl group.

$W_4$ represents an organic group having one or more groups selected from the group consisting of a fluorine atom, a group having fluorine atoms, a group having silicon atoms, an alkyl group, and a cycloalkyl group.

$W_5$ and $W_6$ represent an organic group having one or more groups selected from the group consisting of a group having fluorine atoms, a group having silicon atoms, an alkyl group, a cycloalkyl group, an aryl group, and an aralkyl group.

$Ar_{11}$ represents an (r+1)-valent aromatic ring group.

r represents an integer of 1 to 10.

(3) The organic thin-film transistor according to (1) or (2), in which the resin (C) has at least one of a group having fluorine atoms or a group having silicon atoms.

(4) The organic thin-film transistor according to any one of (1) to (3), in which the organic semiconductor is unevenly distributed on the gate insulating layer side, and the resin (C) is unevenly distributed on the opposite side to the gate insulating layer.

(5) The organic thin-film transistor according to any one of (1) to (4), in which the organic semiconductor is phase-separated on the gate insulating layer side, and the resin (C) is phase-separated on the opposite side to the gate insulating layer.

(6) The organic thin-film transistor according to any one of (1) to (5), in which the surface energy of the resin (C) is 30 $mNm^{-1}$ or less.

(7) The organic thin-film transistor according to any one of (1) to (6), in which the organic thin-film transistor is a bottom-gate type OTFT.

(8) The organic thin-film transistor according to (7), in which the organic thin-film transistor is a bottom-contact type OTFT.

(9) The organic thin-film transistor according to any one of (1) to (8), in which the organic semiconductor is a low molecular weight compound.

(10) The organic thin-film transistor according to any one of (1) to (9), in which the organic semiconductor is a condensed polycyclic aromatic compound.

(11) The organic thin-film transistor according to any one of (1) to (10), in which the organic semiconductor is a compound represented by any one of the following Formulae (C) to (T).

Formula (C)

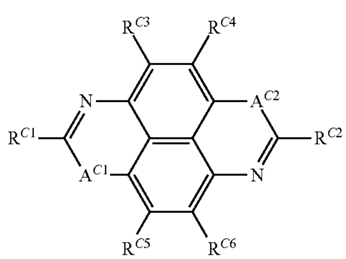

Formula (D)

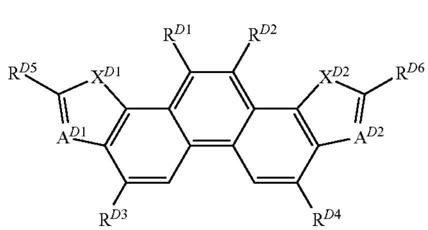

-continued

Formula (E)

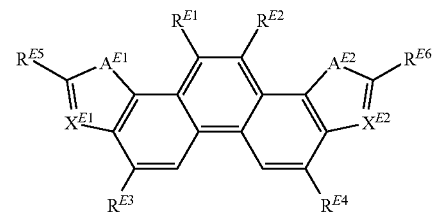

Formula (F)

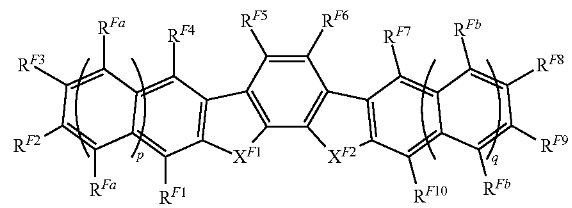

Formula (G)

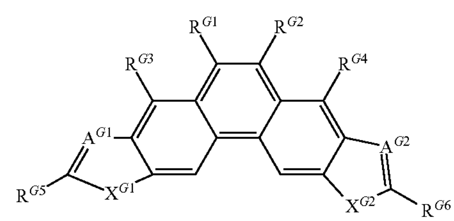

Formula (H)

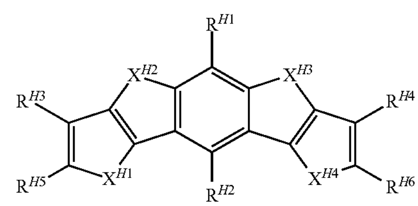

Formula (J)

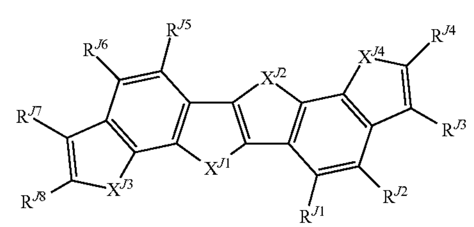

Formula (K)

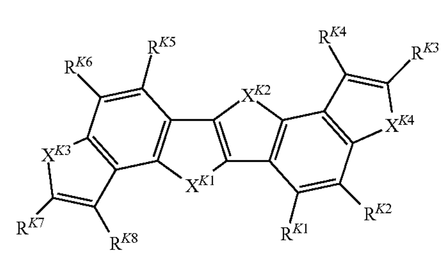

-continued

Formula (L)

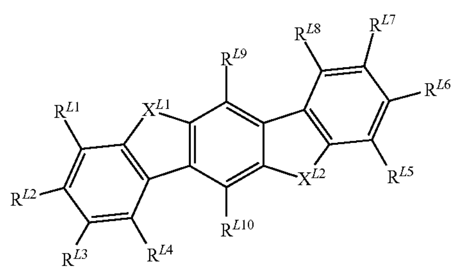

Formula (M)

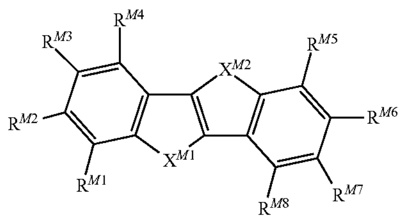

Formula (N)

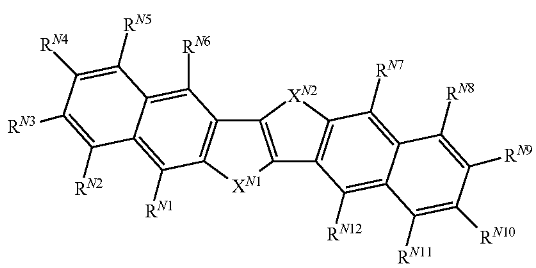

Formula (P)

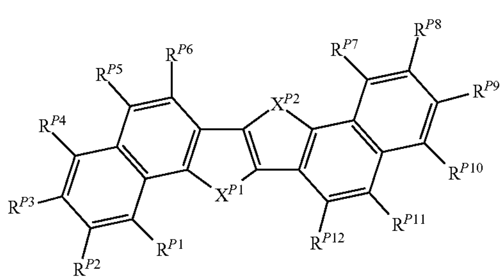

Formula (Q)

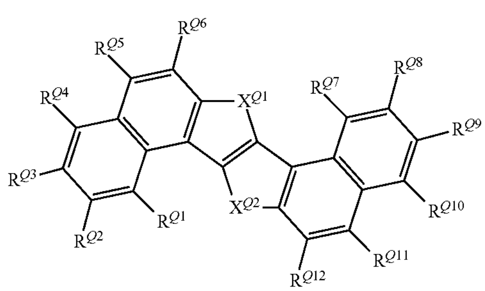

Formula (R)

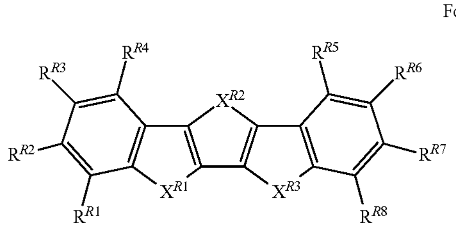

-continued

Formula (S)

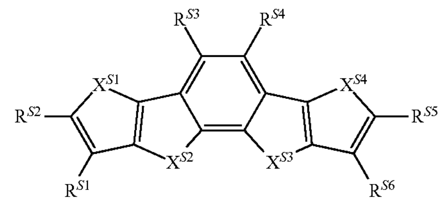

Formula (T)

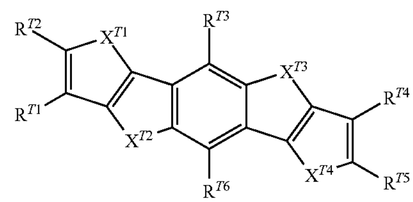

In Formula (C), $A^{C1}$ and $A^{C2}$ represent an oxygen atom, a sulfur atom, or a selenium atom. $R^{C1}$ to $R^{C6}$ represent a hydrogen atom or a substituent, and at least one of $R^{C1}$, . . . , or $R^{C6}$ represents a substituent represented by the following Formula (W).

In Formula (D), $X^{D1}$ and $X^{D2}$ represent $NR^{D9}$, an oxygen atom, or a sulfur atom. $A^{D1}$ represents $CR^{D7}$ or a nitrogen atom, $A^{D2}$ represents $CR^{D8}$ or a nitrogen atom, and $R^{D9}$ represents a hydrogen atom, an alkyl group, an alkenyl group, an alkynyl group, or an acyl group. $R^{D1}$ to $R^{D8}$ represent a hydrogen atom or a substituent, and at least one of $R^{D1}$, . . . , or $R^{D8}$ represents a substituent represented by the following Formula (W).

In Formula (E), $X^{E1}$ and $X^{E2}$ represent an oxygen atom, a sulfur atom, or $NR^{E7}$. $A^{E1}$ and $A^{E2}$ represent $CR^{E8}$ or a nitrogen atom. $R^{E1}$ to $R^{E8}$ represent a hydrogen atom or a substituent, and at least one of $R^{E1}$, . . . , or $R^{E8}$ represents a substituent represented by the following Formula (W).

In Formula (F), $X^{F1}$ and $X^{F2}$ represent an oxygen atom, a sulfur atom, or a selenium atom. $R^{F1}$ to $R^{10}$, $R^{Fa}$, and $R^{Fb}$ represent a hydrogen atom or a substituent, and at least one of $R^{F1}$, . . . , or $R^{F10}$, $R^{Fa}$, and $R^{Fb}$ represents a substituent represented by Formula (W). p and q represent an integer of 0 to 2.

In Formula (G), $X^{G1}$ and $X^{G2}$ represent $NR^{G9}$, an oxygen atom, or a sulfur atom. $A^{G1}$ represents $CR^{G7}$ or a nitrogen atom. $A^{G2}$ represents $CR^{G8}$ or a nitrogen atom. $R^{G9}$ represents a hydrogen atom, an alkyl group, an alkenyl group, an alkynyl group, an acyl group, an aryl group, or a heteroaryl group, $R^{G1}$ to $R^{G8}$ represent a hydrogen atom or a substituent, and at least one of $R^{G1}$, . . . , or $R^{G8}$ represents a substituent represented by the following Formula (W).

In Formula (H), $X^{H1}$ and $X^{H4}$ represent $NR^{H7}$, an oxygen atom, or a sulfur atom, and $R^{H7}$ represents a hydrogen atom, an alkyl group, an alkenyl group, an alkynyl group, an acyl group, an aryl group, or a heteroaryl group. $R^{H1}$ to $R^{H6}$ represent a hydrogen atom or a substituent, and at least one of $R^{H1}$, . . . , or $R^{H6}$ represents a substituent represented by the following Formula (W).

In Formula (J), $X^{J1}$ and $X^{J2}$ represent an oxygen atom, a sulfur atom, a selenium atom, or $NR^{J9}$. $X^{J3}$ and $X^{J4}$ represent an oxygen atom, a sulfur atom, or a selenium atom. $FR^{J1}$ to $R^{J9}$ represent a hydrogen atom or a substituent, and at least one of $R^{J1}$, . . . , or $R^{J9}$ represents a substituent represented by the following Formula (W).

In Formula (K), $X^{K1}$ and $X^{K2}$ represent an oxygen atom, a sulfur atom, a selenium atom, or $NR^{K9}$. $X^{K3}$ and $X^{K4}$ represent an oxygen atom, a sulfur atom, or a selenium atom. $R^{K1}$ to $R^{K9}$ represent a hydrogen atom or a substituent, and at least one of $R^{K1}$, . . . , or $R^{K9}$ represents a substituent represented by the following Formula (W).

In Formula (L), $X^{L1}$ and $X^{L2}$ represent an oxygen atom, a sulfur atom, or $NR^{L11}$. $R^{L1}$ to $R^{L11}$ represent a hydrogen atom or a substituent, and at least one of $R^{L1}$, . . . , or $R^{L11}$ represents a substituent represented by the following Formula (W).

In Formula (M), $X^{M1}$ and $X^{M2}$ represent an oxygen atom, a sulfur atom, a selenium atom, or $NR^{M9}$. $R^{M1}$ to $R^{M9}$ represent a hydrogen atom or a substituent, and at least one of $R^{M1}$, . . . , or $R^{M9}$ represents a substituent represented by the following Formula (W).

In Formula (N), $X^{N1}$ and $X^{N2}$ represent an oxygen atom, a sulfur atom, a selenium atom, or $NR^{N13}$. $R^{N1}$ to $R^{N13}$ represent a hydrogen atom or a substituent, and at least one of $R^{N1}$, . . . , or $R^{N13}$ represents a substituent represented by the following Formula (W).

In Formula (P), $X^{P1}$ and $X^{P2}$ represent an oxygen atom, a sulfur atom, a selenium atom, or $NR^{P13}$. $R^{P1}$ to $R^{P13}$ represent a hydrogen atom or a substituent, and at least one of $R^{P1}$, . . . , or $R^{P13}$ represents a substituent represented by the following Formula (W).

In Formula (Q), $X^{Q1}$ and $X^{Q2}$ represent an oxygen atom, a sulfur atom, a selenium atom, or $NR^{Q13}$. $R^{Q1}$ to $R^{Q13}$ represent a hydrogen atom or a substituent, and at least one of $R^{Q1}$, . . . , or $R^{Q13}$ represents a substituent represented by the following Formula (W).

In Formula (R), $X^{R1}$, $X^{R2}$, and $X^{R3}$ represent an oxygen atom, a sulfur atom, a selenium atom, or $NR^{R9}$. $R^{R1}$ to $R^{R9}$ represent a hydrogen atom or a substituent, and at least one of $R^{R1}$, . . . , or $R^{R9}$ represents a substituent represented by the following Formula (W).

In Formula (S), $X^{S1}$, $X^{S2}$, $X^{S3}$, and $X^{S4}$ represent an oxygen atom, a sulfur atom, a selenium atom, or $NR^{S7}$. $R^{S1}$ to $R^{S7}$ represent a hydrogen atom or a substituent, and at least one of $R^{S1}$, . . . , or $R^{S7}$ represents a substituent represented by the following Formula (W), In Formula (T), $X^{T1}$, $X^{T2}$, $X^{T3}$, and $X^{T4}$ represent an oxygen atom, a sulfur atom, a selenium atom, or $NR^{T7}$. $R^{T1}$ to $R^{T7}$ represent a hydrogen atom or a substituent, and at least one of $R^{T1}$, . . . , or $R^{T7}$ represents a substituent represented by the following Formula (W).

$$-L-R^{W} \qquad \text{Formula (W):}$$

In Formula (W), L represents a divalent linking group represented by any one of the following Formulae (L-1) to (L-25) or a divalent linking group in which two or more divalent linking groups represented by any one of the following Formulae (L-1) to (L25) are bonded to each other.

$R^{W}$ represents a substituted or unsubstituted alkyl group, a cyano group, a vinyl group, an ethynyl group, an oxyethylene group, an oligooxyethylene group in which a repeating number v of oxyethylene units is 2 or greater, a siloxane group, an oligosiloxane group having 2 or more silicon atoms, or a substituted or unsubstituted trialkylsilyl group.

(L-1)

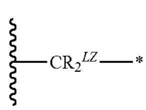

-continued (L-2)

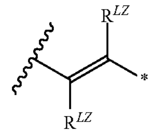

(L-3)

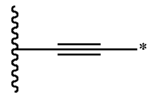

(L-4)

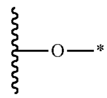

(L-5)

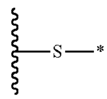

(L-6)

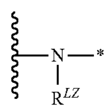

(L-7)

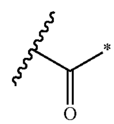

(L-8)

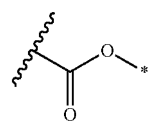

(L-9)

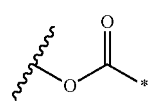

(L-10)

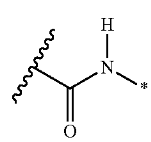

(L-11)

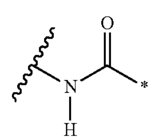

(L-12)

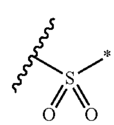

(L-13)

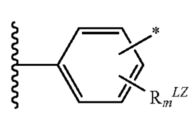

(L-14)

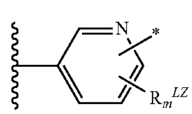

-continued (L-15)

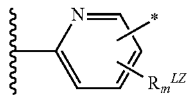

(L-16)

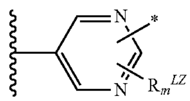

(L-17)

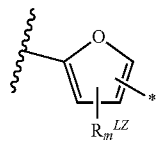

(L-18)

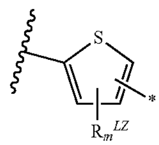

(L-19)

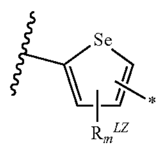

(L-20)

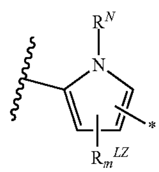

(L-21)

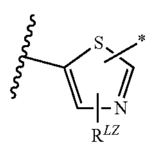

(L-22)

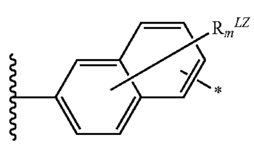

(L-23)

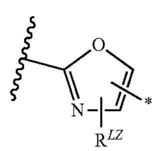

(L-24)

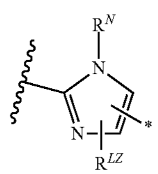

(L-25)

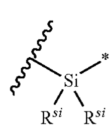

In Formulae (L-1) to (L-25), each wavy line part represents a binding position with respect to a ring forming each skeleton represented by any one of Formulae (C) to (T). The symbol "*" represents a binding position with respect to $R^w$ or a binding position with respect to a wavy line part represented by Formula (L-1) to (L-25).

m in Formula (L-13) represents 4, m's in Formulae (L-14) and (L-15) represent 3, m's in Formulae (L-16) to (L-20) represent 2, and m in Formula (L-22) represents 6.

$R^{LZ}$'s in Formulae (L-1), (L-2), (L-6), and (L-13) to (L-24) each independently represent a hydrogen atom or a substituent.

$R^N$'s represent a hydrogen atom or a substituent. $R^{si}$'s each independently represent a hydrogen atom, an alkyl group, an alkenyl group, or an alkynyl group.

(12) The organic thin-film transistor according to (11), in which the organic semiconductor is a compound represented by any one of Formulae (C), (F), (J), and (L).

(13) The organic thin-film transistor according to any one of (1) to (12), in which the gate insulating layer is formed of an organic polymer.

(14) A method for manufacturing an organic thin-film transistor which includes, on a substrate, a gate electrode; an organic semiconductor layer; a gate insulating layer provided between the gate electrode and the organic semiconductor layer; and a source electrode and a drain electrode provided in contact with the organic semiconductor layer and connected to each other through the organic semiconductor layer, the method comprising: coating the substrate or the gate insulating layer with a coating solution which contains an organic semiconductor and a resin (C) having one or more groups selected from the group consisting of a group having fluorine atoms, a group having silicon atoms, an alkyl group having one or more carbon atoms or having two or more carbon atoms in a case of forming an alkoxycarbonyl group, a cycloalkyl group, an aralkyl group, an aryloxycarbonyl group, an aromatic ring group substituted with at least one alkyl group, and an aromatic ring group substituted with at least one cycloalkyl group.

(15) The method for manufacturing an organic thin-film transistor according to (14), in which the resin (C) is unevenly distributed on the opposite side to the substrate or the gate insulating layer by the coating of the substrate or the gate insulation layer with the coating solution.

In the present specification, when a plurality of substituents or linking groups (hereinafter, referred to as substituents or the like) shown by specific symbols are present or a plurality of substituents are defined simultaneously, this means that the respective substituents may be the same as or different from each other. The same applies to the definition of the number of substituents or the like. Moreover, in a case where there is a repetition of a plurality of partial structures which are displayed in the same manner in the formula, the respective partial structures or repeating units may be the same as or different from each other. In addition, even in a case where not specifically stated, when a plurality of substituents or the like are close (particularly, neighboring) to each other, they may be condensed or linked to each other and form a ring.

In regard to compounds (including resins) described in the present specification, the description includes salts thereof and ions thereof in addition to the compounds. Further, the description includes partially changed structures within the range in which desired effects are exhibited.

In the present specification, substituents (the same applies to linking groups) in which substitution or non-substitution is not specified may include optional substituents on a group within the range in which desired effects are exhibited. The same applies to compounds in which substitution or non-substitution is not specified.

In the present specification, the numerical ranges shown using "to" indicate ranges including the numerical values described before and after "to" as the lower limits and the upper limits.

The organic thin-film transistor of the present invention has high carrier mobility and excellent durability. Further, the organic thin-film transistor thereof shows a low threshold voltage.

According to the method for manufacturing an organic thin-film transistor of the present invention, it is possible to manufacture an organic thin-film transistor having the above-described excellent characteristics.

The above-described and other features and advantages of the present invention will become apparent from the description below with reference to the accompanying drawings.

DESCRIPTION OF THE PREFERRED EMBODIMENTS

[Organic Thin-Film Transistor]

Figure 1A:
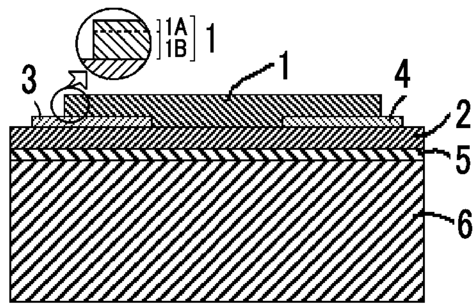
FIGS. 1A to 1D are views schematically illustrating a form of an organic thin-film transistor according to the present invention.

Embodiments of an organic thin-film transistor of the present invention (hereinafter, also simply referred to as an "OTFT of the present invention") will be described in detail below.

The OTFT of the present invention includes, on a substrate, a gate electrode; an organic semiconductor layer; a gate insulating layer provided between the gate electrode and the organic semiconductor layer; and a source electrode and a drain electrode provided in contact with the organic semiconductor layer and connected to each other through the organic semiconductor layer. When a voltage is applied to the gate electrode, a channel of a current is formed on the interface between an organic semiconductor layer, positioned between the source electrode and the drain electrode, and a layer adjacent to the semiconductor layer. That is, the current flowing between the source electrode and the drain electrode is controlled according to the input voltage applied to the gate electrode.

Preferred embodiments of the OTFT according to the present invention will be described with reference to the accompanying drawings. The respective drawings illustrating the OTFT are schematic views for facilitating understanding the present invention, and the size or the relative magnitude relation of each member is occasionally changed for the sake of convenience. Each member is not illustrated in actual scale. Moreover, the present invention is not limited to the outer shapes or shapes illustrated in the figures except definitions described in the present invention. For example, in FIGS. 1A and 1B, a gate electrode 5 does not necessarily cover the entire substrate 6 and the form in which the gate electrode 5 is provided in the central portion of the substrate 6 is also preferable as the OTFT of the present invention.

FIGS. 1A to 1D are respectively longitudinal sectional views schematically illustrating the OTFT according to preferred exemplary embodiments of the present invention. In FIGS. 1A to 1D, the reference numeral 1 indicates an organic semiconductor layer, the reference numeral 2 indicates a gate insulating layer, the reference numeral 3 indicates a source electrode, the reference numeral 4 indicates a drain electrode, the reference numeral 5 indicates a gate electrode, and the reference numeral 6 indicates a substrate.

Figure 1B:
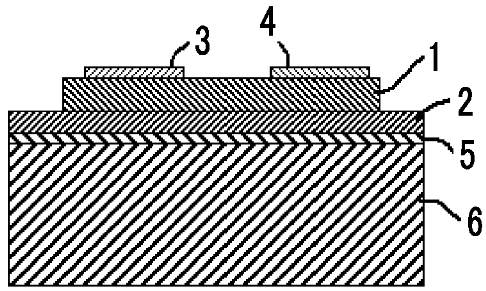
Figure 1C:
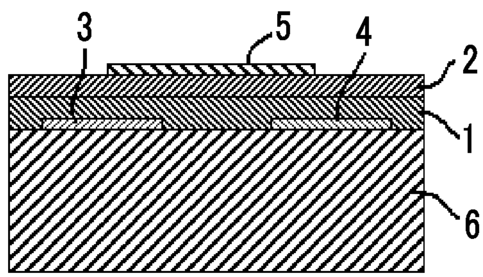
Figure 1D:
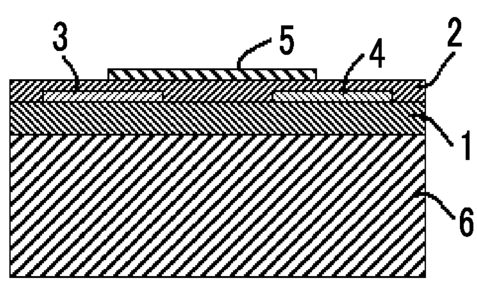

Further, FIG. 1A illustrates a bottom-gate bottom-contact type (structure) OTFT, FIG. 1B illustrates a bottom-gate top-contact type OTFT, FIG. 1C illustrates a top-gate bottom-contact type OTFT, and FIG. 1D illustrates a top-gate top-contact type OTFT.

The OTFT of the present invention has all of the above-described four types. Although not illustrated, an overcoat layer is formed on the uppermost portion (the uppermost portion on a side opposite to the substrate 6) of the surface of each OTFT in some cases. The organic semiconductor layer 1 schematically showing a state in which an organic semiconductor and a resin (C) are unevenly distributed is illustrated in an enlarged manner in the inside of the circle in FIG. 1A.

A bottom-gate type OTFT is an OTFT in which the gate electrode 5, the gate insulating layer 2, and the organic semiconductor layer 1 are arranged on the substrate 6 in this order. Meanwhile, A top-gate type OTFT is an OTFT in which the organic semiconductor layer 1, the gate insulating layer 2, and the gate electrode 5 are arranged on the substrate 6 in this order. Moreover, a bottom-contact type OTFT is an OTFT in which the source electrode 3 and the drain electrode 4 are arranged on the substrate 6 side (that is, in the lower portion of FIG. 1) with respect to the organic semiconductor layer 1. Meanwhile, a top-contact type OTFT is an OTFT in which the source electrode 3 and the drain electrode 4 are arranged on the side opposite to the substrate 6 with respect to the organic semiconductor layer 1.

In the OTFT of the present invention, the organic semiconductor layer 1 contains an organic semiconductor and a resin (C), and it is preferable that the organic semiconductor 1 and the resin (C) are unevenly distributed in the thickness direction of the organic semiconductor layer 1. In this case, the organic semiconductor layer 1 includes a region 1B having a large content of the organic semiconductor and a region 1A having a large content of the resin (C). These regions 1A and 1B may be respectively present in the vicinity of at least the surface of the organic semiconductor layer and may not be present throughout the organic semiconductor layer. In addition, the boundary between the both regions 1A and 1B may not be clearly distinguished as indicated by a broken line of FIG. 1A.

Preferably, the organic semiconductor and the resin (C) are phase-separated. In this case, the organic semiconductor layer 1 includes a layer 1B formed of the organic semiconductor and a layer 1A formed of the resin (C).

Here, the "uneven distribution" means a state of having a phase in which either component between the organic semiconductor and the resin (C) is included at a mass ratio greater than the entire mass ratio thereof and the other component is also present, and the "phase separation" means a state of having a phase in which any one of the organic semiconductor and the resin (C) is present alone.

As described above, the uneven distribution and the phase separation are different in the degree of the mass ratio of components. When the degree of uneven distribution becomes higher, the state enters phase separation. The boundary between the uneven distribution and the phase separation is not clearly determined. However, in a case where a phase in which any one of the organic semiconductor and the resin (C) is present at a mass ratio of 99% or greater is formed, this state is determined as the "phase separation" in the present application. Accordingly, in the present invention, when referred to uneven distribution, this state includes phase separation unless otherwise noted.

In the organic semiconductor layer, whether the resin (C) being unevenly distributed or phase-separated can be confirmed by performing elemental mapping measurement on the organic semiconductor layer according to time-of-flight secondary ion mass spectrometry (TOF-SIMS) using ion beams for etching together.

Moreover, by measuring the surface energy described below and finding out which value of the organic semiconductor and the resin (C) the surface energy thereof is close to, it can be analogized that which component is present on the surface of the organic semiconductor at a large amount.

Since the resin (C) has the above-described groups with high hydrophobicity, the surface energy thereof becomes smaller. As a result, the compatibility of the resin (C) with the organic semiconductor is decreased and then the resin (C) and the organic semiconductor are unevenly distributed or phase-separated.

At this time, the resin (C) whose entire surface energy is small is unevenly distributed or phase-separated typically on the surface (air) side in a coating layer in the thickness direction with respect to the organic semiconductor.

Moreover, the surface energy can be acquired according to a known method by measuring the contact angle of a film formed of the resin (C) using water and an organic solvent (glycerin or diiodomethane is mainly used) and substituting the values in the following Owens' Equation (a case where glycerin (gly) is used as an organic solvent is described below).

Owens' Equation $$1+\cos\theta_{H2O}=2\sqrt{[\gamma_S^d(\sqrt{\gamma_{H2O}^d}/\gamma_{H2O,V})]}+2\sqrt{[\gamma_S^h(\sqrt{\gamma_{H2O}^h}/\gamma_{H2O,V})]}$$

$$1+\cos\theta_{gly}=2\sqrt{[\gamma_S^d(\sqrt{\gamma_{gly}^d}/\gamma_{gly,V})]}+2\sqrt{[\gamma_S^h(\sqrt{\gamma_{gly}^h}/\gamma_{gly,V})]}$$

Here, a dispersion force component $\gamma_S^d$ and a polar component $\gamma_S^h$ of the surface energy are respectively acquired by substituting measurement values in the literature, that are, 21.8 for $\gamma_{H2O}^d$, 37.0 for $\gamma_{gly}^d$, 51.0 for $\gamma_{H2O}^h$, 26.4 for $\gamma_{gly}^h$, 72.8 for $\gamma_{H2O,V}$, and 63.4 for $\gamma_{gly,V}$ and then substituting the measurement value of the contact angle of water for $\theta_{H2O}$ and the measurement value of the contact angle of glycerin for $\theta_{gly}$. Thereafter, the sum ($\gamma_S^{Vh}$) of $\gamma^{Sd}+\gamma_S^h$ can be acquired as the surface energy ($mNm^{-1}$).

In order for the resin (C) and the organic semiconductor to be unevenly distributed or phase-separated, the surface energy of the resin (C) is preferably 30 $mNm^{-1}$ or less, more preferably in a range of 1 $mNm^{-1}$ to 30 $mNm^{-1}$, and still more preferably in a range of 5 $mNm^{-1}$ to 27 $mNm^{-1}$, and particularly preferably in a range of 10 $mNm^{-1}$ to 25 $mNm^{-1}$. When the surface energy of the resin (C) becomes smaller, the uneven distribution or the phase separation of the resin (C) and the organic semiconductor becomes faster. In addition, from the viewpoints of excellent coating properties of the coating solution that forms the organic semiconductor layer and excellent film properties of the formed organic semiconductor layer, the lower limit of the surface energy of the resin (C) is preferably the above-described value.

The resin (C) may include the above-described groups, but it is preferable that the resin (C) includes a repeating unit represented by any one of the following Formulae (C-Ia) to (C-Id) from the viewpoint that the resin (C) is easily unevenly distributed or phase-separated with respect to the organic semiconductor.

Further, as the above-described groups included in the resin (C), at least one of a group having fluorine atoms or a group having silicon atoms is preferable and a group having fluorine atoms is more preferable. That is, in a case where the resin (C) includes a repeating unit represented by any one of the following Formulae (C-Ia) to (C-Id), it is preferable that at least one of $W_3, \ldots,$ or $W_6$ is at least one of a group having fluorine atoms or a group having silicon atoms and it is more preferable that that at least one of $W_3, \ldots,$ or $W_6$ is a group having fluorine atoms.

The uneven distribution or the phase separation of the organic semiconductor and the resin (C) in the organic semiconductor layer is not particularly limited as long as the uneven distribution or the phase separation is made in the thickness direction of the organic semiconductor layer. Any one of the organic semiconductor and the resin (C) may be unevenly distributed or phase-separated in the thickness direction (the depth direction, the direction of the substrate 6) of the organic semiconductor layer.

It is preferable that the organic semiconductor is unevenly distributed on the gate insulating layer side and the resin (C) is unevenly distributed on the opposite side to the gate insulating layer in the organic semiconductor layer as illustrated in FIG. 1A. In this manner, charge transfer channels can be sufficiently secured on the interface between the gate insulating layer and the organic semiconductor layer, and higher carrier mobility is exhibited.

In this case, it is more preferable that the organic semiconductor is unevenly distributed or phase-separated in the thickness direction of the organic semiconductor layer and the resin (C) is unevenly distributed or phase-separated on the surface side.

At this time, the OTFT of the present invention may be a bottom-gate type OTFT provided with an organic semiconductor layer on a gate insulating layer.

Further, it is preferable that the OTFT of the present invention is a bottom-contact type OTFT in which a source electrode and a drain electrode are provided in contact with the bottom surface of the organic semiconductor layer. In this manner, carriers are easily injected to the organic semiconductor layer from the source electrode and the injected carriers become easy to flow into the drain electrode so that the threshold voltage is decreased.

Particularly, when the OTFT of the present invention is a bottom-gate bottom-contact type OTFT (FIG. 1A), an effect of improving the carrier mobility and the maintenance factor (durability) of the carrier mobility can be further increased by securing charge mobility channels in the organic semiconductor layer and protecting the surface of the region 1B in which the organic semiconductor layer, particularly, the organic semiconductor is unevenly distributed with the region 1A in which the resin (C) is unevenly distributed. Further, an effect of decreasing the threshold voltage is also excellent.

[Substrate]

A substrate which is capable of supporting the OTFT and a display panel or the like prepared on the OTFT can be used. The substrate is not particularly limited as long as the substrate has a sheet shape and the surface thereof is insulating and flat.

An inorganic material may be used as the material of the substrate. Examples of the substrate formed of an inorganic material include various glass substrates such as soda-lime glass and quartz glass, various glass substrates having an insulating film formed on the surface thereof, a quartz substrate having an insulating film formed on the surface thereof, a silicon substrate having an insulating film formed on the surface thereof, a sapphire substrate, metal substrates made of various alloys or various metals such as stainless steel, aluminum, and nickel, metal foil, and paper.

In a case where the substrate is formed of a semiconductive material or a conductive material such as a stainless sheet, aluminum foil, copper foil, or a silicon wafer, the surface thereof is typically coated with or overlapped with an insulating polymer material or a metal oxide for use.

Moreover, an organic material may also be used as the material of the substrate. Examples thereof include a plastic substrate (also referred to as a plastic film or a plastic sheet) which has flexibility and is formed of an organic polymer such as polymethylmethacrylate (PMMA), polyvinyl alcohol (PVA), polyvinyl phenyl (PVP), polyether sulfone (PES), polyimide, polyamide, polyacetal, polycarbonate (PC), polyethylene terephthalate (PET), polyethylene naphthalene (PEN), polyethyl ether ketone, polyolefin, or polycycloolefin. Further, a material formed from mica can be also exemplified.

When such a plastic substrate or the like having flexibility is used, incorporation or integration of the OTFT into/with a display device or an electronic device having a curved shape becomes possible.

Since an organic material forming the substrate is unlikely to be softened at the time of lamination on another layer or being heated, it is preferable that the glass transition point thereof is high, for example, 40° C. or higher. Moreover, in terms that dimensional change resulting from a heat treatment at the time of production is unlikely to occur and stability of transistor performance is excellent, it is preferable that the linear expansion coefficiency is small. For example, a material having a linear expansion coefficiency of $25\times10^{-5}$ cm/cm·° C. or less is preferable and a material having a linear expansion coefficiency of $10\times10^{-5}$ cm/cm·° C. or less is more preferable.

Further, as the organic material constituting the substrate, a material having resistance to a solvent used when the OTFT is produced is preferable and a material having excellent adhesiveness to a gate insulating layer and an electrode is preferable.

Moreover, it is preferable to use a plastic substrate formed of an organic polymer having excellent gas barrier properties.

It is also preferable that a dense silicon oxide film or the like is provided on at least one surface of the substrate or an inorganic material is deposited or laminated on at least one surface of the substrate.

Other examples of the substrate include conductive substrates (for example, a substrate formed of a metal such gold or aluminum, a substrate formed of highly aligned graphite, or stainless steel substrate).

A buffer layer used to improve the adhesiveness or flatness, a functional film such as a barrier film used to improve gas barrier properties, or a surface treatment layer such as an easily adhesive layer may be formed on the surface of the substrate or the substrate may be subjected to a surface treatment such as a corona treatment, a plasma treatment, or UV/ozone treatment.

The thickness of the substrate is preferably 10 mm or less, more preferably 2 mm or less, and particularly preferably 1 mm or less. Further, the thickness thereof is preferably 0.01 mm or greater and more preferably 0.05 mm or greater. Particularly, in a case of a plastic substrate, the thickness thereof is preferably in a range of 0.05 mm to 0.1 mm. Moreover, in a case of a substrate formed of an inorganic material, the thickness thereof is preferably in a range of 0.1 mm to 10 mm.

[Gate Electrode]

A known electrode of the related art being used as a gate electrode of an OTFT can be used as the gate electrode. A conductive material (also referred to as an electrode material) constituting the gate electrode is not particularly limited. Examples thereof include metals such as platinum, gold, silver, aluminum, chromium, nickel, copper, molybdenum, titanium, magnesium, calcium, barium, sodium, palladium, iron, and manganese; conductive metal oxides such as $InO_2$, $SnO_2$, indium-tin oxide (ITO), fluorine-doped tin oxide (FTO), aluminum-doped zinc oxide (AZO), and gallium-doped zinc oxide (GZO); conductive polymers such as polyaniline, polypyrrole, polythiophene, polyacetylene, and poly(3,4-ethylenedioxythiophene)/polystyrene sulfonic acid (PEDOT/PSS); and conductive composite materials obtained by dispersing the above-described conductive polymer to which a dopant, for example, an acid such as hydrochloric acid, sulfuric acid, or sulfonic acid, Lewis acid such as $PF_6$, $AsF_5$, or $FeCl_3$, a halogen atom such as iodine, or a metal atom such as sodium or potassium is added, carbon black, graphite powder, or metal fine particles therein. These materials may be used alone or in combination of optional two or more kinds thereof at an optional ratio.

In addition, the gate electrode may be configured of a single layer or two or more layers being laminated, formed of the above-described conductive materials.

A method of forming the gate electrode is not limited. Examples thereof include a method of patterning a film, formed using a physical vapor deposition (PVD) method such as a vacuum vapor deposition method, a chemical vapor deposition method (CVD method), a sputtering method, a printing method (coating method), a transfer method, a sol-gel method, or a plating method, in a desired shape as needed.

According to the coating method, a film is formed or an electrode is directly formed by preparing, applying, drying, baking, photocuring, or aging a solution, paste, or a dispersion liquid of the above-described material.

Moreover, from the viewpoints of capability of desired patterning, simplifying the processes, cost reduction, and speeding up, it is preferable to use ink jet printing, screen printing, (inversion) offset printing, relief printing, intaglio printing, planographic printing, thermal transfer printing, or a microcontact printing method.

In a case where a spin coating method, a die coating method, a micro gravure coating method, or a dip coating method is employed, patterning can be carried out by combining any of these method and the following photolithographic method.

As the photolithographic method, a method of combining patterning of a photoresist, etching, for example, wet etching using an etching solution or dry etching using a reactive plasma, and a lift-off method may be exemplified.

As another patterning method, a method of irradiating the above-described materials with energy rays such as laser or electron beams and polishing the materials so that the conductivity of the material is changed may be exemplified.

In addition, a method of transferring a composition for a gate electrode which is printed on a support other than a substrate onto an underlayer such as the substrate may be exemplified.

The thickness of the gate electrode is optional, but is preferably 1 nm or greater and particularly preferably 10 nm or greater. Further, the thickness thereof is preferably 500 nm or less and particularly preferably 200 nm or less.

[Gate Insulating Layer]

The gate insulating layer is not particularly limited as long as the layer has insulating properties and the gate insulating layer may be formed of a single layer or multiple layers.

It is preferable that the gate insulating layer is formed of an insulating material, and preferred examples of the insulating material include an organic polymer and an inorganic oxide.

The organic polymer and the inorganic oxide are not particularly limited as long as the organic polymer and the inorganic oxide have insulating properties, and it is preferable that the organic polymer and the inorganic oxide are formed of a thin film having a thickness of 1 μm or less.

The organic polymer and the inorganic oxide may be used alone or in combination of two or more kinds thereof and the organic polymer may be combined with the inorganic oxide.

The organic polymer is not particularly limited, and examples thereof include polyvinyl phenol, polystyrene (PS), poly(meth)acrylate represented by polymethyl methacrylate, polyvinyl alcohol, polyvinyl chloride (PVC), polyvinylidene fluoride (PVDF), polytetrafluoroethylene (PTFE), a cyclic fluoroalkyl polymer represented by CYTOP (registered trademark), polycycloolefin, polyester, polyether sulfone, polyether ketone, polyimide, an epoxy resin, polyorganosiloxane represented by polydimethylsiloxane (PDMS), polysilsesquioxane, and butadiene rubber. Further, other examples thereof include thermosetting resins such as a phenolic resin, a novolac resin, a cinnamate resin, an acrylic resin, and a polyparaxylylene resin.

The organic polymer can be combined with a compound including a reactive substituent such as an alkoxysilyl group, a vinyl group, an acryloyloxy group, an epoxy group, or a methylol group.

In a case where the gate insulating layer is formed using an organic polymer, it is also preferable that the organic polymer is cross-linked and cured for the purpose of increasing the solvent resistance or insulation resistance of the gate insulating layer. It is preferable that the crosslinking is performed by generating an acid or a radical using light or heat or both of these.

In a case where the crosslinking is performed by generating a radical, as a radical generator that generates a radical using light or heat, for example, a thermal polymerization initiator (H1) and a photopolymerization initiator (H2) described in the paragraphs [0182] to of JP2013-214649A, a photo-radical generator described in the paragraphs [0046] to of JP2011-186069A, and a photo-radical polymerization initiator described in the paragraphs [0042] to [0056] of JP2010-285518A can be preferably used, and it is preferable that the contents of which are incorporated in the present specification.

Moreover, it is preferable that "a compound (G) which has a number average molecular weight (Mn) of 140 to 5,000, includes a crosslinkable functional group, and does not include a fluorine atom" described in the paragraphs [0167] to [0177] of JP2013-214649A is preferably used and the contents of which are incorporated in the present specification.

In a case where the crosslinking is performed by generating an acid, as a photo-acid generator that generates an acid using light, for example, a photocationic polymerization initiator described in the paragraphs [0033] and [0034] of JP2010-285518A, and an acid generator, particularly sulfonium salts and iodonium salts described in the paragraphs [0120] to [0136] of JP2012-163946A can be preferably used, and it is preferable that the contents of which are incorporated in the present specification.

As a thermal acid generator (catalyst) that generates an acid using heat, for example, a thermal cationic polymerization initiator and particularly onium salts described in the paragraphs [0035] to [0038] of JP2010-285518A, and a catalyst and particularly sulfonic acids and sulfonic acid amine salts described in the paragraphs [0034] and [0035] of JP2005-354012A can be preferably used, and it is preferable that the contents of which are incorporated in the present specification.

Moreover, a crosslinking agent and particularly a difunctional or higher functional epoxy compound and an oxetane compound described in the paragraphs [0032] and [0033] of JP2005-354012A, a crosslinking agent and particularly a compound which includes two or more crosslinking group and in which at least one of the crosslinking groups is a methylol group or an NH group described in the paragraphs [0046] to [0062] of JP2006-303465A, and a hydroxymethyl group or a compound having two or more alkoxymethyl groups in a molecule described in the paragraphs [0137] to [0145] of JP2012-163946A are preferably used, and it is preferable that the contents of which are incorporated in the present specification.

As a method of forming the gate insulating layer with an organic polymer, a method of applying and curing an organic polymer may be exemplified. The coating method is not particularly limited, and the above-described various printing methods are exemplified. Among those, a wet coating method such as a micro gravure coating method, a dip coating method, screen coating printing, a die coating method, or a spin coating method is preferable.

The inorganic oxide is not particularly limited, and examples thereof include oxides such as silicon oxide, silicon nitride ($SiN_Y$), hafnium oxide, titanium oxide, tantalum oxide, aluminum oxide, niobium oxide, zirconium oxide, copper oxide, and nickel oxide; perovskites such as $SrTiO_3$, $CaTiO_3$, $BaTiO_3$, $MgTiO_3$, and $SrNb_2O_6$; and a composite oxide or a mixture of these. Here, as the silicon oxide, in addition to silicon oxide ($SiO_x$), boron phosphorus Silicon glass (BPSG), phosphorus silicon glass (PSG), boron silicon glass (BSG), As-doped silica glass (AsSG), lead silicon glass (PbSG), silicon oxynitride (SiON), spin on glass (SOG), and $SiO_2$-based materials having a low dielectric constant (for example, polyaryl ether, a cycloperfluorocarbon polymer, benzocyclobutene, a cyclic fluorine resin, polytetrafluoroethylene, fluorinated aryl ether, fluorinated polyimide, amorphous carbon, and organic SOG) are included.

As a method forming the gate insulating layer with an inorganic oxide, a vacuum film formation method such as a vacuum vapor deposition method, a sputtering method, ion plating, or a CVD method can be used, and assist may be performed using a plasma, an ion gun, or a radical gun using optional gas during the film formation.

Moreover, the gate insulating layer may be formed by reacting a precursor corresponding to each metal oxide, specifically, a metal halide or a metal alkoxide such as a chloride or a bromide, or a metal hydroxide with an acid such as hydrochloric acid, sulfuric acid, or nitric acid, or a base such as sodium hydroxide or potassium hydroxide in alcohol or water for hydrolysis. In a case of using such a solution-based process, the above-described wet coating method can be used.

The gate insulating layer can be also provided using a method obtained by combining any of a lift-off method, a sol-gel method, an electrodeposition method, and a shadow mask method with a patterning method, if necessary, other than the above-described methods.

The gate insulating layer may be subjected to a surface treatment such as a corona treatment, a plasma treatment, or a UV/ozone treatment. In this case, it is preferable not to make the surface rough due to the surface treatment. An arithmetic mean roughness Ra or a root mean square roughness $R_{MS}$ of the surface of the gate insulating layer is preferably 0.5 nm or less.

[Self-Assembled Monomolecular Film Layer (SAM)]

A self-assembled monomolecular film layer can be formed on the gate insulating layer.

A compound forming the self-assembled monomolecular film layer is not particularly limited as long as the compound is self-assembled. As the self-assembling compound, at least one compound represented by the following Formula 1S can be used.

$$R^{1S}—X^{S} \qquad \text{Formula 1S:}$$

In Formula 1S, $R^{1S}$ represents any one of an alkyl group, an alkenyl group, an alkynyl group, an aryl group, an alkoxy group, an aryloxy group, and a heterocyclic group (thienyl, pyrrolyl, pyridyl, or fluorenyl).

$X^S$ represents an adsorptive or reactive substituent. Specifically, $X^S$ represents any one of —$SiX^4X^5X^6$ group ($X^4$ represents a halide group or an alkoxy group, and $X^5$ and $X^6$ each independently represent a halide group, an alkoxy group, an alkyl group, or an aryl group. It is preferable that $X^4$, $X^5$, and $X^6$ may be the same as one another and more preferable that $X^4$, $X^5$, and $X^6$ represent a chloro group, a methoxy group, and an ethoxy group), a phosphonic acid group (—$PO_3H_2$), a phosphinic acid group (—$PRO_2H$, R represents an alkyl group), a phosphate group, a phosphorous acid group, an amino group, a halide group, a carboxy group, a sulfonic acid group, a boric acid group (—$B(OH)_2$), a hydroxy group, a thiol group, an ethynyl group, a vinyl group, a nitro group, and a cyano group.

It is preferable that $R^{1S}$ is not branched, and a structure of a linear normal alkyl (n-alkyl) group, a ter-phenyl group in which three phenyl groups are arranged in series, or an n-alkyl group being arranged on both sides of the para position of a phenyl group is preferable. In addition, an alkyl chain may have an ether bond or may have a double bond or a triple bond of carbon-carbon.

The self-assembled monomolecular film layer is formed on the gate insulating layer by forming a bond through an interaction of the adsorptive or reactive substituent $X^S$ with a reactive site (for example, a —OH group) on the surface of the corresponding gate insulating layer, adsorption, and a reaction therebetween. Since the surface of the self-assembled monomolecular film layer becomes smoother and the surface energy thereof becomes lower when the surface of the self-assembled monomolecular film layer is filled with molecules more densely, it is preferable that the compound represented by Formula 1S has a linear main skeleton and an aligned molecular length.

Preferred specific examples of the compound represented by Formula 1S include an alkyl trichlorosilane compound such as methyl trichlorosilane, ethyl trichlorosilane, butyl trichlorosilane, octyl trichlorosilane, decyl trichlorosilane, octadecyl trichlorosilane, or phenethyl trichlorosilane, an alkyl trialkoxysilane compound such as methyl trimethoxysilane, ethyl trimethoxysilane, butyl trimethoxysilane, octyl trimethoxysilane, decyl trimethoxysilane, or octadecyl trimethoxysilane, alkyl phosphonic acid, aryl phosphonic acid, alkyl carboxylic acid, an alkylboric acid group, an arylboric acid group, an alkyl thiol group, and an aryl thiol group.

The self-assembled monomolecular film layer can be formed using a method of depositing the compound on the gate insulating layer under vacuum, a method of immersing the gate insulating layer in a solution of the compound, or a Langmuir-Blodgett method. In addition, for example, the self-assembled monomolecular film layer can be formed by treating the gate insulating layer with a solution obtained by dissolving an alkyl chlorosilane compound or an alkyl alkoxysilane compound in an organic solvent at a content of 1% by mass to 10% by mass. In the present invention, the method of forming a self-assembled monomolecular film layer is not particularly limited thereto.

For example, preferred examples of a method of obtaining a denser self-assembled monomolecular film layer include methods described in Langmuir 19, 1159 (2003) and J. Phys. Chem. B 110, 21101 (2006).

Specifically, the self-assembled monomolecular film layer can be formed by immersing the gate insulating layer in a highly volatile dehydrating solvent in which the above-described compound is dispersed so that a film is formed, extracting the gate insulating layer, performing a process of reacting the above-described compound with the gate insulating layer such as annealing as needed, washing the resulting layer with a dehydrating solvent, and drying the washed layer.

The dehydrating solvent is not particularly limited, and chloroform, trichloroethylene, anisole, diethyl ether, hexane, or toluene can be used alone or in combination.

In addition, it is preferable that the film is dried in a dry atmosphere or by spraying dry gas. It is preferable that inert gas such as nitrogen is used as the dry gas. Since a dense self-assembled monomolecular film layer without aggregation or defects can be formed using such a method of producing a self-assembled monomolecular film layer, it is possible to suppress the surface roughness of the self-assembled monomolecular film layer to 0.3 nm or less.

[Organic Semiconductor Layer]

An organic semiconductor layer is a layer which exhibits properties of a semiconductor and on which carriers can be accumulated.

The organic semiconductor layer may contain an organic semiconductor and the above-described resin (C), and it is preferable that the organic semiconductor and the resin (C) are unevenly distributed in the thickness direction of the organic semiconductor layer as described above.

The organic semiconductor is not particularly limited, and examples thereof include an organic polymer, a derivative thereof, and a low molecular weight compound.

In the present invention, the low molecular weight compound indicates a compound other than an organic polymer and a derivative thereof, that is, a compound that does not have a repeating unit. As long as the low molecular weight compound is such a compound, the molecular weight thereof is not particularly limited. The molecular weight of the low molecular weight compound is preferably in a range of 300 to 2000 and more preferably in a range of 400 to 1000.

As the low molecular weight compound, a condensed polycyclic aromatic compound may be exemplified. Examples thereof include acene such as naphthacene, pentacene(2,3,6,7-dibenzoanthracene), hexacene, heptacene, dibenzopentacene, or tetrabenzopentacene, anthradithiophene, pyrene, benzopyrene, dibenzopyrene, chrysene, perylene, coronene, terrylene, ovalene, quaterrylene, circumanthracene, a derivative in which some of these carbon atoms are substituted with atoms such as N, S, and O, a derivative (a dioxa anthanthrene-based compound including perixanthenoxanthene and a derivative thereof, triphenodioxazine, triphenodithiazine, or hexacene-6,15-quinone) in which at least one hydrogen atom bonded to the carbon atom is substituted with a functional group such as a carbonyl group, and a derivative in which the hydrogen atom is substituted with another functional group.

Further, other examples thereof include metal phthalocyanine represented by copper phthalocyanine, tetrathiapentalene and a derivative thereof, naphthalene tetracarboxylic acid diimide such as naphthalene-1,4,5,8-tetracarboxylic acid diimide, N,N'-bis(4-trifluoromethylbenzyl)naphthalene-1,4,5,8-tetracarboxylic acid diimide, N,N'-bis(1H,1H-perfluorooctyl), N,N'-bis(1H,1H-perfluorobutyl), a N,N'-dioctylnaphthalene-1,4,5,8-tetracarboxylic acid diimide derivative, or naphthalene-2,3,6,7-tetracarboxylic acid diimide, fused ring tetracarboxylic acid diimide, for example, anthracene tetracarboxylic acid diimide such as anthracene-2,3,6,7-tetracarboxylic acid diimide, fullerene such as C60, C70, C76, C78, or C84 and a derivative of these, a carbon nanotube such as single-wall nanotubes (SWNT), and coloring agents such as a merocyanine coloring agent and a hemicyanine coloring agent and a derivative of these.

Moreover, polyanthracene, triphenylene, and quinacridone are also exemplified.

In addition, examples of the low molecular weight compound include 4,4'-biphenyl dithiol (BPDT), 4,4'-diisocyanobiphenyl, 4,4'-diisocyano-p-terphenyl, 2,5-bis(5'-thioacetyl-2'-thiophenyl)thiophene, 2,5-bis(5'-thioacetoxyl-2'-thiophenyl)thiophene, 4,4'-diisocyanophenyl, benzidine (biphenyl-4,4'-diamine), tetracyanoquinodimethane (TCNQ), tetrathiafulvalene (TTF) and a derivative thereof, a tetrathiafulvalene (TTF)-TCNQ complex, a bisethylene tetrathiafulvalene (BEDTTTF)-perchloric acid complex, a BEDTTTF-iodine complex, a charge transfer complex represented by a TCNQ-iodine complex, biphenyl-4,4'-dicarboxylic acid, 1,4-di(4-thiophenylacetylenyl)-2-ethylbenzene, 1,4-di(4-isocyanophenylacetylenyl)-2-ethylbenzene, 1,4-di(4-thiophenylethynyl)-2-ethylbenzene, 2,2"-dihydroxy-1,1':4',1"-terphenyl, 4,4'-biphenyl diethanal, 4,4'-biphenyl diol, 4,4'-biphenyl diisocyanate, 1,4-diacetylenylbenzene, diethylbiphenyl-4,4'-dicarboxylate, benzo[1,2-c;3,4-c';5,6-c"]tris[1,2]dithiol-1,4,7-trithione, α-sexithiophene, tetrathiatetracene, tetraselenotetracene, tetratellurium tetracene, poly(-alkylthiophene), poly(3-thiophene-β-ethanesulfonic acid), poly(N-alkylpyrrole), poly(3-alkylpyrrole), poly(3,4-dialkylpyrrole), poly(2,2'-thienylpyrrole), and poly (dibenzothiophene sulfide).

From the viewpoint that the organic semiconductor and the resin (C) are easily unevenly distributed, it is preferable that the organic semiconductor is a low molecular weight compound. Among examples thereof, a condensed polycyclic aromatic compound is preferable. When the condensed polycyclic aromatic compound is combined with the resin (C), an effect for improving carrier mobility and durability is high and an excellent effect of decreasing the threshold voltage is also exhibited.

As the condensed polycyclic aromatic compound, acene represented by any of Formulae (A1) to (A4) and a compound represented by any of the following Formulae (C) to (T) are preferable, and a compound represented by any of the following Formulae (C) to (T) is more preferable from the viewpoint that the compound and the resin (C) are easily unevenly distributed.

The acene which is preferable as the condensed polycyclic aromatic compound is represented by the following Formula (A1) or (A2).

Formula (A1)

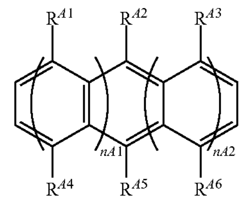

Formula (A2)

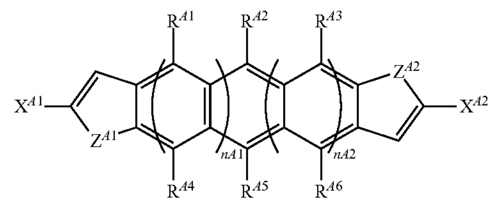

In Formulae, $R^{A1}$ to $R^{A6}$ and $X^{A1}$ and $X^{A2}$ represent a hydrogen atom or a substituent.

$Z^{A1}$ and $Z^{A2}$ represent S, O, Se, or Te.

nA1 and nA2 represent an integer of 0 to 3. In this case, nA1 and nA2 do not represent 0 at the same time.

The substituent respectively represented by $R^{A1}$ to $R^{A6}$ and $X^{A1}$ and $X^{A2}$ is not particularly limited, and examples thereof include an alkyl group (such as methyl, ethyl, propyl, isopropyl, tert-butyl, pentyl, tert-pentyl, hexyl, octyl, tert-octyl, dodecyl, tridecyl, tetradecyl, or pentadecyl), a cycloalkyl group (such as cyclopentyl or cyclohexyl), an alkenyl group (such as vinyl, allyl, 1-propenyl, 2-butenyl, 1,3-butadienyl, 2-pentenyl, or isopropenyl), an alkynyl group (such as ethynyl or propargyl), an aromatic hydrocarbon group (also referred to as an aromatic carbocyclic group or an aryl group, and examples thereof include phenyl, p-chlorophenyl, mesityl, tolyl, xylyl, naphthyl, anthryl, azulenyl, acenaphthenyl, fluorenyl, phenanthryl, indenyl, pyrenyl, and biphenylyl), an aromatic heterocyclic group (also referred to as a heteroaryl group, and examples thereof include a pyridyl group, a pyrimidinyl group, a furyl group, a pyrrolyl group, an imidazolyl group, a benzoimidazolyl group, a pyrazolyl group, a pyrazinyl group, a triazolyl group (such as a 1,2,4-triazol-1-yl group or a 1,2,3-triazol-1-yl group), an oxazolyl group, a benzoxazolyl group, a thiazolyl group, an isoxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (a group in which one carbon atom constituting a carboline ring of a carbolinyl group is replaced with a nitrogen atom), a quinoxalinyl group, a pyridazinyl group, a triazinyl group, a triazinyl group, a quinazolinyl group, and a phthalazinyl group), a heterocyclic group (also referred to as a heteroaryl ring group, and examples thereof include a pyrrolidyl group, an imidazolidyl group, a morpholyl group, and an oxazolidyl group), an alkoxy group (such as methoxy, ethoxy, propyloxy, pentyloxy, hexyloxy, octyloxy, or dodecyloxy), a cycloalkoxy group (such as cyclopentyloxy or cyclohexyloxy), an aryloxy group (such as phenoxy or naphthyloxy), an alkylthio group (such as methylthio, ethylthio, propylthio, pentylthio, hexylthio, octylthio, or dodecylthio), a cycloalkylthio group (such as cyclopentylthio or cyclohexylthio), an arylthio group (such as phenylthio or naphthylthio), an alkoxycarbonyl group (such as methyloxycarbonyl, ethyloxycarbonyl, butyloxycarbonyl, octyloxycarbonyl, or dodecyloxycarbonyl), an aryloxycarbonyl group (such as phenyloxycarbonyl or naphthyloxycarbonyl), a sulfamoyl group (such as aminosulfonyl, methylaminosulfonyl, dimethylaminosulfonyl, butylaminosulfonyl, hexylaminosulfonyl, cyclohexylaminosulfonyl, octylaminosulfonyl, dodecylaminosulfonyl, phenylaminosulfonyl, naphthylaminosulfonyl, or 2-pyridylaminosulfonyl), an acyl group (such as acetyl, ethylcarbonyl, propylcarbonyl, pentylcarbonyl, cyclohexylcarbonyl, octylcarbonyl, 2-ethylhexylcarbonyl, dodecylcarbonyl, phenylcarbonyl, naphthylcarbonyl, or pyridylcarbonyl), an acyloxy group (such as acetyloxy, ethylcarbonyloxy, butylcarbonyloxy, octylcarbonyloxy, or dodecylcarbonyloxy, phenylcarbonyloxy), an amide group (such as methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, phenylcarbonylamino, or naphthylcarbonylamino), a carbamoyl group (such as aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, naphthylaminocarbonyl, or 2-pyridylaminocarbonyl), an ureido group (such as methylureido, ethylureido, pentylureido, cyclohexylureido, octylureido, dodecylureido, phenylureido, naphthylureido, or 2-pyridylaminoureido), a sulfinyl group (such as methylsulfinyl, ethylsulfinyl, butylsulfinyl, cyclohexylsulfinyl, 2-ethylhexylsulfinyl, dodecylsulfinyl, phenylsulfinyl, naphthylsulfinyl, or 2-pyridylsulfinyl), an alkylsulfonyl group (such as methylsulfonyl, ethylsulfonyl, butylsulfonyl, cyclohexylsulfonyl, 2-ethylhexylsulfonyl, or dodecylsulfonyl), an arylsulfonyl group (such as phenylsulfonyl, naphthylsulfonyl, or 2-pyridylsulfonyl), an amino group (such as amino, ethylamino, dimethylamino, butylamino, cyclopentylamino, 2-ethylhexylamino, dodecylamino, anilino, naphthylamino, or 2-pyridylamino), a halogen atom (such as a fluorine atom, a chlorine atom, or a bromine atom), a fluorinated hydrocarbon group (such as fluoromethyl, trifluoromethyl, pentafluoroethyl, or pentafluorophenyl), a cyano group, a nitro group, a hydroxyl group, a mercapto group, a silyl group (such as trimethylsilyl, triisopropylsilyl, triphenylsilyl, or phenyldiethylsilyl), and a group (in this case, $X^{A}$ represents Ge or Sn) represented by the following Formula (SG1).

These substituents may further include a plurality of substituents. As the plurality of substituents which may be included in these substituents, substituents represented by $R^{A1}$ to $R^{A6}$ are exemplified.

Among the above-described examples of acene, one represented by the following Formula (A3) or (A4) is preferable.

Formula (A3)

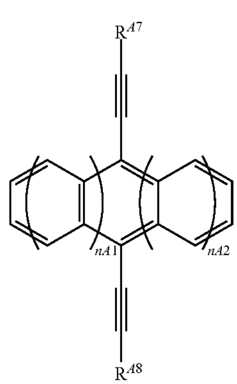

-continued

Formula (A4)

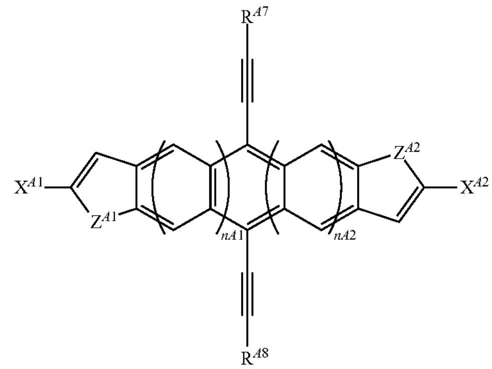

In the formulae, $R^{A7}$, $R^{A8}$, $X^{A1}$, and $X^{A2}$ represent a hydrogen atom or a substituent. $R^{A7}$, $R^{A8}$, $X^{A1}$, and $X^{A2}$ may be the same as or different from each other. Preferred examples of the substituents represented by $R^{A7}$ and $R^{A8}$ include those exemplified as the substituents which may be employed as $R^{A1}$ to $R^{A6}$ in Formulae (A1) and (A2).

$Z^{A1}$ and $Z^{A2}$ represent S, O, Se, or Te.

nA1 and nA2 represent an integer of 0 to 3. In this case, nA1 and nA2 do not represent 0 at the same time.

In Formula (A3) or (A4), it is preferable that $R^{A7}$ and $R^{A8}$ are represented by the following Formula (SG1).

Formula (SG1)

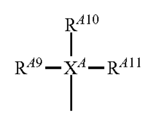

In the formula, $R^{A9}$ to $R^{A11}$ represent a substituent. $X^{A}$ represents Si, Ge, or Sn. Preferred examples of the substituents represented by $R^{A9}$ and $R^{A11}$ include those exemplified as the substituents which may be employed as $R^{A1}$ to $R^{A6}$ in Formulae (A1) and (A2).

Hereinafter, specific examples of acene or an acene derivative represented by Formula (A1) to (A4) will be described, but the present invention is not limited to those.

Compound A1

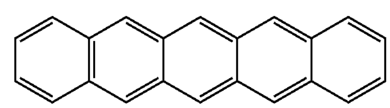

Compound A2

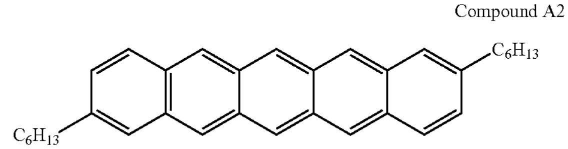

Compound A3

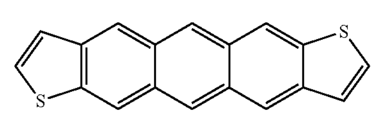

-continued
Compound A4
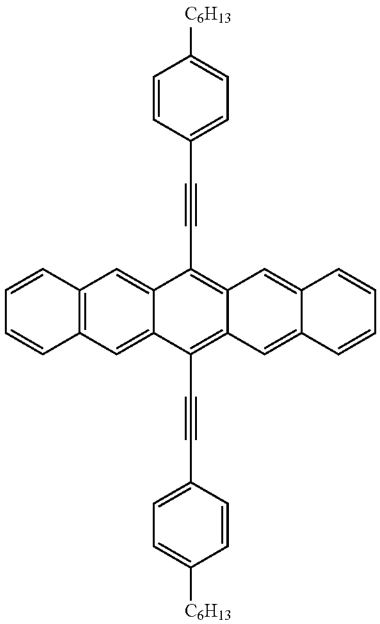
Compound A5
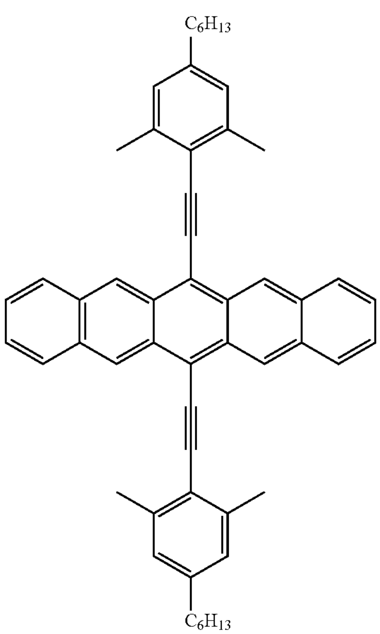
-continued
Compound A6
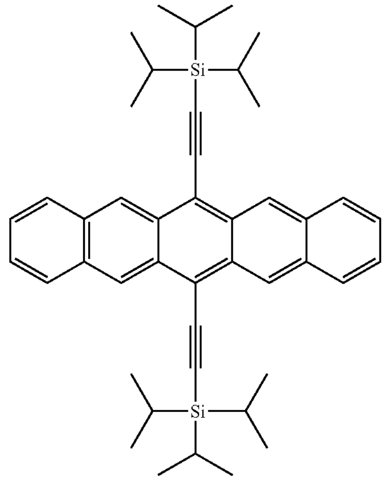
Compound A7
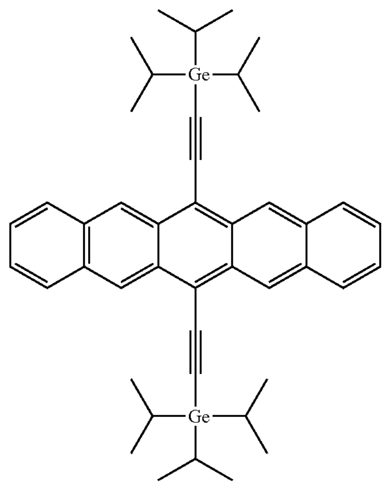
Compound A8
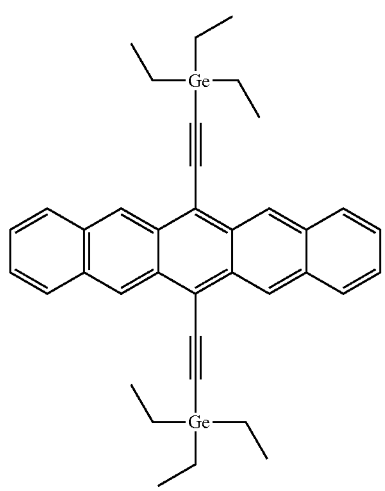

-continued
Compound A9
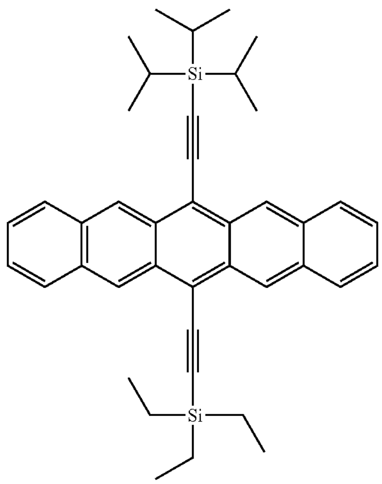
Compound A10
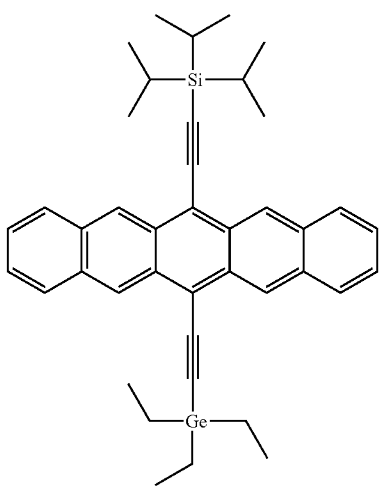
Compound A11
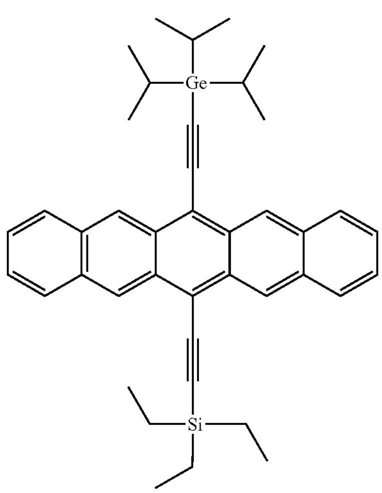
-continued
Compound A12
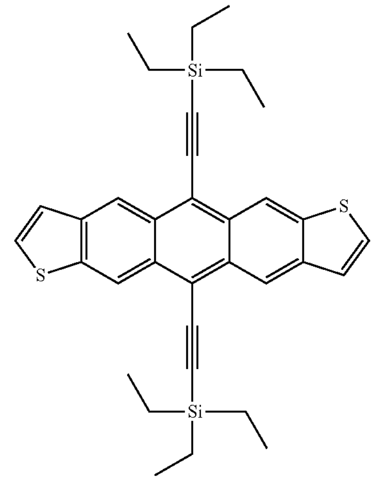
Compound A13
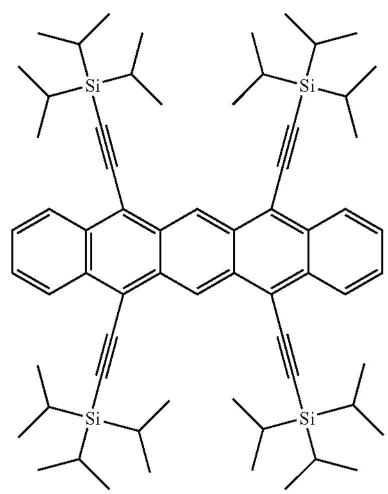
Compound A14
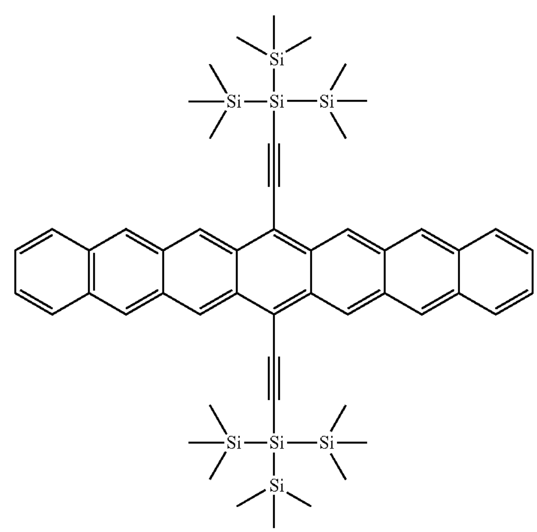

-continued
Compound A15
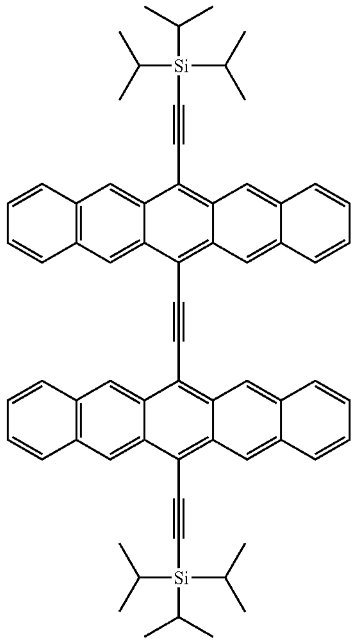
Compound A16
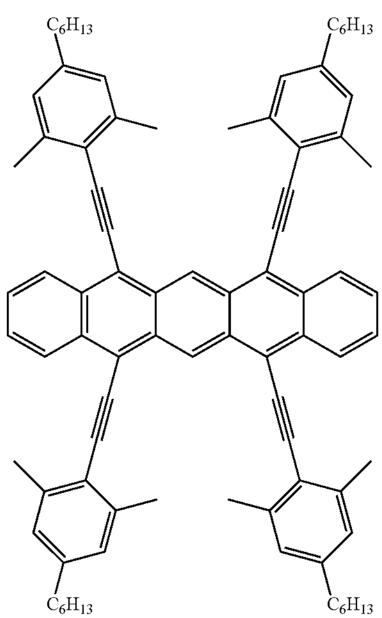
-continued
Compound A17
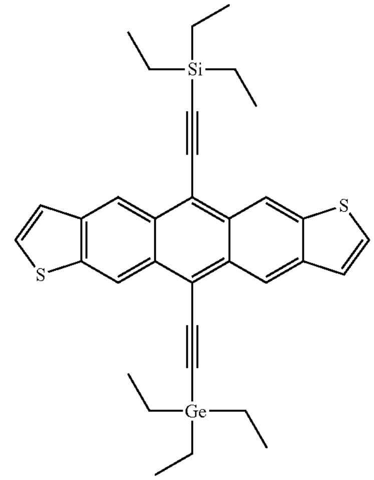
Compound A18
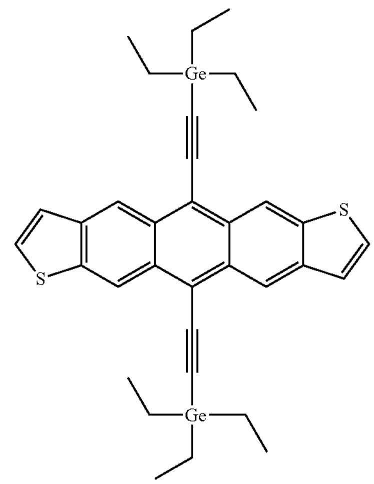
Compound A19
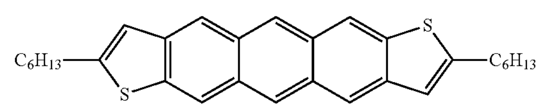
Compound A20
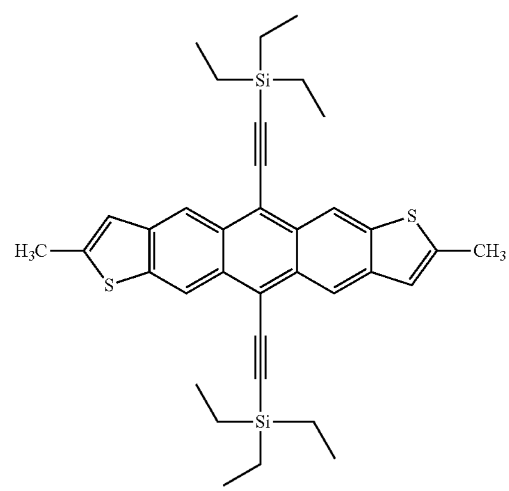

-continued
Compound A21
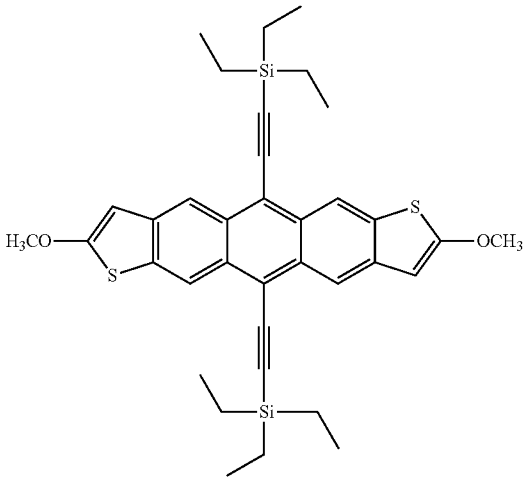
Compound A22
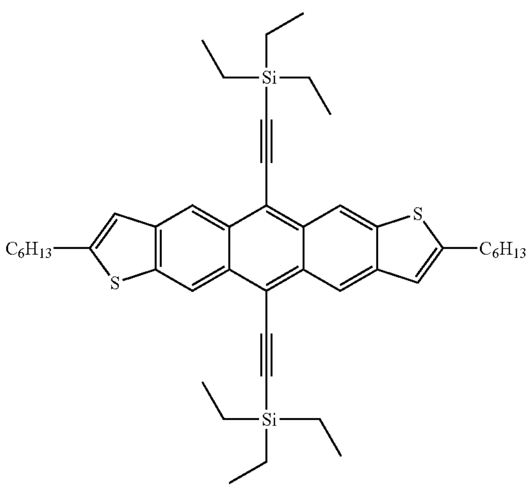
Compound A23
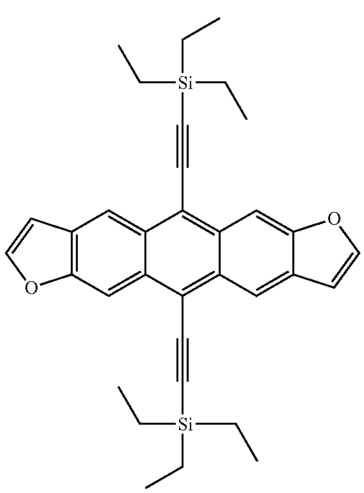
-continued
Compound A24
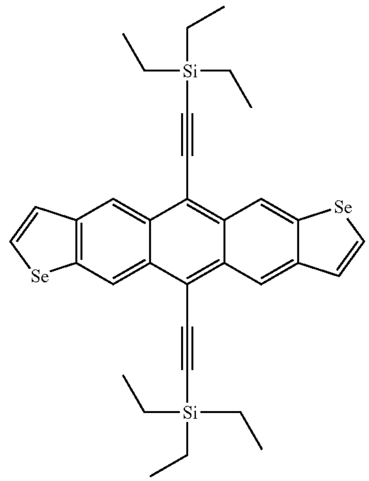
Compound A25
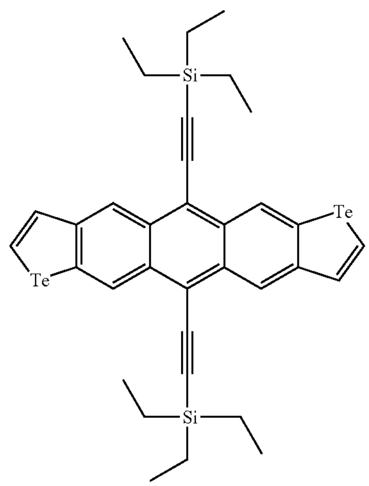
Compound A26
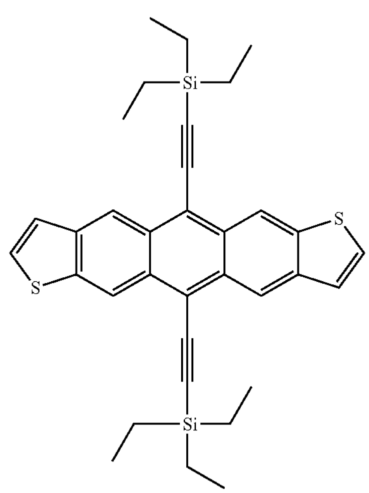

-continued
Compound A27
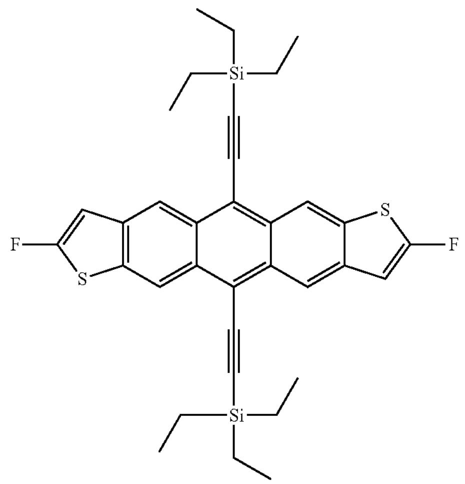
As the condensed polycyclic aromatic compound, compounds represented by the following Formulae (C) to (T) are also preferable.
Formula (C)
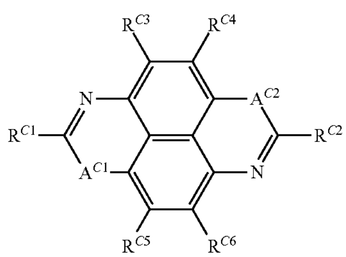
Formula (D)
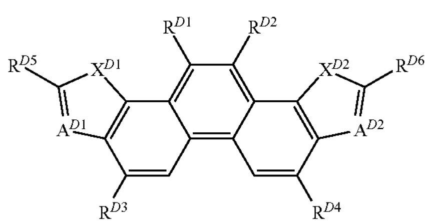
Formula (E)
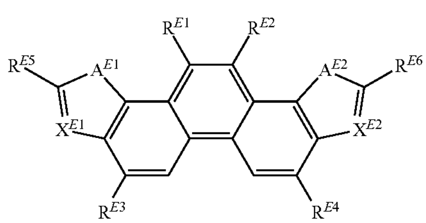
Formula (F)
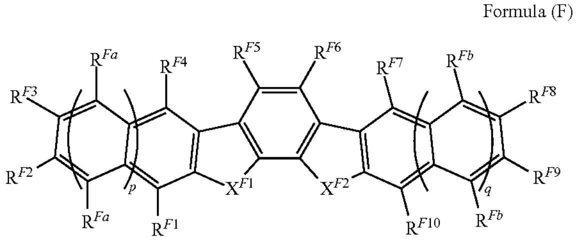
-continued
Formula (G)
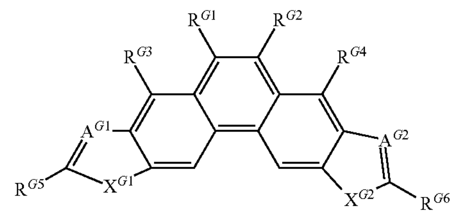
Formula (H)
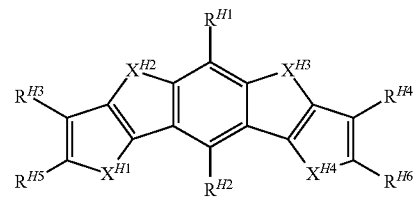
Formula (J)
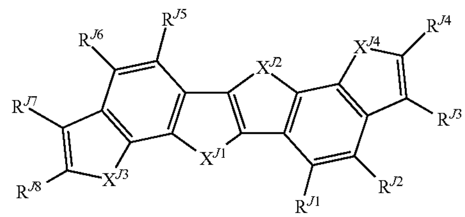
Formula (K)
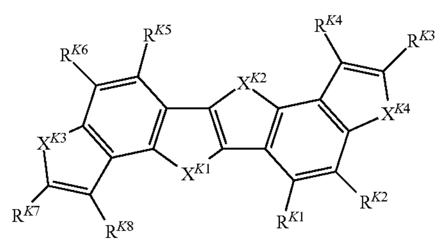
Formula (L)
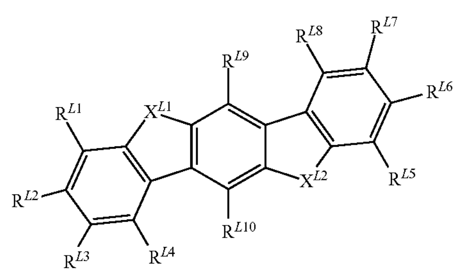
Formula (M)
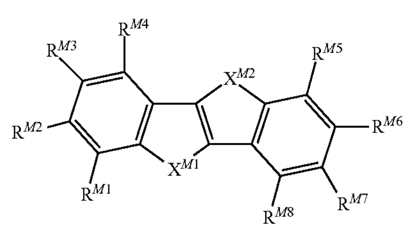

-continued

Formula (N)

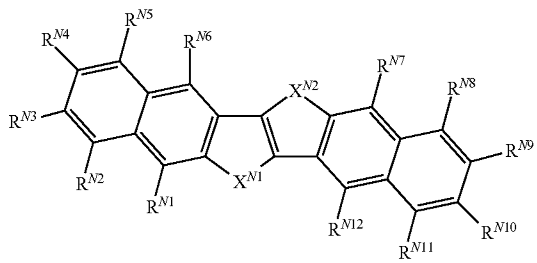

Formula (P)

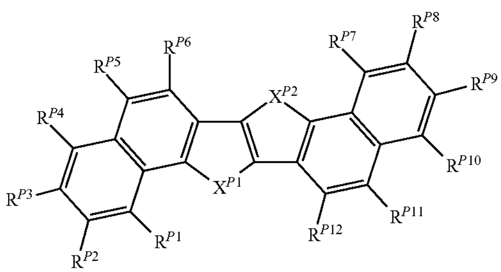

Formula (Q)

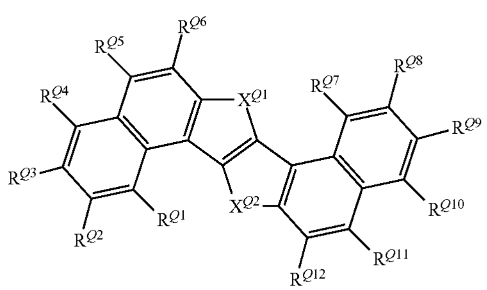

Formula (R)

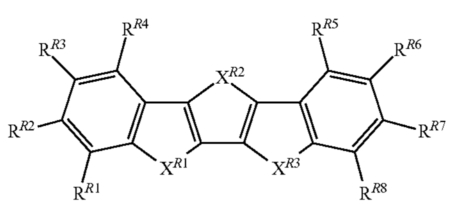

Formula (S)

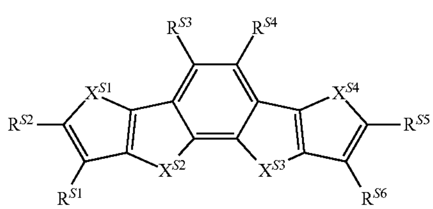

Formula (T)

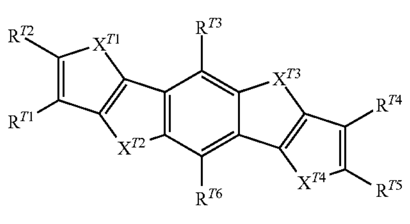

In Formula (C), $A^{C1}$ and $A^{C2}$ represent an oxygen atom, a sulfur atom, or a selenium atom. It is preferable that both of $A^{C1}$ and $A^{C2}$ represent an oxygen atom or a sulfur atom and more preferable that $A^{C1}$ and $A^{C2}$ represent a sulfur atom. $R^{C1}$ to $R^{C6}$ represent a hydrogen atom or a substituent. At least one of $R^{C1}$ to $R^{C6}$ represents a substituent represented by the following Formula (W).

In Formula (D), $X^{D1}$ and $X^{D2}$ represent $NR^{D9}$, an oxygen atom, or a sulfur atom. $A^{D1}$ represents $CR^{D7}$ or a nitrogen atom, $A^{D2}$ represents $CR^{D8}$ or a nitrogen atom, $R^{D9}$ represents a hydrogen atom, an alkyl group, an alkenyl group, an alkynyl group, or an acyl group. $R^{D1}$ to $R^{D8}$ represent a hydrogen atom or a substituent, and at least one of $R^{D1}$ to $R^{D8}$ represents a substituent represented by the following Formula (W).

In Formula (E), $X^{E1}$ and $X^{E2}$ represent an oxygen atom, a sulfur atom, or $NR^{E7}$. $A^{E1}$ and $A^{E2}$ represent $CR^{E8}$ or a nitrogen atom. $R^{E1}$ to $R^{E8}$ represent a hydrogen atom or a substituent. At least one of $R^{E1}$ to $R^{E8}$ represents a substituent represented by the following Formula (W).

In Formula (F), $X^{F1}$ and $X^{F2}$ represent an oxygen atom, a sulfur atom, or a selenium atom. It is preferable that $X^{F1}$ and $X^{F2}$ represent an oxygen atom or a sulfur atom and more preferable that $X^{F1}$ and $X^{F2}$ represent a sulfur atom. $R^{F1}$ to $R^{F10}$, $R^{Fa}$, and $R^{Fb}$ represent a hydrogen atom or a substituent. At least one of $R^{F1}$ to $R^{F10}$, $R^{Fa}$, or $R^{Fb}$ represents a substituent represented by Formula (W). p and q represent an integer of 0 to 2.

In Formula (G), $X^{G1}$ and $X^{G2}$ represent $NR^{G9}$, an oxygen atom, or a sulfur atom. $A^{G1}$ represents $CR^{G7}$ or a nitrogen atom. $A^{G2}$ represents $CR^{G8}$ or a nitrogen atom. $R^{G9}$ represents a hydrogen atom, an alkyl group, an alkenyl group, an alkynyl group, an acyl group, an aryl group, or a heteroaryl group. $R^{G1}$ to $R^{G8}$ represent a hydrogen atom or a substituent. At least one of $R^{G1}$ to $R^{G8}$ represents a substituent represented by the following Formula (W).

In Formula (H), $X^{H1}$ and $X^{H4}$ represent $NR^{H7}$, an oxygen atom, or a sulfur atom. It is preferable that $X^{H1}$ to $X^{H4}$ represent a sulfur atom. $R^{H7}$ represents a hydrogen atom, an alkyl group, an alkenyl group, an alkynyl group, an acyl group, an aryl group, or a heteroaryl group. $R^{H1}$ to $R^{H6}$ represent a hydrogen atom or a substituent. At least one of $R^{H1}$ to $R^{H6}$ represents a substituent represented by the following Formula (W).

In Formula (J), $X^{J1}$ and $X^{J2}$ represent an oxygen atom, a sulfur atom, a selenium atom, or $NR^{J9}$. $X^{J3}$ and $X^{J4}$ represent an oxygen atom, a sulfur atom, or a selenium atom. It is preferable that $X^{J1}$, $X^{J2}$, $X^{J3}$, and $X^{J4}$ represent a sulfur atom. $R^{J1}$ to $R^{J9}$ represent a hydrogen atom or a substituent. At least one of $R^{J1}$ to $R^{J9}$ represents a substituent represented by the following Formula (W).

In Formula (K), $X^{K1}$ and $X^{K2}$ represent an oxygen atom, a sulfur atom, a selenium atom, or $NR^{K9}$. $X^{K3}$ and $X^{K4}$ represent an oxygen atom, a sulfur atom, or a selenium atom. It is preferable that $X^{K1}$, $X^{K2}$, $X^{K3}$, and $X^{K4}$ represent a sulfur atom. $R^{K1}$ to $R^{K9}$ represent a hydrogen atom or a substituent. At least one of $R^{K1}$ to $R^{K9}$ represents a substituent represented by the following Formula (W).

In Formula (L), $X^{L1}$ and $X^{L2}$ represent an oxygen atom, a sulfur atom, or $NR^{L11}$. It is preferable that $X^{L1}$ and $X^{L2}$ represent an oxygen atom or a sulfur atom. $R^{L1}$ to $R^{L11}$ represent a hydrogen atom or a substituent, and at least one of $R^{L1}$ to $R^{L11}$ represents a substituent represented by the following Formula (W).

In Formula (M), $X^{M1}$ and $X^{M2}$ represent an oxygen atom, a sulfur atom, a selenium atom, or $NR^{M9}$. It is preferable that $X^{M1}$ and $X^{M2}$ represent a sulfur atom. $R^{M1}$ to $R^{M9}$ represent a hydrogen atom or a substituent. At least one of $R^{M1}$ to $R^{M9}$ represents a substituent represented by the following Formula (W).

In Formula (N), $X^{N1}$ and $X^{N2}$ represent an oxygen atom, a sulfur atom, a selenium atom, or $NR^{N13}$. It is preferable that $X^{N1}$ and $X^{N2}$ represent a sulfur atom. $R^{N1}$ to $R^{N13}$ represent a hydrogen atom or a substituent. At least one of $R^{N1}$ to $R^{N13}$ represents a substituent represented by the following Formula (W).

In Formula (P), $X^{P1}$ and $X^{P2}$ represent an oxygen atom, a sulfur atom, a selenium atom, or $NR^{P13}$. It is preferable that $X^{P1}$ and $X^{P2}$ represent a sulfur atom. $R^{P1}$ to $R^{P13}$ represent a hydrogen atom or a substituent. At least one of $R^{P1}$ to $R^{P13}$ represents a substituent represented by the following Formula (W).

In Formula (Q), $X^{Q1}$ and $X^{Q2}$ represent an oxygen atom, a sulfur atom, a selenium atom, or $NR^{Q13}$. It is preferable that $X^{Q1}$ and $X^{Q2}$ represent a sulfur atom. $R^{Q1}$ to $R^{Q13}$ represent a hydrogen atom or a substituent. At least one of $R^{Q1}$ to $R^{Q13}$ represents a substituent represented by the following Formula (W).

In Formula (R), $X^{R1}$, $X^{R2}$, and $X^{R3}$ represent an oxygen atom, a sulfur atom, a selenium atom, or $NR^{R9}$. It is preferable that $X^{R1}$, $X^{R2}$, and $X^{R3}$ represent a sulfur atom. $R^{R1}$ to $R^{R9}$ represent a hydrogen atom or a substituent. At least one of $R^{R1}$ to $R^{R9}$ represents a substituent represented by the following Formula (W).

In Formula (S), $X^{S1}$, $X^{S2}$, $X^{S3}$, and $X^{S4}$ represent an oxygen atom, a sulfur atom, a selenium atom, or $NR^{S7}$. It is preferable that $X^{S1}$, $X^{S2}$, $X^{S3}$, and $X^{S4}$ represent a sulfur atom. $R^{S1}$ to $R^{S7}$ represent a hydrogen atom or a substituent. At least one of $R^{S1}$ to $R^{S7}$ represents a substituent represented by the following Formula (W).

In Formula (T), $X^{T1}$, $X^{T2}$, $X^{T3}$, and $X^{T4}$ represent an oxygen atom, a sulfur atom, a selenium atom, or $NR^{T7}$. It is preferable that $X^{T1}$, $X^{T2}$, $X^{T3}$, and $X^{T4}$ represent a sulfur atom. $R^{T1}$ to $R^{T7}$ represent a hydrogen atom or a substituent. At least one of $R^{T1}$ to $R^{T7}$ represents a substituent represented by the following Formula (W).

Hereinafter, in Formulae (C) to (T), $R^{C1}$ to $R^{C6}$, $R^{D1}$ to $R^{D8}$, $R^{E1}$ to $R^{E8}$, $R^{F1}$ to $R^{F10}$, $R^{Fa}$ and $F^{Fb}$, $R^{G1}$ to $R^{G8}$, $R^{H1}$ to $R^{H6}$, $R^{J1}$ to $R^{J9}$, $R^{K1}$ to $R^{K9}$, $R^{L1}$ to $R^{L11}$, $R^{M1}$ to $R^{M9}$, $R^{N1}$ to $R^{N13}$, $R^{P1}$ to $R^{P13}$, $R^{Q1}$ to $R^{Q13}$, $R^{R1}$ to $R^{R9}$, $R^{S1}$ to $R^{S7}$, and $R^{T1}$ to $R^{T7}$ (hereinafter, referred to as substituents $R^C$ to $R^T$) which represent a hydrogen atom or a substituent.

Examples of the substituent which may be employed by the substituents $R^C$ to $R^T$ include a halogen atom, an alkyl group (an alkyl group having 1 to 40 carbon atoms such as methyl, ethyl, propyl, butyl, pentyl, hexyl, heptyl, octyl, nonyl, decyl, undecyl, dodecyl, tridecyl, tetradecyl, or pentadecyl, and in this case, 2,6-dimethyloctyl, 2-decyltetradecyl, 2-hexyldodecyl, 2-ethyloctyl, 2-butyldecyl, 1-octylnonyl, 2-octyltetradecyl, 2-ethylhexyl, cycloalkyl, bicycloalkyl, and tricycloalkyl are included), an alkenyl group (such as 1-pentenyl, cycloalkenyl, or bicycloalkenyl), an alkynyl group (such as 1-pentynyl, trimethylsilylethynyl, triethylsilylethynyl, tri-i-propylsilylethynyl, or 2-p-propylphenylethynyl), an aryl group (for example, an aryl group having 6 to 20 carbon atoms such as phenyl, naphthyl, p-pentylphenyl, 3,4-dipentylphenyl, p-heptoxyphenyl, or 3,4-diheptoxyphenyl), a heterocyclic group (such as a 2-hexylfuranyl group), a cyano group, a hydroxy group, a nitro group, an acyl group (such as hexanoyl or benzoyl), an alkoxy group (such as buthoxy), an aryloxy group, a silyloxy group, a heterocyclic oxy group, an acyloxy group, a carbamoyloxy group, an amino group (such as an anilino group), an acylamino group, an aminocarbonylamino group (such as an ureido group), an alkoxy aryloxycarbonylamino group, an alkyl arylsulfonylamino group, a mercapto group, an alkyl arylthio group (such as methylthio or octylthio), a heterocyclic thio group, a sulfamoyl group, a sulfo group, an alkyl arylsulfinyl group, an alkyl arylsulfonyl group, an alkyl aryloxycarbonyl group, a carbamoyl group, an aryl heterocyclic azo group, an imido group, a phosphino group, a phosphinyl group, a phosphinyloxy group, a phosphinylamino group, a phosphono group, a silyl group (such as a ditrimethylsiloxymethylbutoxy group), a hydrazino group, an ureido group, a boronic acid group ($—B(OH)_2$), a phosphate group ($—OPO(OH)_2$), a sulfato group ($—OSO_3H$), and other known substituents.

These substituents may further include the above-described substituents.

Among these, as the substituents which may be employed by the substituents $R^C$ to $R^T$, an alkyl group, an aryl group, an alkenyl group, an alkynyl group, a heterocyclic group, an alkoxy group, an alkylthio group, and a group represented by the following Formula (W) are preferable, an alkyl group having 1 to 12 carbon atoms, an aryl group having 6 to 20 carbon atoms, an alkenyl group having 2 to 12 carbon atoms, an alkynyl group having 2 to 12 carbon atoms, an alkoxy group having 1 to 11 carbon atoms, a heterocyclic group having 5 to 12 carbon atoms, an alkylthio group having 1 to 12 carbon atoms, and a group represented by the following Formula (W) are more preferable, and a group represented by the following Formula (W) is particularly preferable.

The alkyl group, the alkenyl group, the alkynyl group, the acyl group, and the aryl group as $R^{D9}$, $R^{G9}$, and $R^{H7}$ described above respectively have the same definitions as those for the alkyl group, the alkenyl group, the alkynyl group, the acyl group, and the aryl group described in the section of the substituents which may be employed by the substituents $R^C$ to $R^T$.

Moreover, the heteroaryl group has the same definition as that for the heteroaryl group described in the section of the substituents of $R^{A1}$ to $R^{A6}$.

Formula (W) describes a group represented by $-L-R^W$.

In Formula (W), L represents a divalent linking group represented by any one of the following Formulae (L-1) to (L-25) or a divalent linking group in which two or more (preferably 2 to 10, more preferably 2 to 6, and still more preferably 2 or 3) divalent linking groups represented by any one of the following Formulae (L-1) to (L25) are bonded to each other. $R^W$ represents a substituted or unsubstituted alkyl group, a cyano group, a vinyl group, an ethynyl group, an oxyethylene group, an oligooxyethylene group in which a repeating number v of oxyethylene units is 2 or greater, a siloxane group, an oligosiloxane group having 2 or more silicon atoms, or a substituted or unsubstituted trialkylsilyl group.

(L-1)

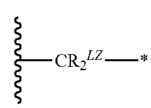

(L-2)

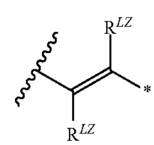

(L-3)

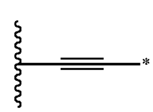

-continued (L-4)

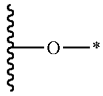

(L-5)

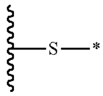

(L-6)

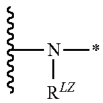

(L-7)

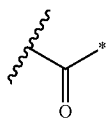

(L-8)

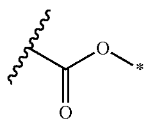

(L-9)

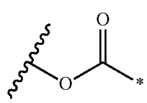

(L-10)

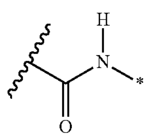

(L-11)

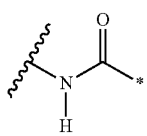

(L-12)

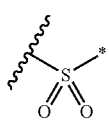

(L-13)

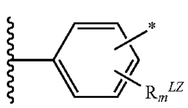

(L-14)

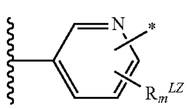

(L-15)

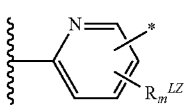

(L-16)

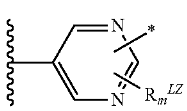

-continued (L-17)

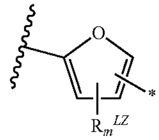

(L-18)

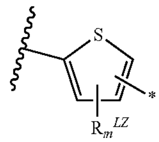

(L-19)

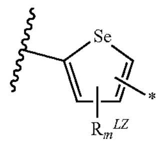

(L-20)

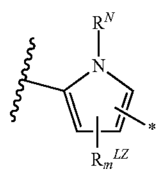

(L-21)

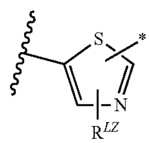

(L-22)

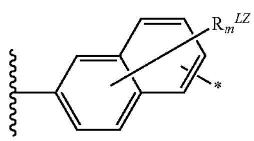

(L-23)

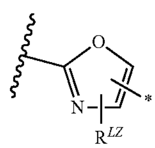

(L-24)

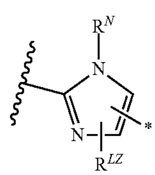

(L-25)

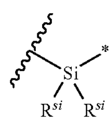

In Formulae (L-1) to (L-25), each wavy line represents a binding position with respect to a ring forming each skeleton represented by any of Formulae (C) to (T). Moreover, in the present specification, in a case where L represents a divalent linking group in which two or more divalent linking groups represented by any of Formulae (L-1) to (L25) are bonded to each other, each wavy line may represent a binding position with a ring forming each skeleton represented by any of Formulae (C) to (T) or a binding position with respect to any of the divalent linking groups represented by Formulae (L-1) to (L25).

The symbol "*" represents a binding position with respect to $R^w$ or a binding position with respect to a wavy line represented by any of Formula (L-1) to (L-25).

m in Formula (L-13) represents 4, m's in Formulae (L-14) and (L-15) represent 3, m's in Formulae (L-16) to (L-20) represent 2, and m in Formula (L-22) represents 6.

$R^{LZ}$'s in Formulae (L-1), (L-2), (L-6), (L-13) to (L-24) each independently represent a hydrogen atom or a substituent, and $R^{LZ}$'s in Formulae (L-1) and (L-2) may be respectively bonded to $R^W$ adjacent to L and form a fused ring.

$R^N$'s represent a hydrogen atom or a substituent and $R^{si}$'s each independently represent a hydrogen atom, an alkyl group, an alkenyl group, or an alkynyl group.

It is more preferable that the divalent linking groups represented by Formulae (L-17) to (L21), (L-23), and (L-24) are divalent linking groups represented by the following Formulae (L-17A) to (L-21A), (L-23A), and (L-24A).

(L-17A)

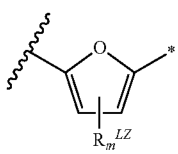

(L-18A)

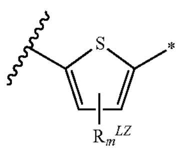

(L-19A)

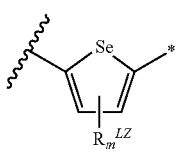

(L-20A)

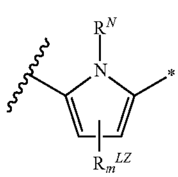

(L-21A)

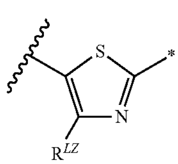

(L-23A)

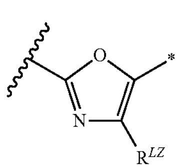

-continued (L-24A)

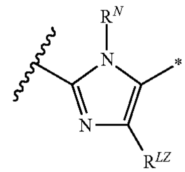

Here, in a case where a substituted or unsubstituted alkyl group, a cyano group, an oxyethylene group, an oligooxyethylene group in which the repeating number v of oxyethylene units is 2 or greater, a siloxane group, an oligosiloxane group having 2 or more silicon atoms, or a substituted or unsubstituted trialkylsilyl group is present at the terminal of a substituent, this substituent can be interpreted as —$R^W$ alone in Formula (W) or as -L-$R^W$ in Formula (W).

In the present invention, in a case where a substituted or unsubstituted alkyl group having N carbon atoms in the main chain is present at the terminal of a substituent, this substituent is determined to be interpreted not as —$R^W$ alone but as -L-$R^W$ in Formula (W), including as many linking groups as possible from the terminal of the substituent. Specifically, this substituent is interpreted as a substituent in which "one (L-1) corresponding to L in Formula (W)" is bonded to "a substituted or unsubstituted alkyl group having N-1 carbon atoms in the main chain corresponding to $R^W$ in Formula (W)." For example, in a case where an n-octyl group which is an alkyl group having 8 carbon atoms is present at the terminal of a substituent, this substituent is interpreted as a substituent in which one (L-1) having two $R^{LZ}$'s representing a hydrogen atom is bonded to an n-heptyl group having 7 carbon atoms. Further, in a case where a substituent represented by Formula (W) is an alkoxy group having 8 carbon atoms, this substituent is interpreted as a substituent in which one linking group represented by —O— of Formula (L-4), one linking group represented by (L-1) in which two $R^{LZ}$'s represent a hydrogen atom, and an n-heptyl group having 7 carbon atoms are bonded to each other.

Meanwhile, in the present invention, in a case where an oxyethylene group, an oligooxyethylene group in which the repeating number v of oxyethylene units is 2 or greater, a siloxane group, an oligosiloxane group having 2 or more silicon atoms, or a substituted or unsubstituted trialkylsilyl group is present at the terminal of a substituent, this substituent is interpreted as $R^W$ alone in Formula (W), including linking groups as many as possible from the terminal of the substituent. For example, in a case where a —($OCH_2CH_2$)—($OCH_2CH_2$)—($OCH_2CH_2$)—$OCH_3$ group is present at the terminal of a substituent, this substituent is interpreted as an oligooxyethylene group alone in which the repeating number v of oxyethylene units is 3.

In a case where a linking group to which a divalent linking group in which L is represented by any of Formulae (L-1) to (L-25) is formed, the number of bonds of the divalent linking group represented by any of Formulae (L-1) to (L-25) is preferably in a range of 2 to 4 and more preferably 2 or 3.

Examples of the substituent $R^{LZ}$ in Formulae (L-1), (L-2), (L-6), and (L-13) to (L-24) include those exemplified as the substituents which may be employed by the substituents $R^C$ to $R^T$ of Formulae (C) to (T). Among these, it is preferable that the substituent RLZ in Formula (L-6) represents an alkyl group. In the case where $R^{LZ}$ in Formula (L-6) represents an alkyl group, the number of carbon atoms of the alkyl group is preferably in a range of 1 to 9, more preferably in a range of 4 to 9 from the viewpoints of chemical stability and carrier transportability, and still more preferably in a range of 5 to 9. In the case where $R^{LZ}$ in (L-6) is an alkyl group, it is preferable that the alkyl group is a linear alkyl group from the viewpoint of improving the carrier transportability.

Examples of $R^N$ include those exemplified as the substituents which may be employed by the substituents $R^C$ to $R^T$. Among these, it is preferable that $R^N$ represents a hydrogen atom or a methyl group.

It is preferable that $R^{si}$ represents an alkyl group. The alkyl group which may be employed by $R^{si}$ is not particularly limited, but the preferable range of the alkyl group which may be employed by $R^{si}$ is the same as the preferable range of an alkyl group which may be employed by a silyl group in a case where $R^W$ represents a silyl group. The alkenyl group which may be employed as $R^{si}$ is not particularly limited, but a substituted or unsubstituted alkenyl group is preferable and a branched alkenyl group is more preferable as the alkenyl group. The number of carbon atoms thereof is preferably 2 or 3. The alkynyl group which may be employed as $R^{si}$ is not particularly limited, but a substituted or unsubstituted alkynyl group is preferable and a branched alkynyl group is more preferable as the alkynyl group. The number of carbon atoms thereof is preferably 2 or 3.

It is preferable that L represents a divalent linking group represented by any of Formulae (L-1) to (L-5), (L-13), (L-17), and (L-18) or a divalent linking group in which two or more divalent linking groups represented by any of Formulae (L-1) to (L-5), (L-13), (L-17), and (L-18) are bonded to each other, more preferable that L represents a divalent linking group represented by any of Formulae (L-1), (L-3), (L-13), and (L-18) or a divalent linking group in which two or more divalent linking groups represented by any of Formulae (L-1), (L-3), (L-13), and (L-18) are bonded to each other, and particularly preferable that L represents a divalent linking group represented by any of Formulae (L-1), (L-3), (L-13), and (L-18) or a divalent linking group in which a divalent linking group represented by any one of Formulae (L-3), (L-13), and (L-18) is bonded to a divalent linking group represented by Formula (L-1). In the divalent linking group in which a divalent linking group represented by any one of Formulae (L-3), (L-13), and (L-18) is bonded to a divalent linking group represented by Formula (L-1), it is preferable that the divalent linking group represented by Formula (L-1) is bonded to the $R^W$ side.

From the viewpoints of chemical stability and carrier transportability, it is particularly preferable that L represents a divalent linking group which has a divalent linking group represented by Formula (L-1), more particularly preferable that L represents a divalent linking group represented by Formula (L-1), still more particularly preferable that L represents a divalent linking group represented by Formula (L-18) or (L-1), the divalent linking group is bonded to $R^W$ through (L-1), and $R^W$ represents a substituted or unsubstituted alkyl group, and even still more particularly preferable that L represents a divalent linking group represented by Formula (L-18A) or (L-1), the divalent linking group is bonded to $R^W$ through (L-1), and $R^W$ represents a substituted or unsubstituted alkyl group.

In Formula (W), it is preferable that $R^W$ represents a substituted or unsubstituted alkyl group. In Formula (W), in a case where L adjacent to $R^W$ represents a divalent linking group represented by Formula (L-1), it is preferable that $R^W$ represents a substituted or unsubstituted alkyl group, an oxyethylene group, an oligooxyethylene group in which the repeating number of oxyethylene units is 2 or greater, a siloxane group, or an oligosiloxane group having 2 or more silicon atoms and more preferable that $R^W$ represents a substituted or unsubstituted alkyl group.

In Formula (W), in a case where L adjacent to $R^W$ represents a divalent linking group represented by any of Formulae (L-2) and (L-4) to (L-25), it is more preferable that $R^W$ represents a substituted or unsubstituted alkyl group.

In Formula (W), in a case where L adjacent to $R^W$ represents a divalent linking group represented by Formula (L-3), it is preferable that $R^W$ represents a substituted or unsubstituted alkyl group or a substituted or unsubstituted silyl group.

In a case where $R^W$ represents a substituted or unsubstituted alkyl group, the number of carbon atoms is preferably in a range of 4 to 17, more preferably in a range of 6 to 14 from the viewpoints of chemical stability and carrier transportability, and still more preferably in a range of 6 to 12. From the viewpoints of improving linearity of a molecule and carrier transportability, it is preferable that $R^W$ represents a long-chain alkyl group, particularly a long-chain linear alkyl group, within the above-described range.

In a case where $R^W$ represents an alkyl group, the alkyl group may be linear, branched, or cyclic, but it is preferable that the alkyl group is linear from the viewpoints of improving the linearity of a molecule and the carrier transportability.

As a combination of $R^W$ and L of Formula (W), from the viewpoint of improving the carrier mobility, it is preferable that L in Formulae (C) to (T) represents a divalent linking group represented by Formula (L-1) and $R^W$ represents a linear alkyl group having 4 to 17 carbon atoms or L represents a divalent linking group in which a divalent linking group represented by any one of Formulae (L-3), (L-13), and (L-18) is bonded to a divalent linking group represented by Formula (L-1) and $R^W$ represents a linear alkyl group.

In the case where L represents a divalent linking group represented by Formula (L-1) and $R^W$ represents a linear alkyl group having 4 to 17 carbon atoms, it is more preferable that $R^W$ represents a linear alkyl group having 6 to 14 carbon atoms from the viewpoint of improving the carrier mobility and particularly preferable that $R^W$ represents a linear alkyl group having 6 to 12 carbon atoms.

In the case where L represents a divalent linking group in which a divalent linking group represented by any one of Formulae (L-3), (L-13), and (L-18) is bonded to a divalent linking group represented by Formula (L-1) and $R^W$ represents a linear alkyl group, it is more preferable that $R^W$ represents a linear alkyl group having 4 to 17 carbon atoms, more preferable that $R^W$ represents a linear alkyl group having 6 to 14 carbon atoms from the viewpoints of the chemical stability and carrier mobility, and particularly preferable that $R^W$ represents a linear alkyl group having 6 to 12 carbon atoms from the viewpoint of improving the carrier mobility.

Meanwhile, from the viewpoint of improving solubility in an organic solvent, it is preferable that $R^W$ represents a branched alkyl group.

In a case where $R^W$ represents an alkyl group having a substituent, a halogen atom may be exemplified as the substituent and a fluorine atom is preferable. Moreover, in a case where $R^W$ represents an alkyl group having fluorine atoms, all hydrogen atoms of the alkyl group may be substituted with fluorine atoms to form a perfluoroalkyl group. In this case, it is preferable that $R^W$ represents an unsubstituted alkyl group.

In a case where $R^W$ represents an ethyleneoxy group or an oligoethyleneoxy group, in the present specification, the "oligooxyethylene group" represented by $R^W$ indicates a group represented by $—(OCH_2CH_2)_vOY$ (the repeating number v of oxyethylene units is an integer of 2 or greater and Y at the terminal represents a hydrogen atom or a substituent). Further, in a case where Y at the terminal of the oligooxyethylene group represents a hydrogen atom, this becomes a hydroxy group. The repeating number v of the oxyethylene units is preferably in a range of 2 to 4 and more preferably 2 or 3. It is preferable that the hydroxy group at the terminal of the oligooxyethylene group is sealed, that is, Y represents a substituent. In this case, it is preferable that the hydroxy group is sealed by an alkyl group having 1 to 3 carbon atoms, that is, Y represents an alkyl group having 1 to 3 carbon atoms, more preferable that Y represents a methyl group or an ethyl group, and particularly preferable that Y represents a methyl group.

In a case where $R^W$ represents a siloxane group or an oligosiloxane group, the repeating number of siloxane units is preferably 2 to 4 and more preferably 2 or 3. Further, it is preferable that a hydrogen atom or an alkyl group is bonded to a Si atom. In a case where an alkyl group is bonded to a Si atom, the number of carbon atoms of the alkyl group is preferably in a range of 1 to 3, and it is preferable that a methyl group or an ethyl group is bonded to the Si atom. The same alkyl groups may be bonded to a Si atom or alkyl groups which are different from each other or hydrogen atoms may be bonded thereto. In addition, all siloxane units constituting an oligosiloxane group may be the same as or different from each other, but it is preferable that all siloxane units are the same as each other.

In a case where L adjacent to $R^W$ represents a divalent linking group represented by Formula (L-3), it is also preferable that $R^W$ represents a substituted or unsubstituted silyl group. In the case where $R^W$ represents a substituted or unsubstituted silyl group, it is preferable that $R^W$ represents a substituted silyl group. The substituted of the silyl group is not particularly limited, but a substituted or unsubstituted alkyl group is preferable and a branched alkyl group is more preferable as the substituent. In the case where $R^W$ represents a trialkylsilyl group, the number of carbon atoms of an alkyl group bonded to a Si atom is preferably in a range of 1 to 3, and it is preferable that a methyl group, an ethyl group, or an isopropyl group is bonded to a Si atom. Alkyl groups which are the same as or different from each other may be bonded to a Si atom. In a case where $R^W$ represents a trialkylsilyl group having other substituents in addition to an alkyl group, the substituents are not particularly limited.

In Formula (W), the total number of carbon atoms included in L and $R^W$ is preferably in a range of 5 to 18. When the total number of carbon atoms included in L and $R^W$ is greater than or equal to the lower limit of the above-described range, the carrier mobility is increased and the driving voltage is lowered. The total number of carbon atoms included in L and $R^W$ is less than or equal to the upper limit of the above-described range, the solubility in an organic solvent is increased.

The total number of carbon atoms included in L and $R^W$ is preferably in a range of 5 to 14, more preferably in a range of 6 to 14, particularly preferably in a range of 6 to 12, and more particularly preferably in a range of 8 to 12.

Among the substituents $R^C$ to $R^T$ in respective compounds represented by Formulae (C) to (T), the number of groups represented by Formula (W) is preferably in a range of 1 to 4 from the viewpoints of improving the carrier mobility and the solubility in an organic solvent, more preferably 1 or 2, and particularly preferably 2.

Among the substituents the $R^C$ to $R^T$, the positions of groups represented by Formula (W) are not particularly limited.

In the compound represented by Formula (C), a group in which any of $R^{C1}$, $R^{C2}$, $R^{C3}$, and $R^{C6}$ is represented by Formula (W) is preferable and a group in which both of $R^{C1}$ and $R^{C2}$ or both of $R^{C3}$ and $R^{C6}$ are represented by Formula (W) is more preferable.

In the compound represented by Formula (D), a group in which $R^{D6}$ is represented by Formula (W) is preferable and a group in which both of $R^{D5}$ and $R^{D6}$ are represented by Formula (W) is more preferable.

In the compound represented by Formula (E), a group in which $R^{E6}$ is represented by Formula (W) is preferable and a group in which both of $R^{E5}$ and $R^{E6}$ are represented by Formula (W) is more preferable. Further, in a case of a substituent other than the group in which both of $R^{E5}$ and $R^{E6}$ are represented by Formula (W), a group in which two $R^{E7}$'s are represented by Formula (W) is also preferable.

In the compound represented by Formula (F), a substituent in which at least one of $R^{F2}$, $R^{F3}$, $R^{F8}$, or $R^{F9}$ is represented by Formula (W) is preferable.

In the compound represented by Formula (G), a group in which $R^{G5}$ or $R^{G6}$ is represented by Formula (W) is preferable from the viewpoints of improving the carrier mobility and the solubility in an organic solvent.

In the compound represented by Formula (H), a group in which $R^{H4}$ or $R^{H6}$ is represented by Formula (W) is preferable and a group in which $R^{H4}$ or $R^{H6}$ and $R^{H3}$ or $R^{H5}$ are represented by Formula (W) is more preferable.

In the compound represented by Formula (J), a group in which $R^{J8}$ is represented by Formula (W) is preferable and a group in which both of $R^{J8}$ and $R^{J4}$ are represented by Formula (W) is more preferable.

In the compound represented by Formula (K), a group in which $R^{K7}$ is represented by Formula (W) is preferable and a group in which both of $R^{K7}$ and $R^{K3}$ are represented by Formula (W) is more preferable.

In the compound represented by Formula (L), a group in which at least one of $R^{L2}$, $R^{L3}$, $R^{L6}$, or $R^{L7}$ is represented by Formula (W) is more preferable.

In the compound represented by Formula (M), a group in which $R^{M2}$ is represented by Formula (W) is preferable and a group in which both of $R^{M2}$ and $R^{M6}$ are represented by Formula (W) is more preferable.

In the compound represented by Formula (N), a group in which $R^{N3}$ is represented by Formula (W) is preferable and a group in which both of $R^{N3}$ and $R^{N9}$ are represented by Formula (W) is more preferable.

In the compound represented by Formula (P), a group in which $R^{P2}$ or $R^{P3}$ is represented by Formula (W) is preferable and a group in which both of $R^{P2}$ and $R^{P8}$ or both of $R^{P3}$ and $R^{P9}$ are represented by Formula (W) is more preferable.

In the compound represented by Formula (Q), a group in which $R^{Q3}$ is represented by Formula (W) is preferable and a group in which both of $R^{Q3}$ and $R^{Q9}$ are represented by Formula (W) is more preferable.

In the compound represented by Formula (R), a group in which $R^{R2}$ is represented by Formula (W) is preferable and a group in which both of $R^{R2}$ and $R^{R7}$ are represented by Formula (W) is more preferable.

In the compound represented by Formula (S), a group in which $R^{S2}$ is represented by Formula (W) is preferable and a group in which both of $R^{S2}$ and $R^{S5}$ are represented by Formula (W) is more preferable.

In the compound represented by Formula (T), a group in which $R^{T2}$ is represented by Formula (W) is preferable and a group in which both of $R^{T2}$ and $R^{T5}$ are represented by Formula (W) is more preferable.

Among the substituents $R^C$ to $R^T$, the number of substituents other than the groups represented by Formula (W) is preferably in a range of 0 to 4 and more preferably in a range of 0 to 2.

Hereinafter, specific examples of respective compounds represented by Formulae (C) to (T) will be described, but the compounds which can be used in the present invention should not be limitatively interpreted by these specific examples.

Specific examples of compounds C represented by Formula (C) are described.

Compound C1

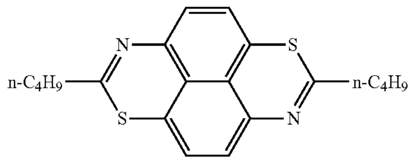

Compound C2

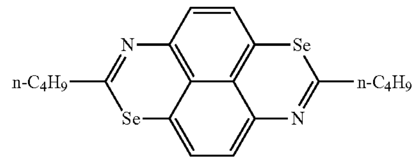

Compound C3

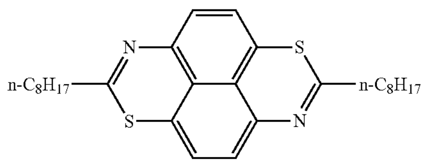

Compound C4

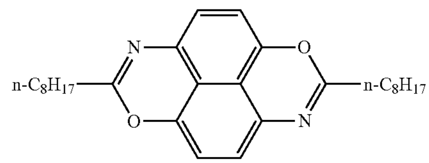

Compound C5

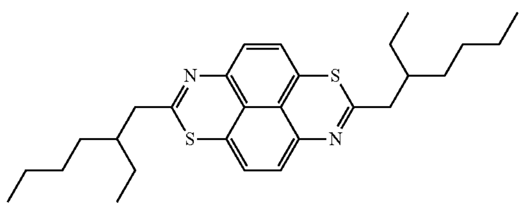

Compound C6

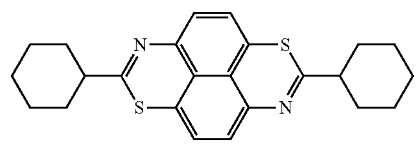

Compound C7

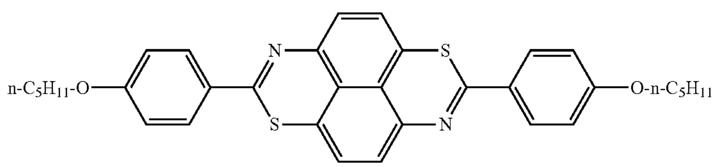

Compound C8

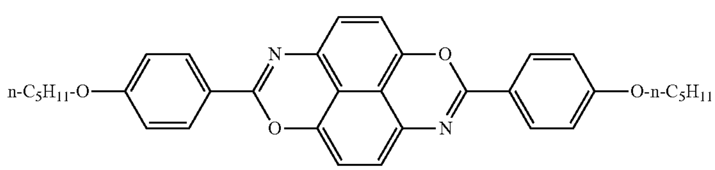

Compound C9

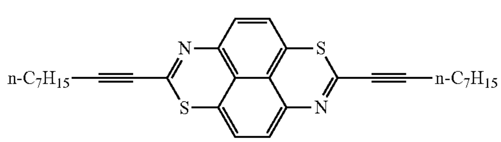

Compound C10

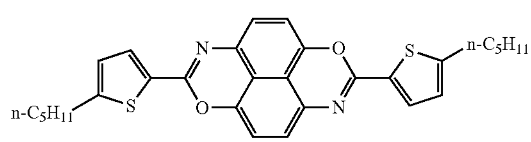

Compound C11

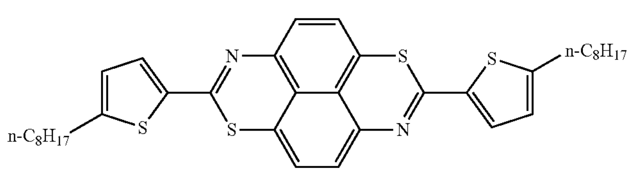

-continued
Compound C12
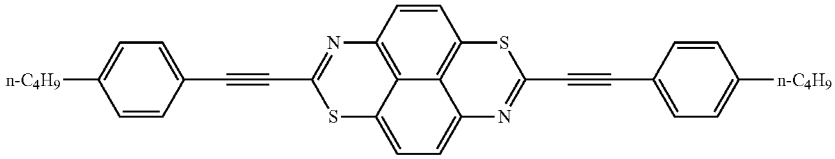
Compound C13
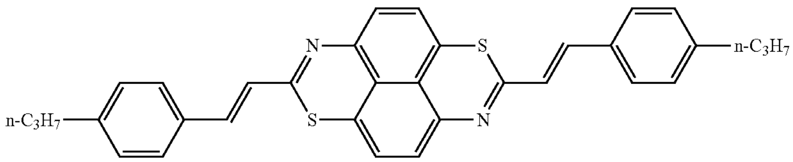
Compound C14
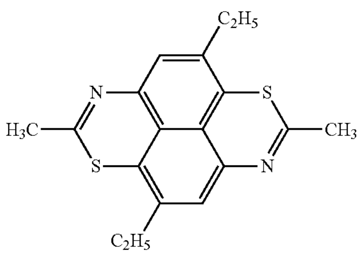
Compound C15
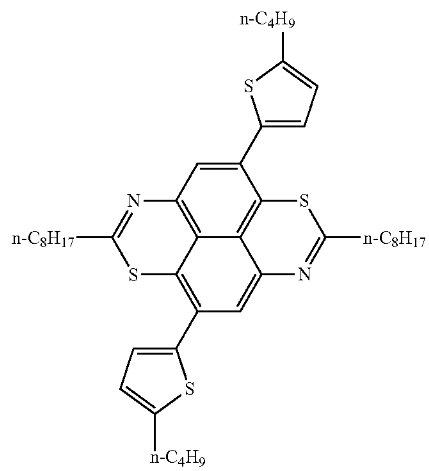
Compound C16
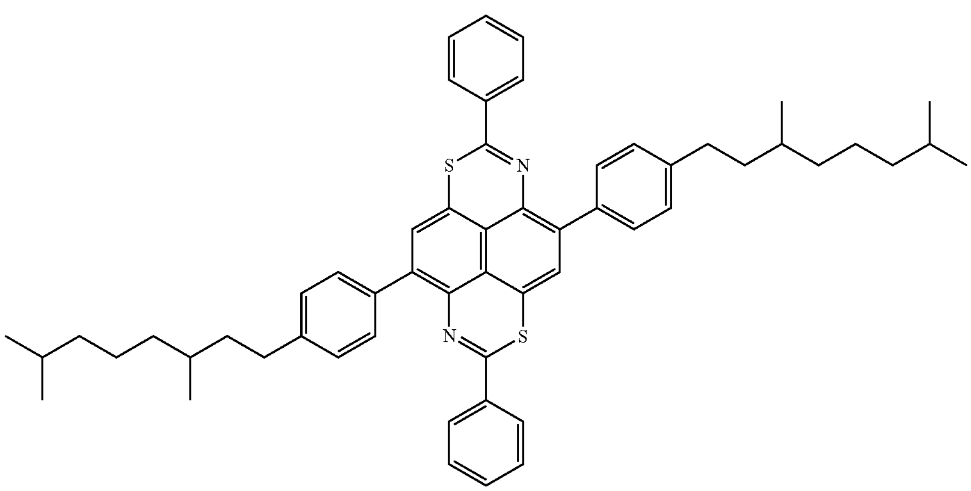

-continued

Compound C17

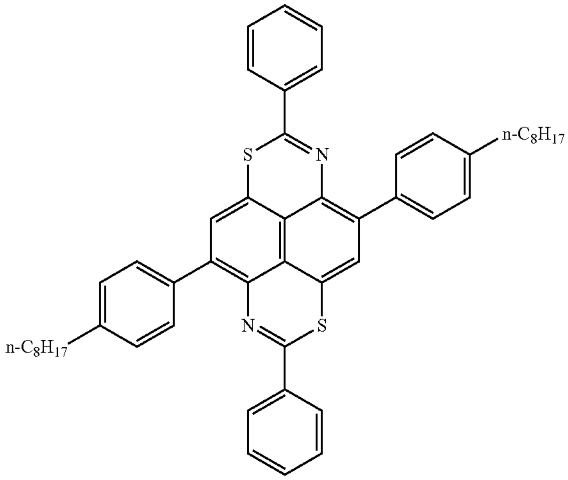

The molecular weight of a compound represented by Formula (C) is preferably 3000 or less, more preferably 2000 or less, still more preferably 1000 or less, and particularly preferably 850 or less. When the molecular weight is in the above-described range, the solubility in a solvent can be improved.

Meanwhile, from the viewpoint of stable film quality of a thin film, the molecular weight thereof is preferably 300 or greater, more preferably 350 or greater, and still more preferably 400 or greater.

Specific examples of compounds D represented by Formula (D) are described.

Compound D1

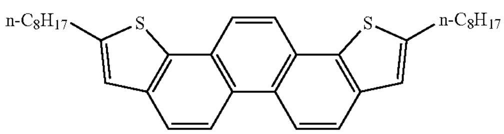

Compound D2

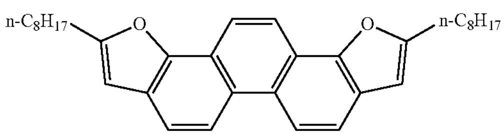

Compound D3

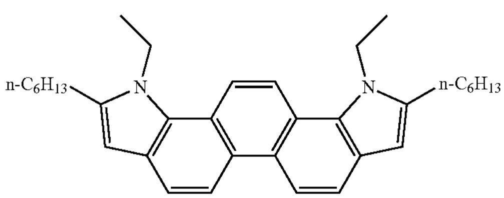

Compound D4

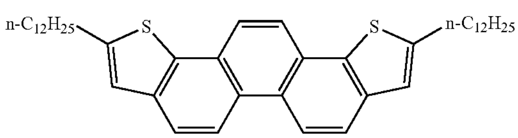

Compound D5

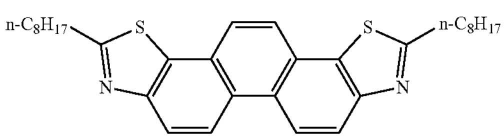

Compound D6

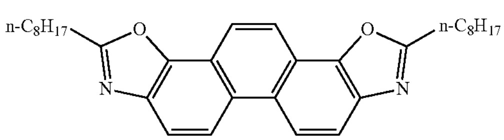

-continued
Compound D7
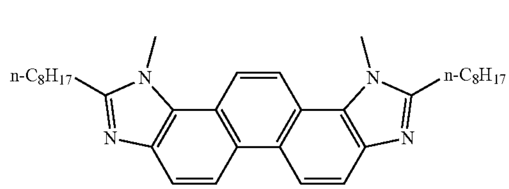
Compound D8
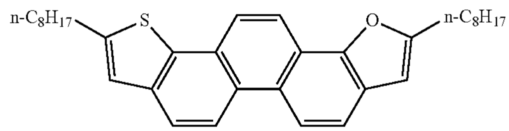
Compound D9
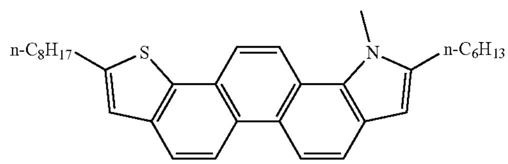
Compound D10
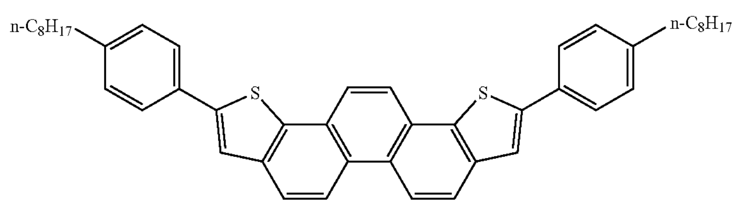
Compound D11
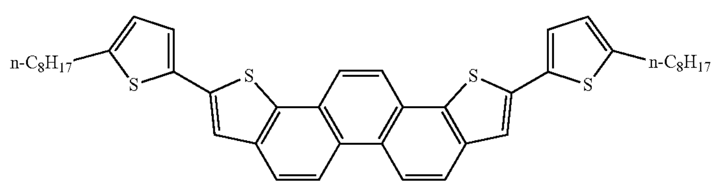
Compound D12
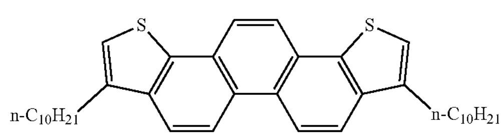
Compound D13
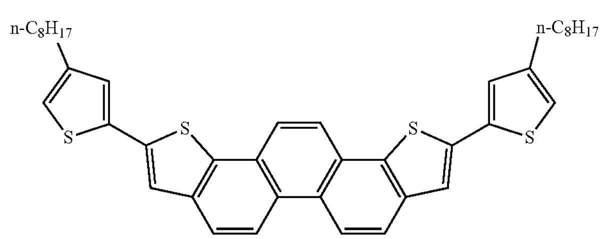
Compound D14
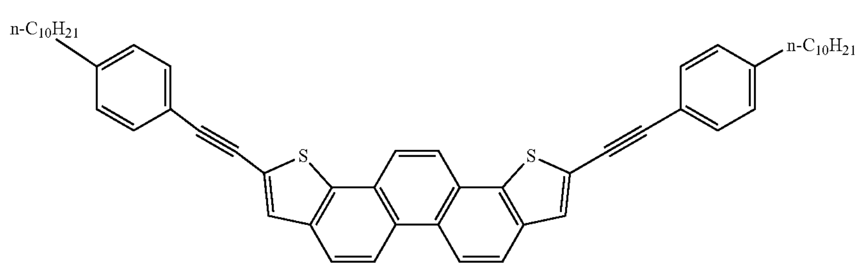

-continued

Compound D15

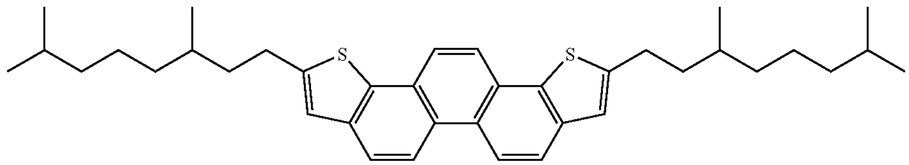

Compound D16

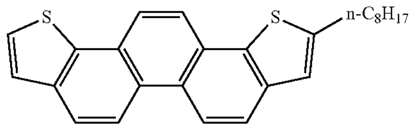

From the viewpoint of improving the solubility in a solvent, it is preferable that the upper limit of the molecular weight of a compound represented by Formula (D) is the same as that of the compound represented by Formula (C). Meanwhile, from the viewpoint of stable film quality of a thin film, the molecular weight thereof is preferably 400 or greater, more preferably 450 or greater, and still more preferably 500 or greater.

Specific examples of a compound E represented by Formula (E), a compound F represented by Formula (F), a compound G represented by Formula (G), and a compound H represented by Formula (H) are respectively described in order.

Compound E1

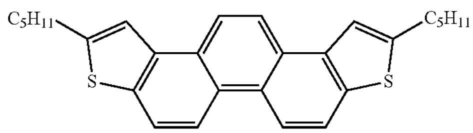

Compound E2

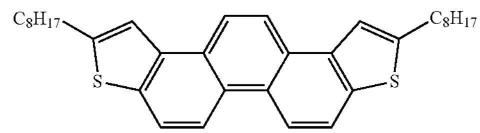

Compound E3

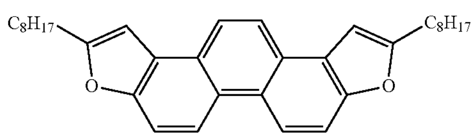

Compound E4

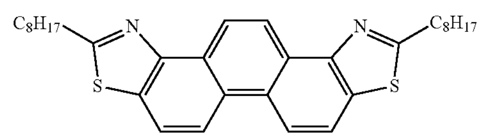

Compound E5

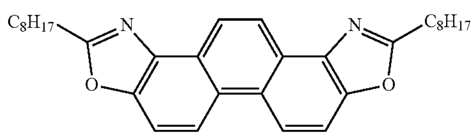

Compound E6

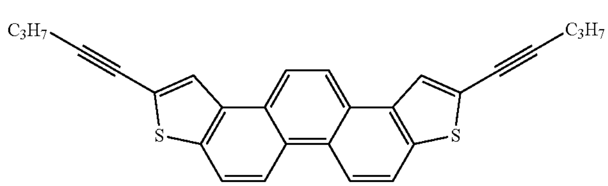

Compound E7

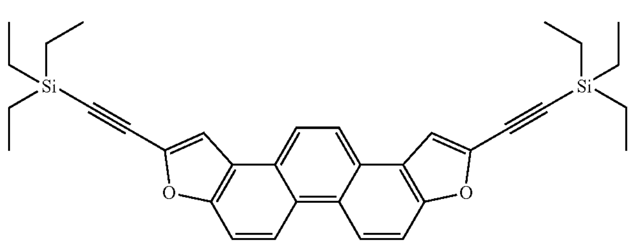

-continued
Compound E8
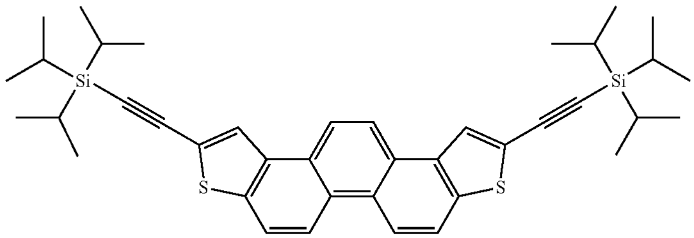
Compound E9
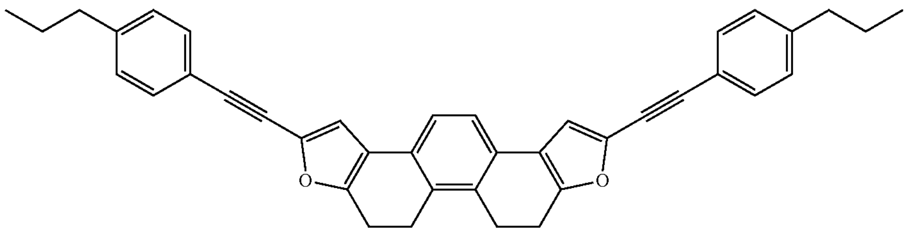
Compound E10
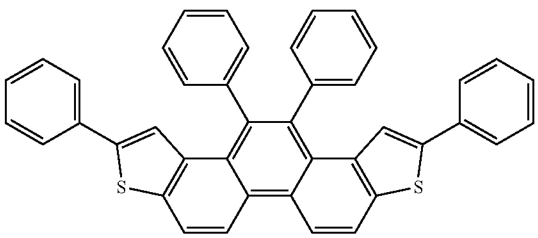
Compound E11
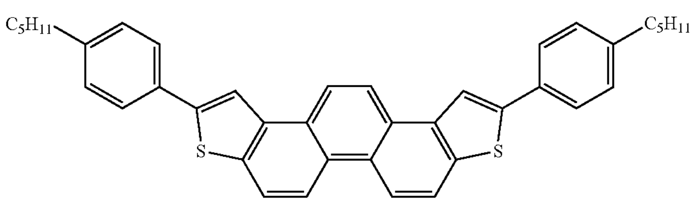
Compound E12
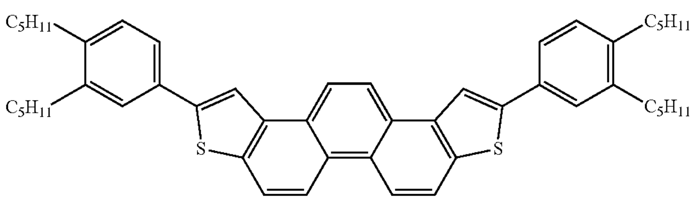
Compound E13
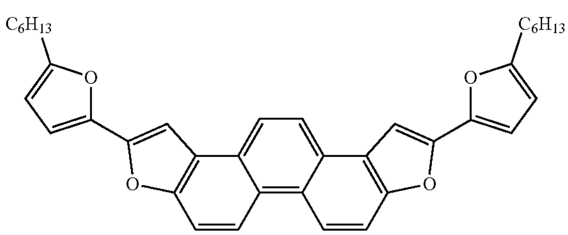
Compound E14
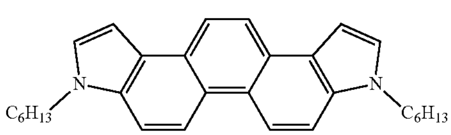
Compound F1
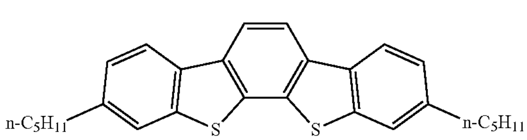

-continued
Compound F2
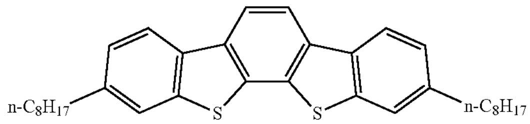
Compound F3
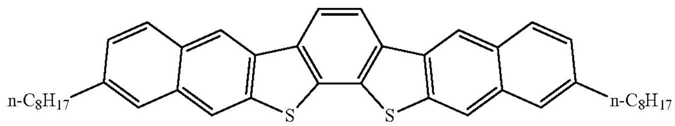
Compound F4
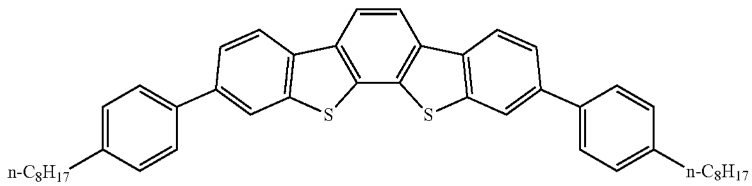
Compound F5
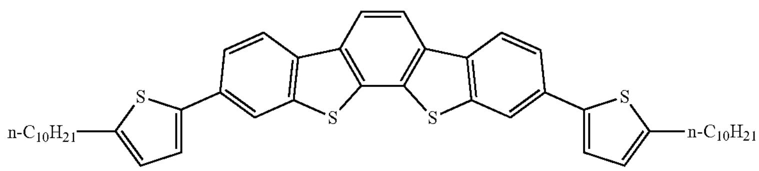
Compound F6
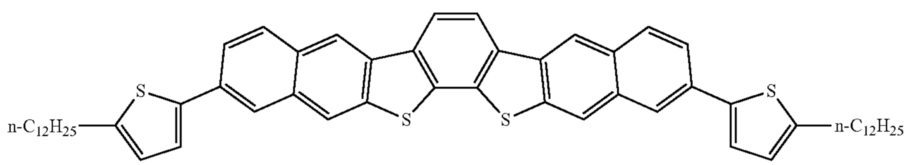
Compound F7
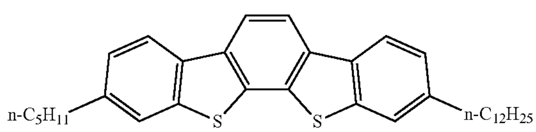
Compound F8
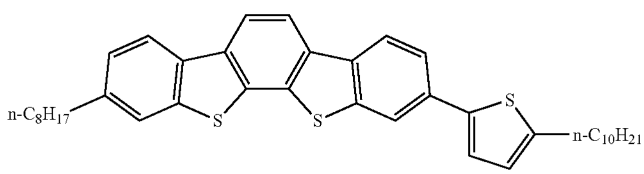
Compound F9
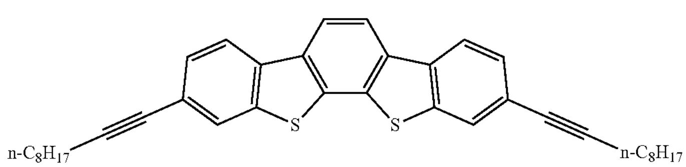
Compound F10
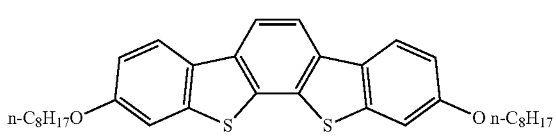
Compound F11
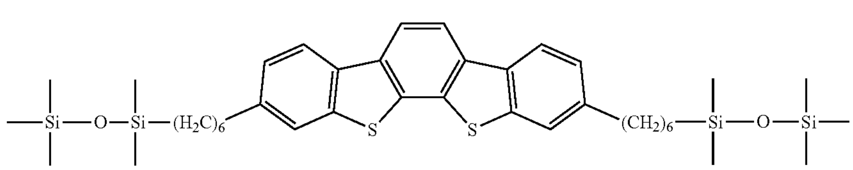

-continued
Compound F12
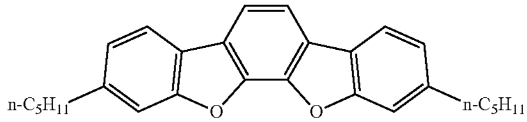
Compound G1
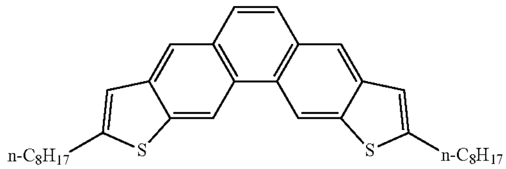
Compound G2
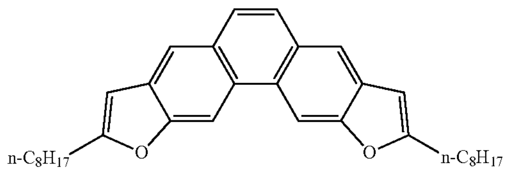
Compound G3
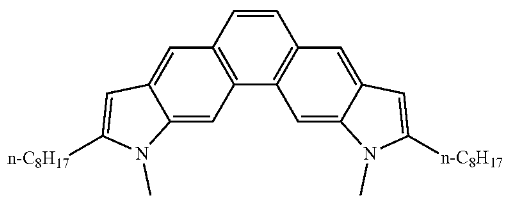
Compound G4
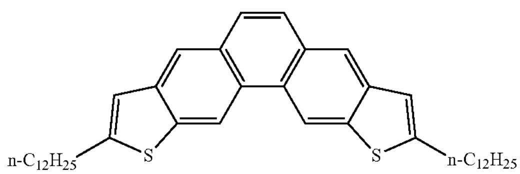
Compound G5
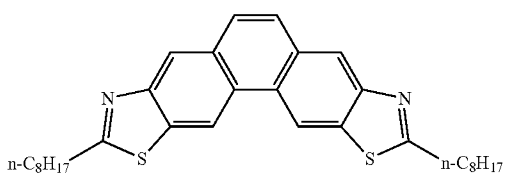
Compound G6
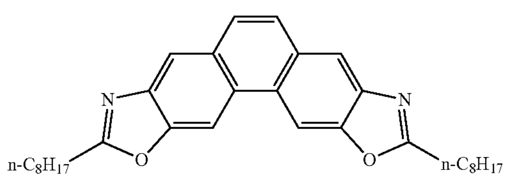
Compound G7
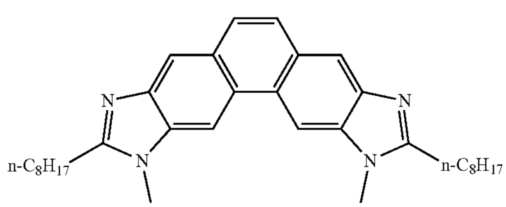
Compound G8
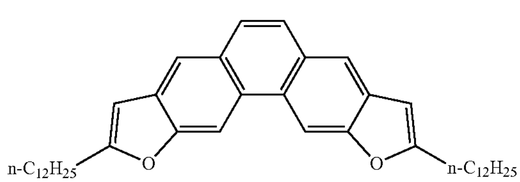

-continued
Compound G9
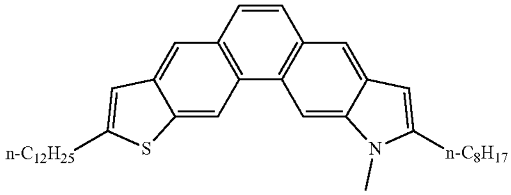
Compound G10
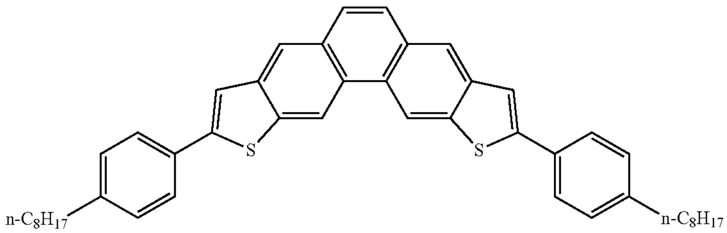
Compound G11
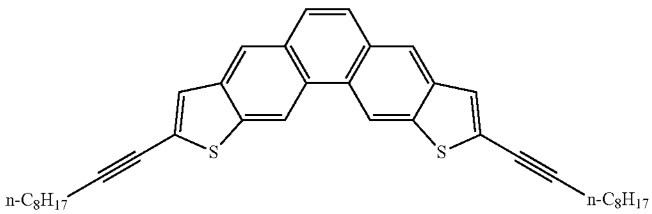
Compound G12
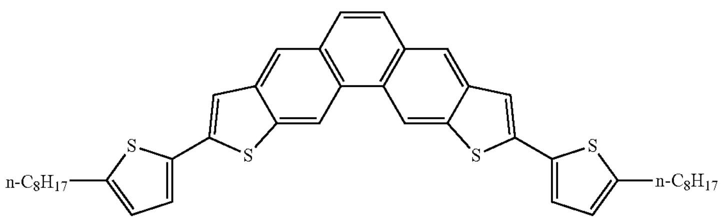
Compound G13
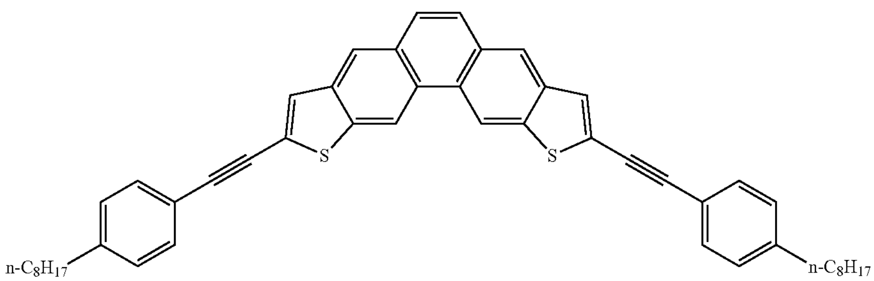
Compound G14
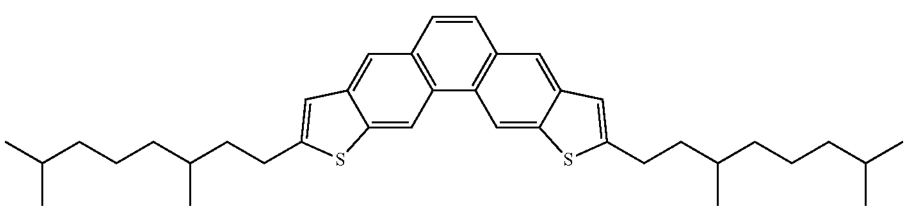
Compound G15
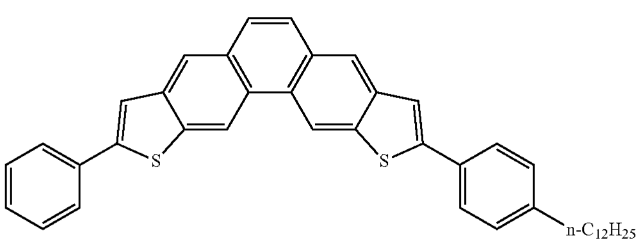

-continued
Compound H1
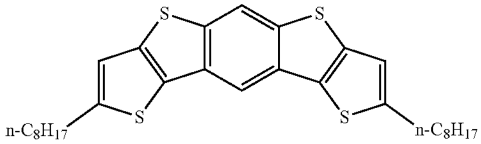
Compound H2
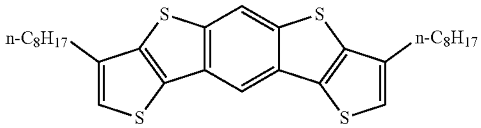
Compound H3
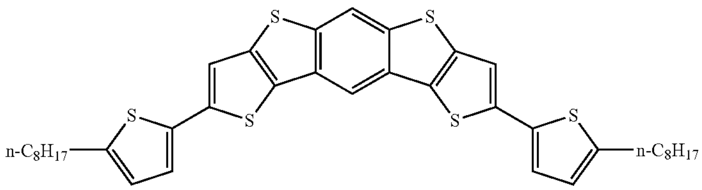
Compound H4
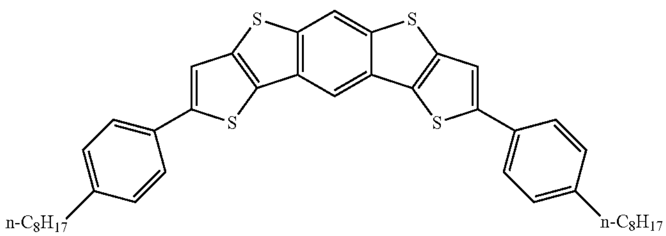
Compound H5
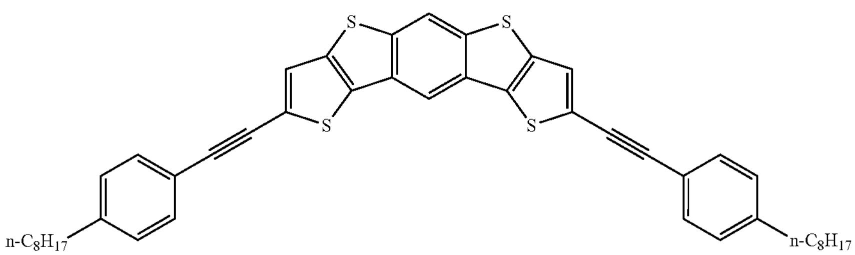
Compound H6
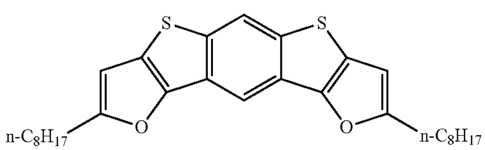
Compound H7
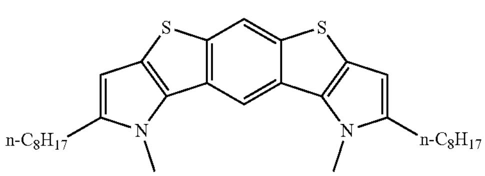
Compound H8
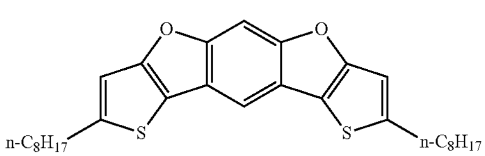

-continued

Compound H9

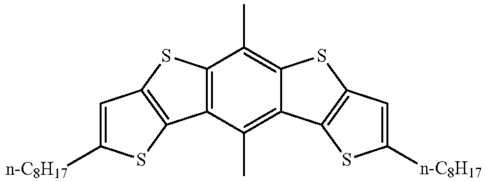

Compound H10

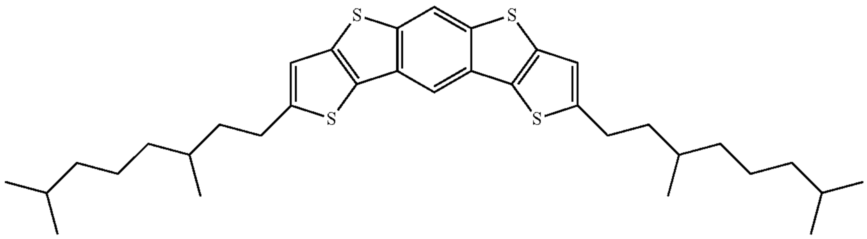

Compound H11

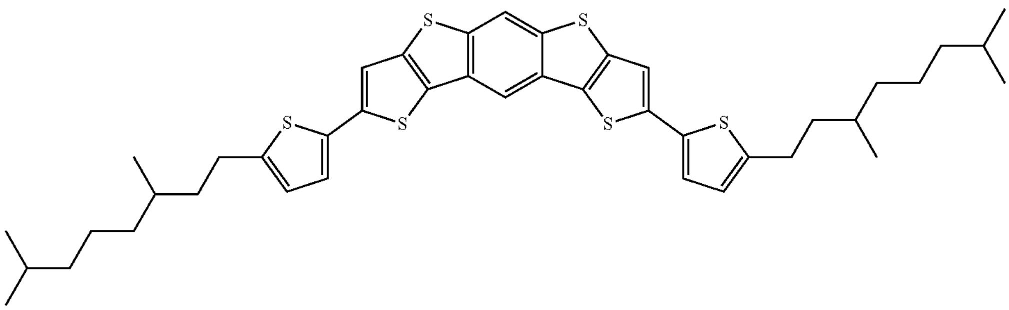

Compound H12

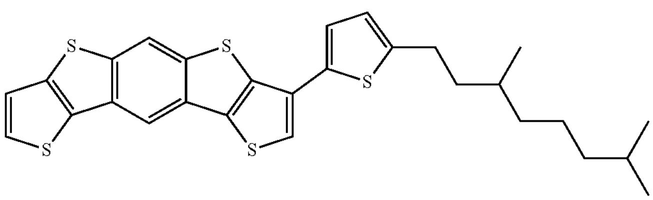

From the viewpoint of improving the solubility in a solvent, it is preferable that the upper limits of the molecular weights of the compounds E, F, G, and H are respectively the same as that of the compound C represented by Formula (C). Meanwhile, from the viewpoint of stable film quality of a thin film, the lower limits of the molecular weights thereof are respectively the same as that of the compound represented by Formula (D).

Specific examples of a compound J represented by Formula (J) and a compound K represented by Formula (K) are described.

Compound J1

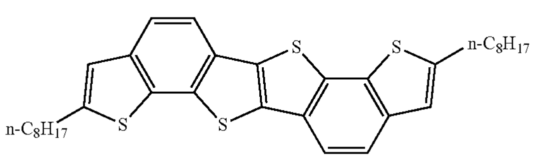

Compound K1

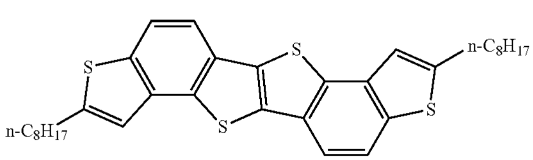

-continued
Compound J2
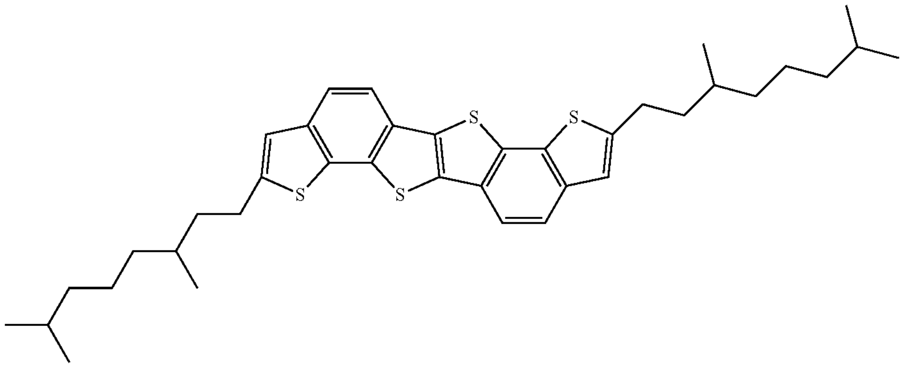
Compound K2
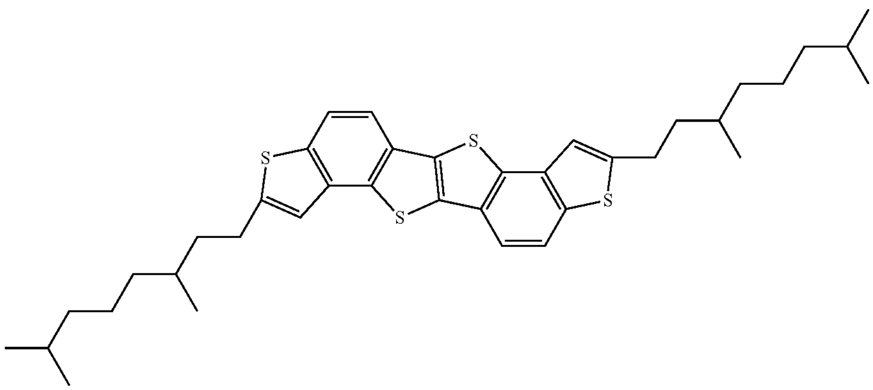
Compound J3
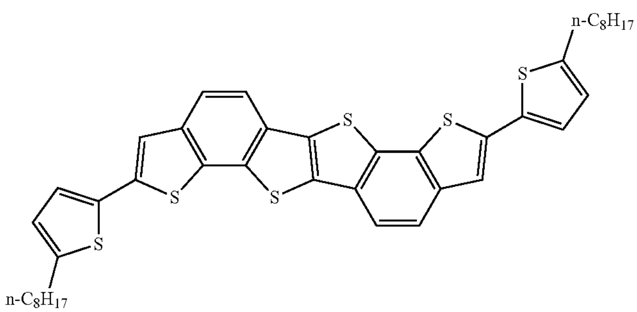
Compound K3
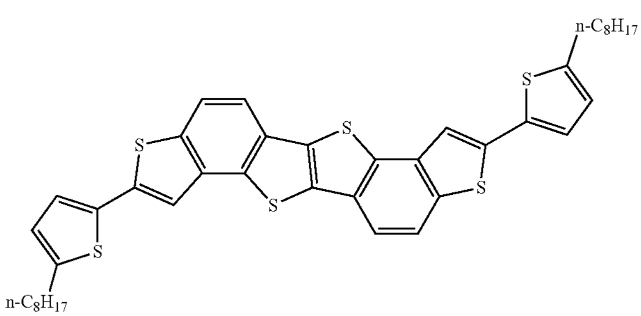
Compound J4
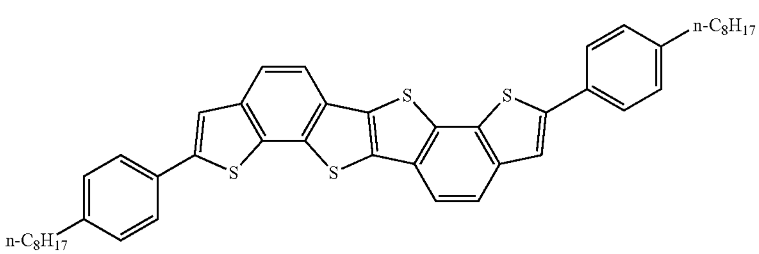

-continued
Compound K4
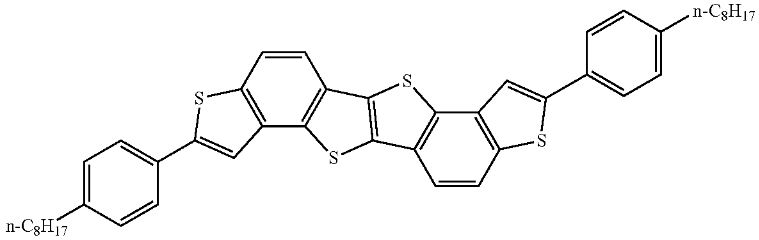
Compound J5
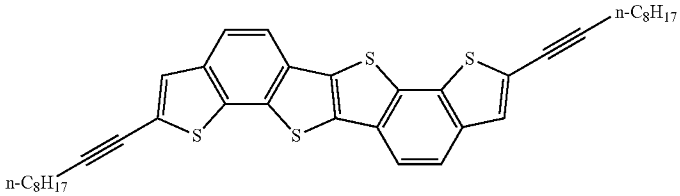
Compound K5
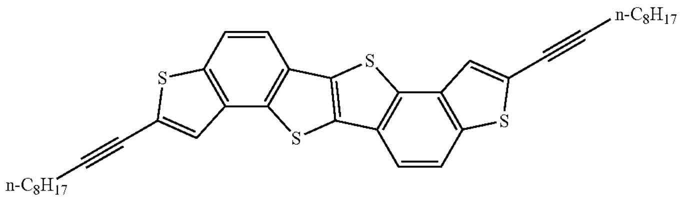
Compound J6
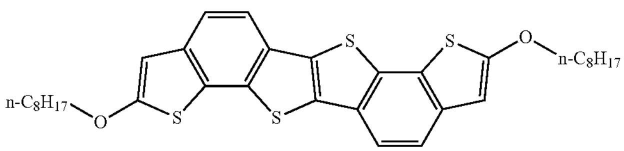
Compound K6
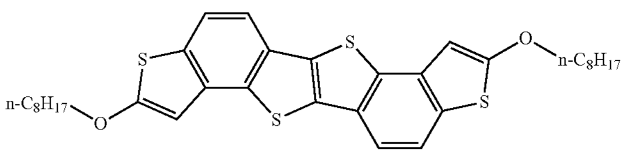
Compound J7
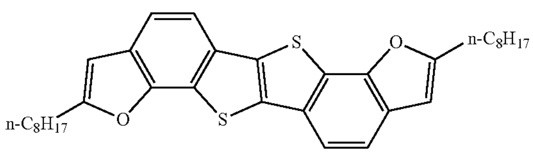
Compound K7
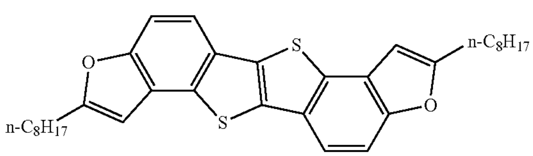
Compound J8
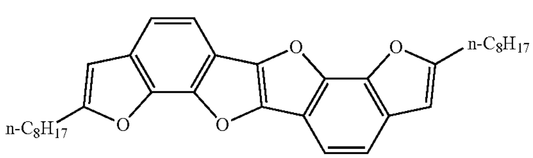
Compound K8
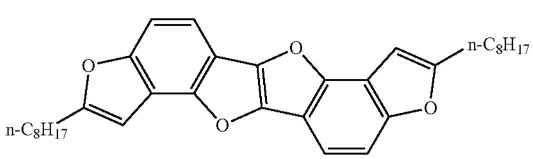

From the viewpoint of improving the solubility in a solvent, it is preferable that the upper limits of the molecular weights of the compounds J and K are respectively the same as that of the compound C represented by Formula (C). Meanwhile, from the viewpoint of stable film quality of a thin film, the lower limits of the molecular weights thereof are respectively the same as that of the compound represented by Formula (D).

Specific examples of a compound L represented by Formula (L), a compound M represented by Formula (M), a compound N represented by Formula (N), a compound P represented by Formula (P), and a compound Q represented by Formula (Q) are respectively described in order.

Compound L1

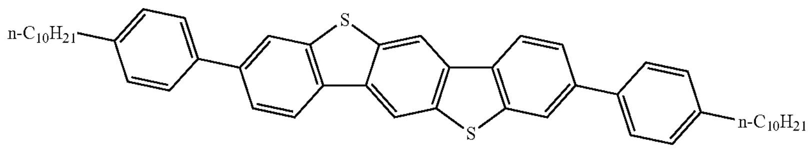

Compound L2

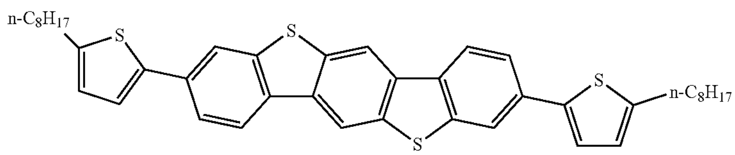

Compound L3

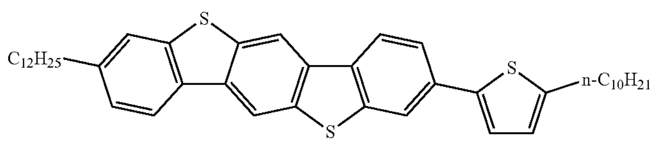

Compound L4

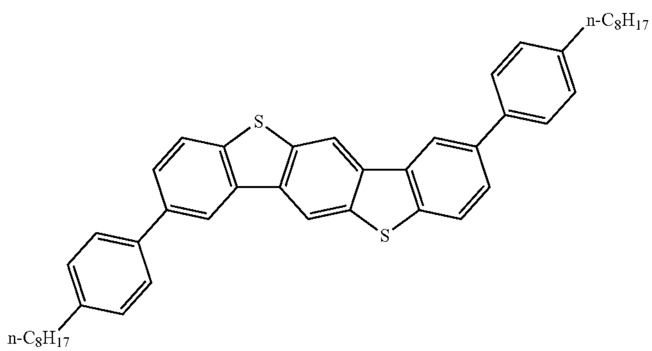

Compound L5

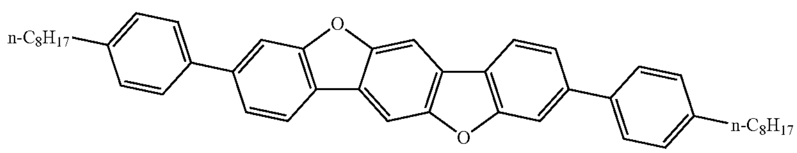

Compound L6

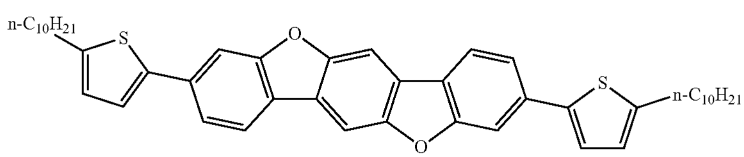

Compound L7

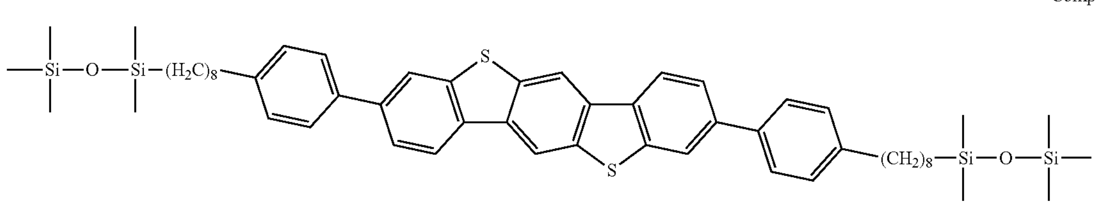

-continued
Compound L8
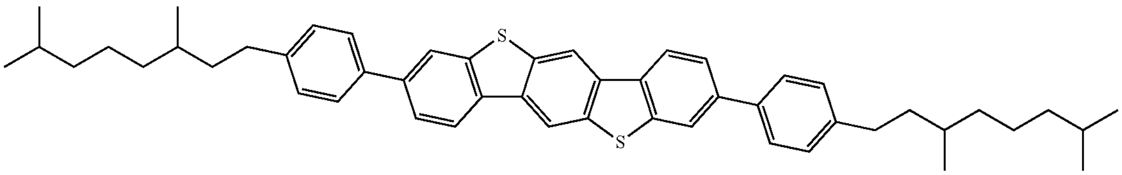
Compound L9
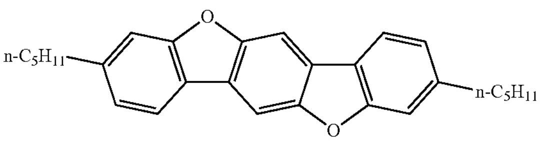
Compound L10
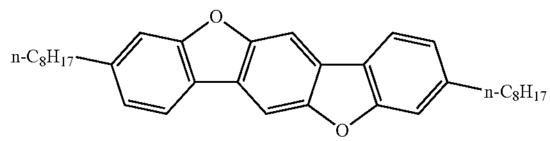
Compound L11
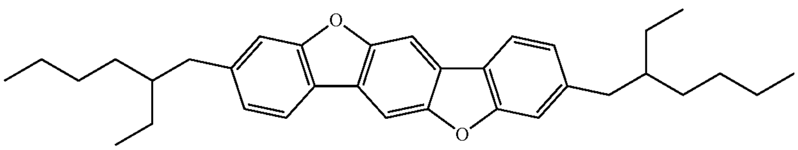
Compound L12
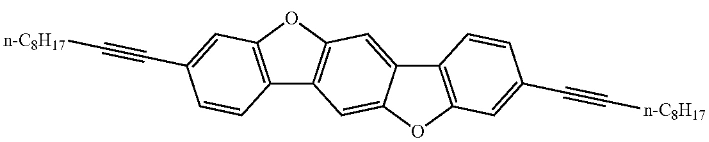
Compound L13
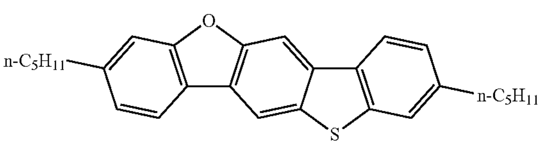
Compound L14
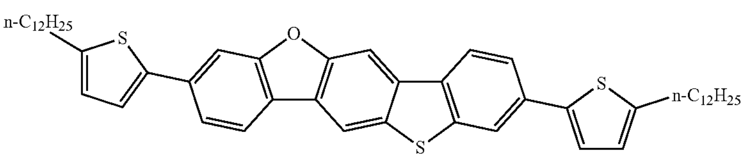
Compound L15
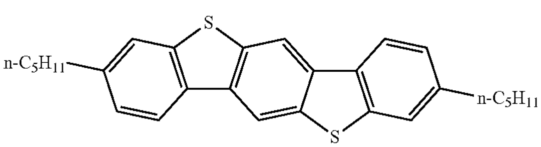
Compound M1
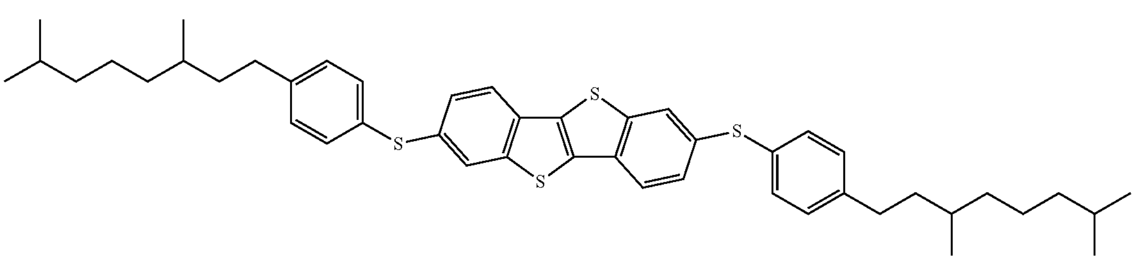
Compound M2
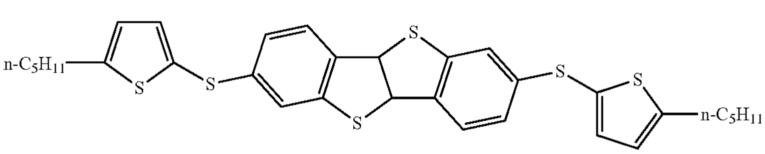

-continued
Compound M3
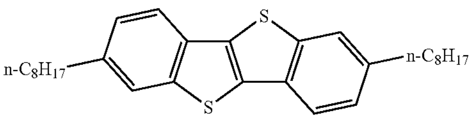
(C8BTBT)
Compound M4
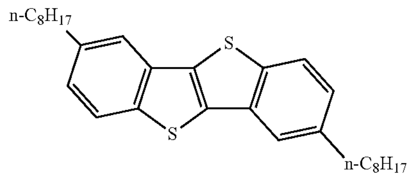
Compound M5
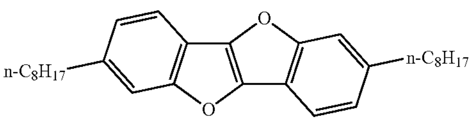
Compound M6
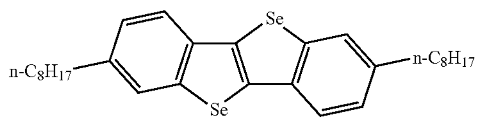
Compound M7
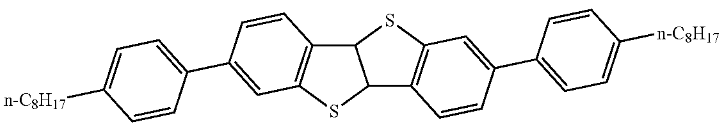
Compound M8
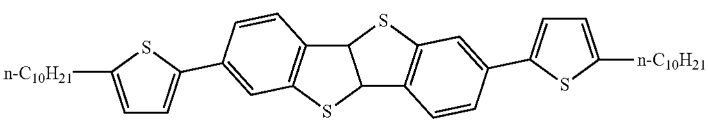
Compound N1
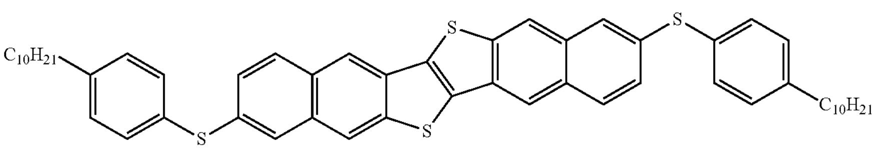
Compound N2
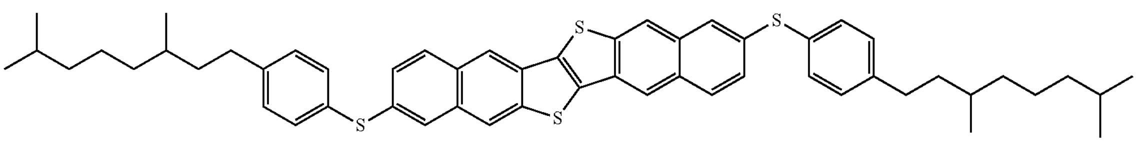
Compound N3
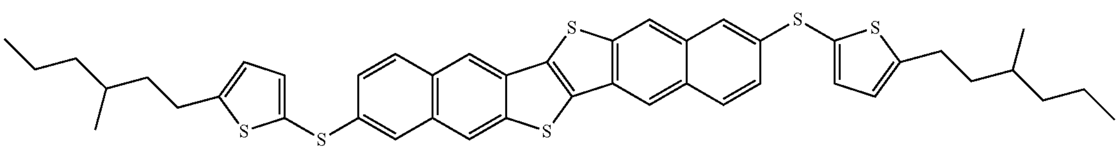
Compound N4
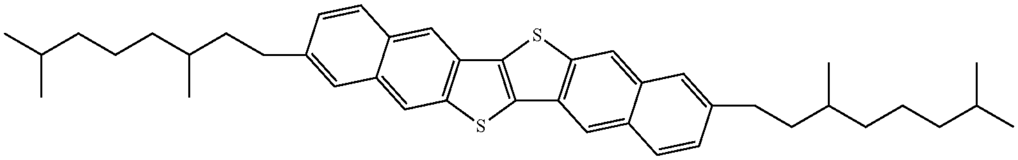
Compound N5
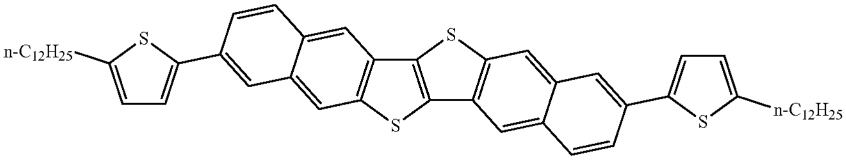
Compound N6
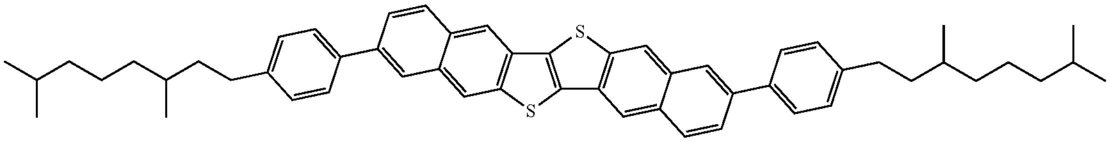

-continued
Compound N7
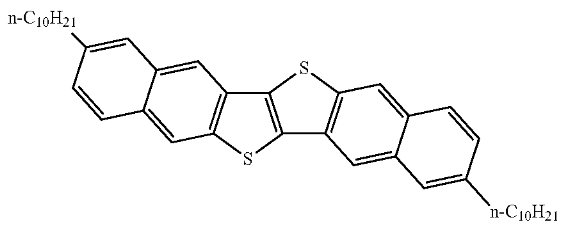
Compound P1
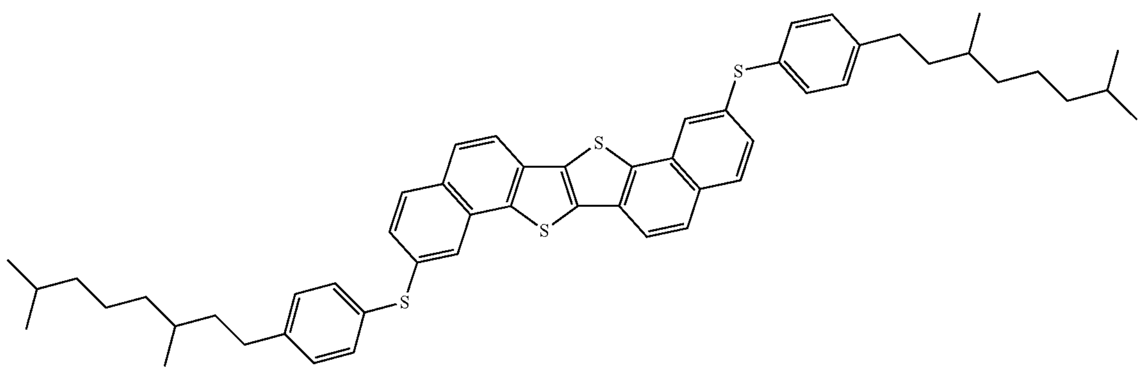
Compound P2
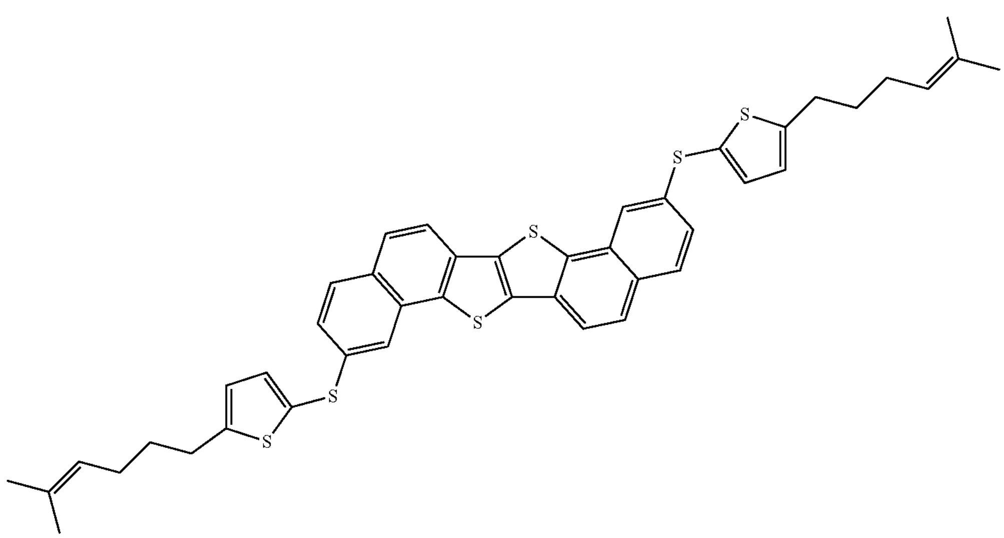

-continued
Compound P3
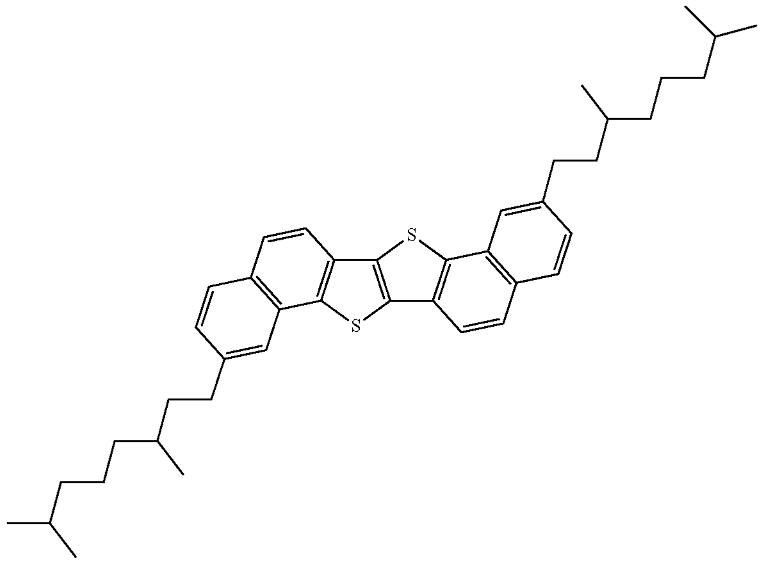
Compound P4
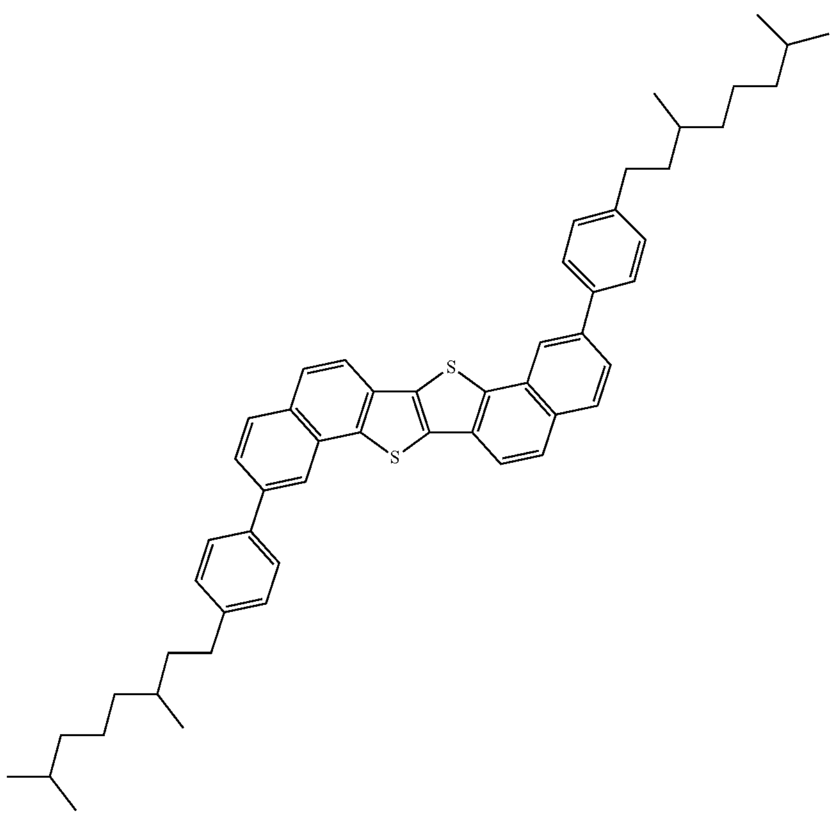

-continued
Compound P5
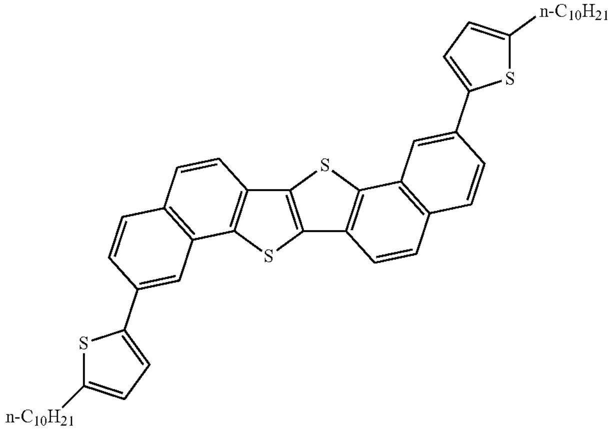
Compound P6
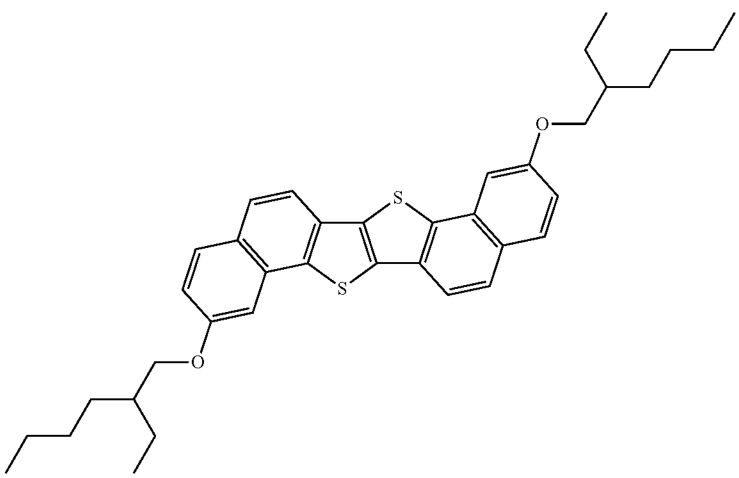
Compound Q1
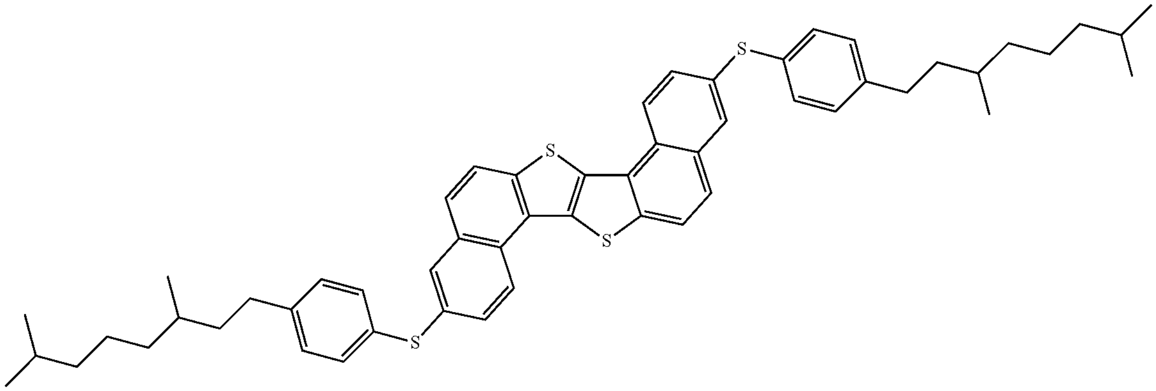

-continued
Compound Q2
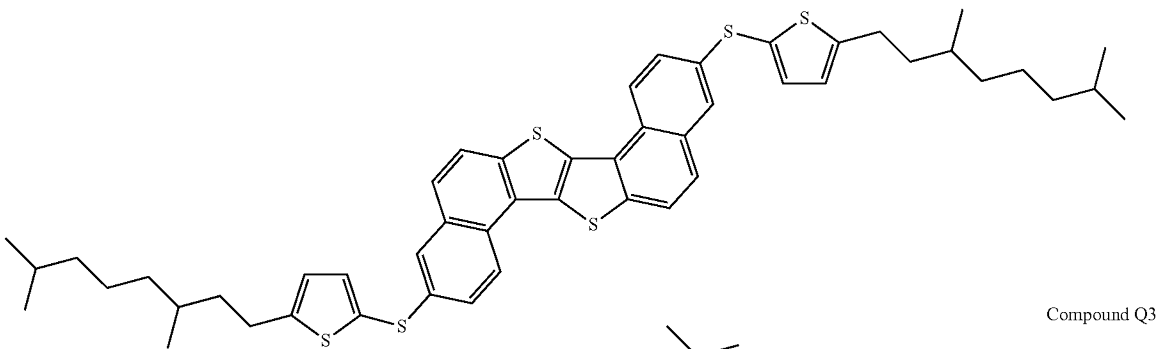
Compound Q3
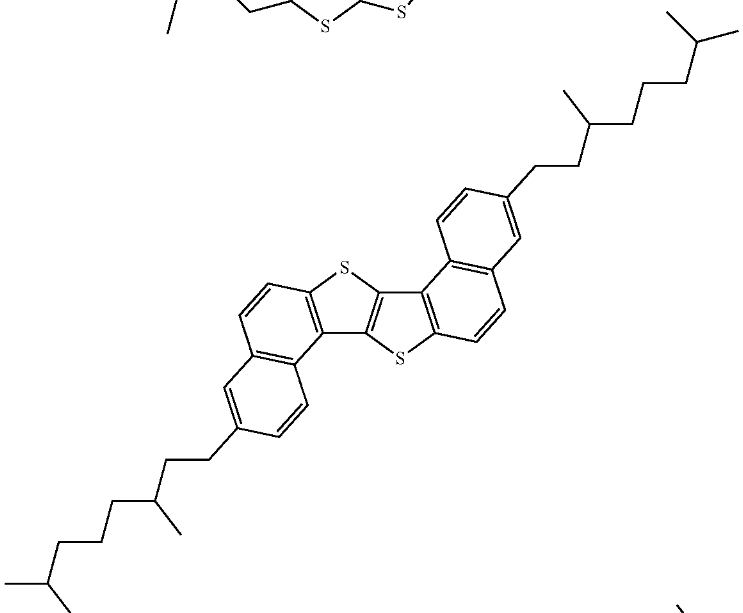
Compound Q4
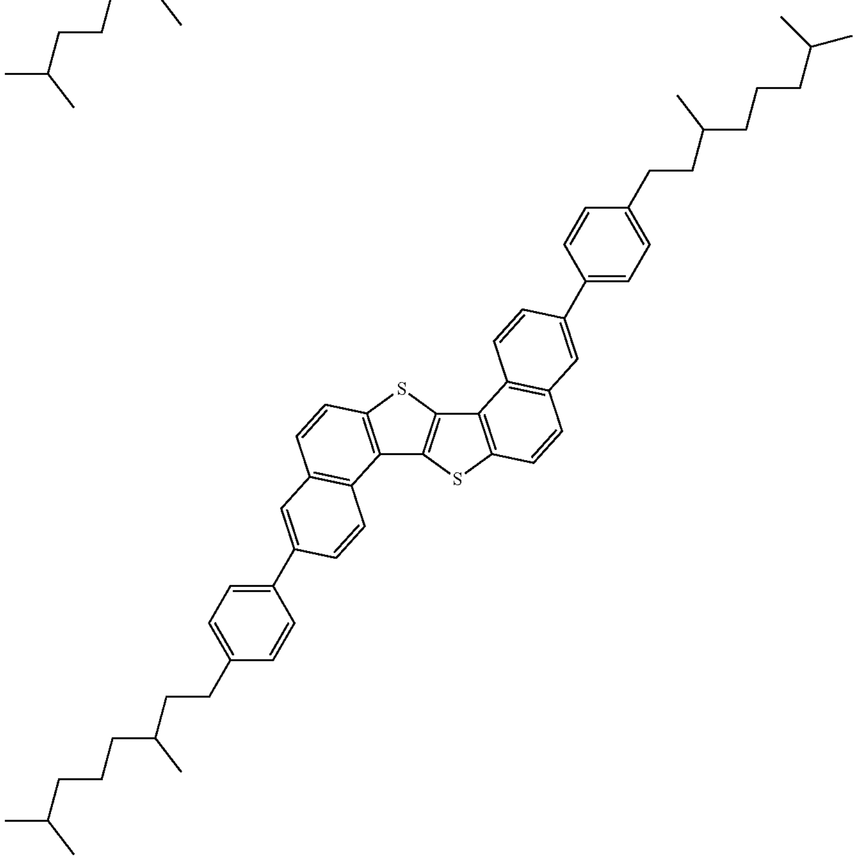

-continued

Compound Q5

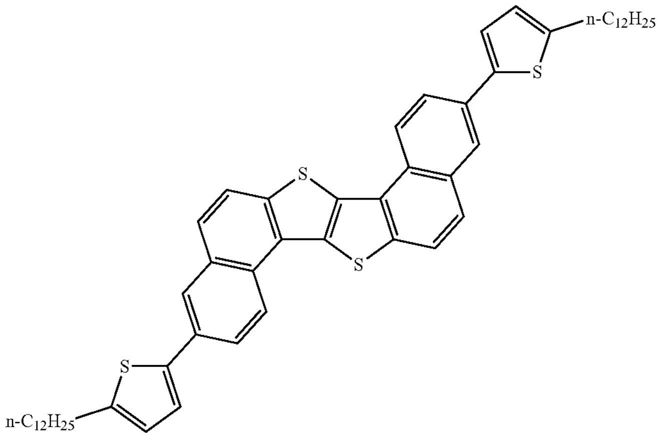

Compound Q6

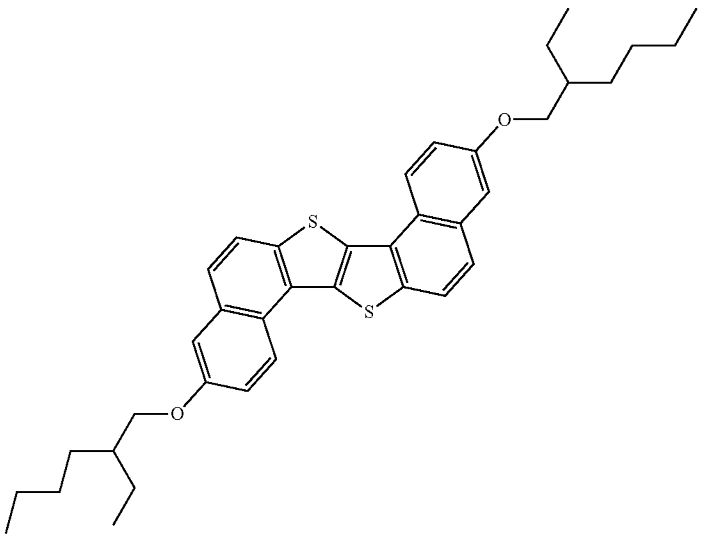

From the viewpoint of improving the solubility in a solvent, it is preferable that the upper limits of the molecular weights of the compounds L, M, N, P, and Q are respectively the same as that of the compound C represented by Formula (C). Meanwhile, from the viewpoint of stable film quality of a thin film, the lower limits of the molecular weights thereof are respectively the same as that of the compound represented by Formula (D).

Specific examples of a compound R represented by Formula (R), a compound S represented by Formula (S), and a compound T represented by Formula (T) are respectively described in order.

Compound R1

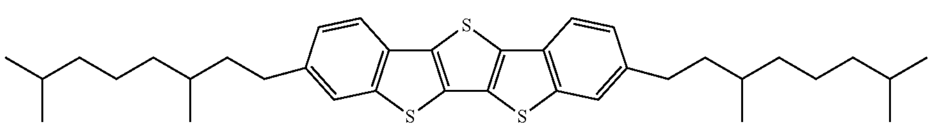

Compound R2

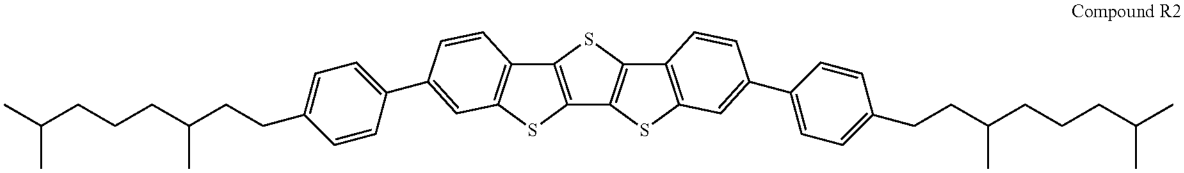

Compound R3

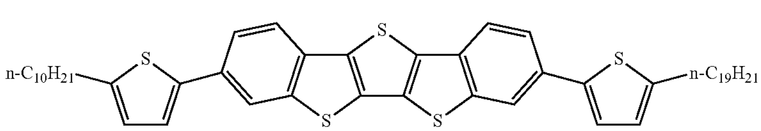

-continued
Compound R4
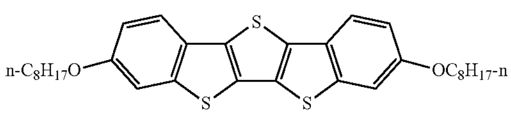
Compound S1
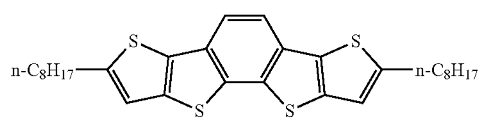
Compound S2
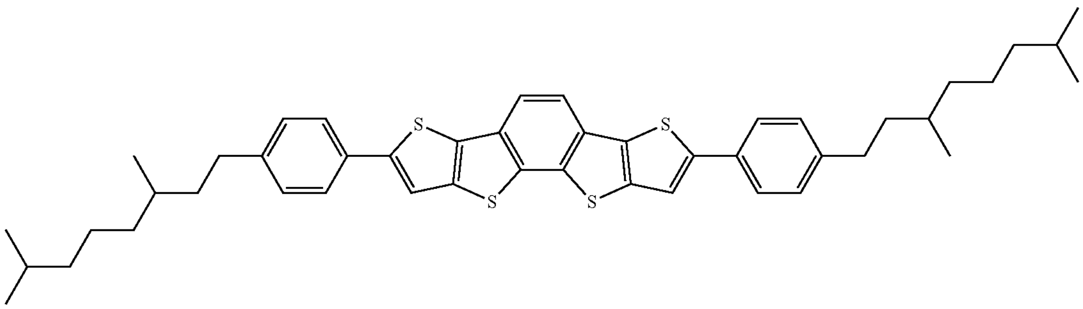
Compound S3
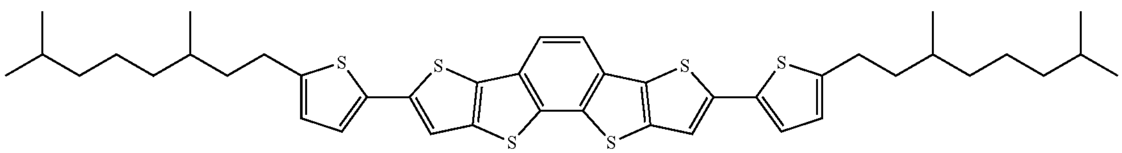
Compound S4
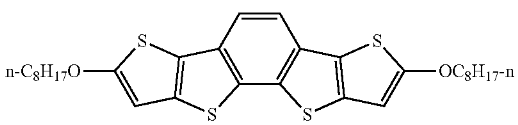
Compound T1
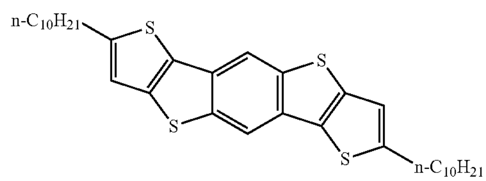
Compound T2
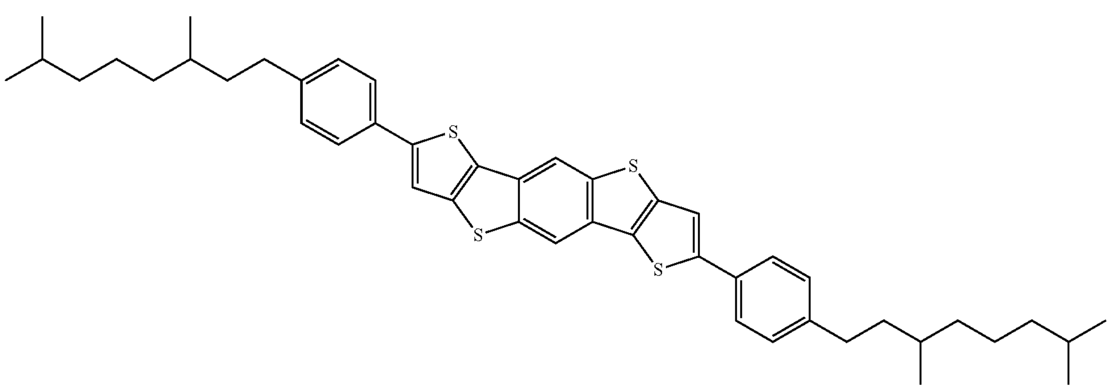
Compound T3
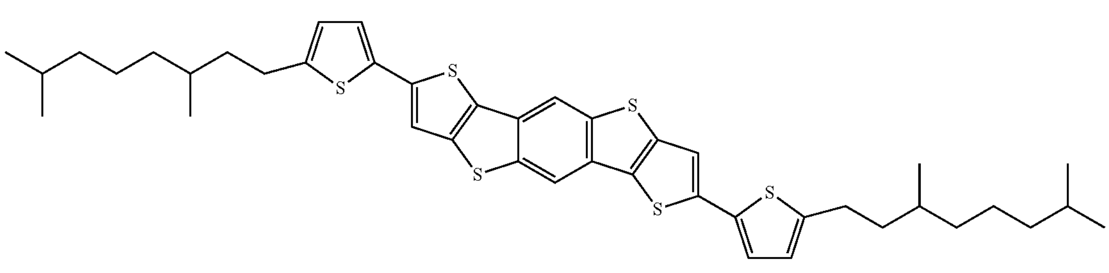

-continued

Compound T4

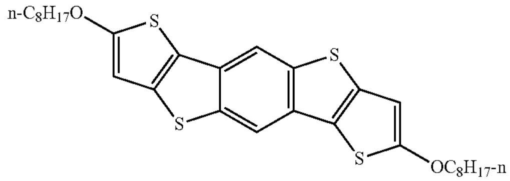

From the viewpoint of improving the solubility in a solvent, it is preferable that the upper limits of the molecular weights of the compounds R, S, and T are respectively the same as that of the compound C represented by Formula (C). Meanwhile, from the viewpoint of stable film quality of a thin film, the lower limits of the molecular weights thereof are respectively the same as that of the compound represented by Formula (D).

Examples of an organic polymer and a derivative thereof include polypyrrole and a derivative thereof, polydiketopyrrole and a derivative thereof, polythiophene and a derivative thereof, isothianaphthene such as polyisothianaphthene, thienylene vinylene such as polythienylene vinylene, poly(p-phenylenevinylene), polyaniline and a derivative thereof, polymers such as polyacetylene, polydiacetylene, polyazulene, polypyrene, polycarbazole, polyselenophene, polyfuran, poly(p-phenylene), polyindole, polypyridazine, polytellurophene, polynaphthalene, polyvinylcarbazole, polyphenylene sulfide, and polyvinylene sulfide, and a polymer of a condensed polycyclic aromatic compound.

The polythiophene and a derivative thereof are not particularly limited, and examples thereof include poly-3-hexylthiophene (P3HT) in which a hexyl group is introduced into polythiophene, polyethylene dioxythiophene, and poly(3,4-ethylenedioxythiophene)/polystyrenesulfonic acid (PEDOT/PSS).

Further, oligomers (such as oligothiophene) having repeating units which are the same as those of these polymers may also be exemplified.

Moreover, examples of the organic polymer include polymer compounds in which compounds represented by the following Formulae (C) to (T) have a repeating structure.

Examples of such polymers compound include π-conjugated polymers in which the compounds represented by Formulae (C) to (T) have a repeating structure through at least one or more arylene groups and heteroarylene groups (such as thiophene or bithiophene) and pendant type polymers in which the compounds represented by Formulae (C) to (T) are bonded to the polymer main chains through the side chains. Preferred examples of the polymer main chain include polyacrylate, polyvinyl, and polysiloxane and preferred examples of the side chain include an alkylene group and a polyethylene oxide group. In a case of the pendant type polymer, the polymer main chain may be formed by at least one of the substituents $R^C$ to $R^T$ having a group derived from a polymerizable group to be polymerized.

The weight-average molecular weight of these organic polymers is preferably 30000 or greater, more preferably 50000 or greater, and still more preferably 100000 or greater. When the weight-average molecular weight is set to be the above-described lower limit or greater, intermolecular interaction can be increased so that high mobility is obtained.

The resin (C) is a resin which has one or more groups selected from the group consisting of a group having fluorine atoms, a group having silicon atoms, an alkyl group having one or more carbon atoms or two or more carbon atoms in a case of forming an alkoxycarbonyl group, a cycloalkyl group (3 or more carbon atoms), an aralkyl group, an aryloxycarbonyl group, an aromatic ring group substituted with at least one alkyl group, and an aromatic ring group substituted with at least one cycloalkyl group, preferably in the side chain thereof.

As described above, the rein (C) is unevenly distributed or phase-separated with respect to the organic semiconductor in the organic semiconductor layer.

The resin (C) may have one (one kind) of the above-described groups. From the viewpoint that the resin (C) is easily unevenly distributed with respect to the organic semiconductor, it is preferable that the resin (C) has two or more groups described above. In addition, the total number (% by mole) of the above-described groups included in the resin (C) with respect to the number of repeating units is the same as the content of a repeating unit (α) described below.

It is preferable that the resin (C) has a repeating unit (hereinafter, also simply referred to as a repeating unit (α)) having one or more groups selected from the group described above.

The resin (C) may be a resin formed of a homopolymer having the repeating unit (α) or a resin formed of a copolymer having the repeating unit (α).

It is preferable that the groups included in the resin (C) are one or more groups selected from the group consisting of a group having fluorine atoms, a group having silicon atoms, an alkyl group having 6 or more carbon atoms, a cycloalkyl group having 5 or more carbon atoms, an aryloxycarbonyl group having 6 or more carbon atoms of an aryl group, an aralkyl group having 7 or more carbon atoms, an aromatic ring group substituted with at least one alkyl group having 3 or more carbon atoms, and an aromatic ring group substituted with at least one cycloalkyl group having 5 or more carbon atoms. As the aromatic ring group substituted with at least one alkyl group having 3 or more carbon atoms, a t-butylphenyl group or a di(t-butyl)phenyl group is more preferable.

As the groups included in the resin (C), at least one of a group having fluorine atoms or a group having silicon atoms is more preferable and a group having fluorine atoms is particularly preferable.

The group having fluorine atoms is not particularly limited, and examples thereof include an alkyl group having fluorine atoms, a cycloalkyl group having fluorine atoms, and an aryl group having fluorine atoms. These groups may further include a substituent other than a fluorine atom.

Examples of the alkyl group having fluorine atoms include a linear or branched alkyl group in which at least one hydrogen atom is substituted with a fluorine atom, and an alkyl group having preferably 1 to 10 carbon atoms and more preferably 1 to 4 fluorine atoms.

Examples of the cycloalkyl group having fluorine atoms include a monocyclic or polycyclic cycloalkyl group in which at least one hydrogen atom is substituted with a fluorine atom.

Examples of the aryl group having fluorine atoms include a group in which at least one hydrogen atom of an aryl group such as a phenyl group or a naphthyl group is substituted with a fluorine atom.

As the alkyl group having fluorine atoms, the cycloalkyl group having fluorine atoms, and the aryl group having fluorine atoms, preferably, groups represented by the following Formulae (CF2) to (CF4) may be exemplified, but the present invention is not limited thereto.

(CF2)

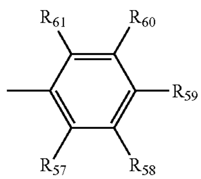

(CF3)

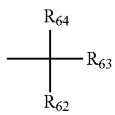

(CF4)

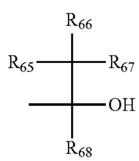

In Formulae (CF2) to (CF4), $R_{57}$ to $R_{68}$ represent a hydrogen atom, a fluorine atom, or a (linear or branched) alkyl group. In this case, at least one of $R_{57}$, . . . , or $R_{61}$, at least one of $R_{62}$, $R_{63}$, or $R_{64}$, and at least one of $R_{65}$, or $R_{68}$ represent a fluorine atom or an alkyl group (preferably having 1 to 4 carbon atoms) in which at least one hydrogen atom is substituted with a fluorine atom.

It is preferable that all of $R_{57}$ to $R_{61}$ and $R_{65}$ to $R_{67}$ represent a fluorine atom. It is preferable that $R_{62}$, $R_{63}$, $R_{64}$, and $R_{68}$ represent a fluorine atom or an alkyl group (preferably having 1 to 4 carbon atoms) in which at least one hydrogen atom is substituted with a fluorine atom and more preferable that $R_{62}$, $R_{63}$, $R_{64}$, and $R_{68}$ represent a fluorine atom or a perfluoroalkyl group having 1 to 4 carbon atoms. $R_{62}$ and $R_{63}$ may be linked to each other and form a ring.

Specific examples of the group represented by Formula (CF2) include p-fluorophenyl, pentafluorophenyl, and 3,5-di(trifluoromethyl)phenyl.

Specific examples of the group represented by Formula (CF3) include trifluoromethyl, 1,1,1-trifluoroethyl, nonafluorobutylethyl, pentafluoropropyl, pentafluoroethyl, heptafluorobutyl, hexafluoroisopropyl, heptafluoroisopropyl, hexafluoro(2-methyl)isopropyl, nonafluorobutyl, octafluoroisobutyl, nonafluorohexyl, nonafluoro-t-butyl, perfluoroisopentyl, perfluorooctyl, perfluoro(trimethyl)hexyl, 2,2,3,3-tetrafluorocyclobutyl, and perfluorocyclohexyl. Among these, 1,1,1-trifluoroethyl, nonafluorobutylethyl, hexafluoroisopropyl, heptafluoroisopropyl, hexafluoro(2-methyl)isopropyl, octafluoroisobutyl, nonafluoro-t-butyl, and perfluoroisopentyl are preferable.

Specific examples of the group represented by Formula (CF4) include $—C(CF_3)_2OH$, $—C(C_2F_5)_2OH$, $—C(CF_3)(CH_3)OH$, and $—CH(CF_3)OH$. Among these, $—C(CF_3)_2OH$ is preferable.

Among Formulae (CF2), (CF3), and (CF4), Formulae (CF2) and (CF3) are preferable.

As the group having silicon atoms, a group having at least one of an alkylsilyl structure (preferably a trialkylsilyl group) or a cyclic siloxane structure may be exemplified.

Preferred examples of the group having at least one of an alkylsilyl structure or a cyclic siloxane structure include groups represented by the following Formulae (CS-1) to (CS-3).

(CS-1)

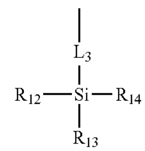

(CS-2)

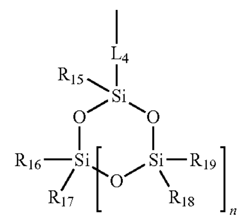

(CS-3)

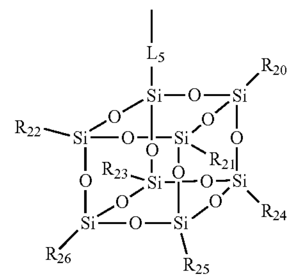

In Formulae (CS-1) to (CS-3), $R_{12}$ to $R_{26}$ represent a linear or branched alkyl group (preferably having 1 to 20 carbon atoms) or a cycloalkyl group (preferably having 3 to 20 carbon atoms).

$L_3$ to $L_5$ represent a single bond or a divalent linking group. Examples of the divalent linking group include a group or a bond formed of one or a combination (preferably having 12 or less carbon atoms) of two or more kinds selected from the group consisting of an alkylene group, a phenylene group, an ether bond, a thioether bond, a carbonyl group, an ester bond, an amide bond, a urethane bond, and a urea bond.

n represents an integer of 1 to 5. It is preferable that n represents an integer of 2 to 4.

As the alkyl group included in the resin (C), from the viewpoint of further improving hydrophobicity of the resin (C), a linear or branched alkyl having preferably 6 or more carbon atoms, more preferably 6 to 20 carbon atoms, and still more preferably 6 to 15 carbon atoms may be exemplified. In addition, the alkyl group may include a substituent (in this case, a group having fluorine atoms or a group having silicon atoms is excluded from the substituent).

As the cycloalkyl group included in the resin (C), a cycloalkyl group having preferably 5 or more carbon atoms, more preferably 6 to 20 carbon atoms, and still more preferably 6 to 15 carbon atoms may be exemplified. In addition, the cycloalkyl group may include a substituent (in this case, a group having fluorine atoms or a group having silicon atoms is excluded from the substituent).

The number of carbon atoms of the aryl group of the aryloxycarbonyl group included in the resin (C) is preferably 6 or more, more preferably in a range of 9 to 20, and still more preferably 9 to 15 from the viewpoint of further improving the hydrophobicity of the resin (C). It is preferable that examples of the aryl group are the same as those exemplified as the aryl group having fluorine atoms. The aryloxycarbonyl group may further include a substituent (in this case, a group having fluorine atoms or a group having silicon atoms is excluded from the substituent).

As the aralkyl group included in the resin (C), an aralkyl group having preferably 7 or more carbon atoms, more preferably 7 to 20 carbon atoms, and still more preferably 10 to 20 carbon atoms is preferable. In addition, the aralkyl group may further include a substituent (in this case, a group having fluorine atoms or a group having silicon atoms is excluded from the substituent).

As an aromatic ring in the aromatic ring group substituted with at least one alkyl group or the aromatic ring group substituted with at least one cycloalkyl group, an aromatic ring having preferably 6 to 20 carbon atoms and more preferably 6 to 15 carbon atoms may be exemplified. The aromatic ring group may further include a substituent (in this case, a group having fluorine atoms or a group having silicon atoms is excluded from the substituent) other than the alkyl group and the cycloalkyl group.

As the alkyl group included in the aromatic ring group, from the viewpoint of further improving the hydrophobicity of the resin (C), a linear or branched alkyl group having preferably 3 or more carbon atoms, more preferably 3 to 15 carbon atoms, and still more preferably 3 to 10 carbon atoms may be exemplified. In the aromatic ring group substituted with at least one alkyl group, it is preferable that the aromatic ring is substituted with 1 to 9 alkyl groups (preferably having 3 or more carbon atoms), more preferably the aromatic ring is substituted with 1 to 7 alkyl groups having 3 or more carbon atoms, and still more preferable that the aromatic ring is substituted with 1 to 5 carbon atoms having 3 or more carbon atoms.

As the cycloalkyl group included in the aromatic ring group, a cycloalkyl group having preferably 5 or more carbon atoms, more preferably 5 to 20 carbon atoms, and still more preferably 5 to 15 carbon atoms may be exemplified. In the aromatic ring group substituted with at least one cycloalkyl group (preferably having 5 or more carbon atoms), it is preferable that the aromatic ring is substituted with 1 to 5 cycloalkyl groups having 5 or more carbon atoms, more preferable that the aromatic ring is substituted with 1 to 4 cycloalkyl groups having 5 or more carbon atoms, and still more preferable that the aromatic ring is substituted with 1 to 3 cycloalkyl groups having 5 or more carbon atoms.

It is preferable that the resin (C) has at least one repeating unit represented by any one of the following Formulae (C-Ia) to (C-Id), as the repeating unit (α).

(C-Ia)

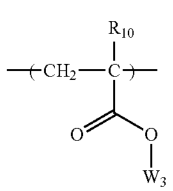

-continued (C-Ib)

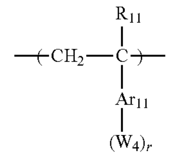

(C-Ic)

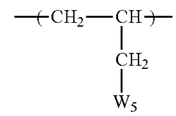

(C-Id)

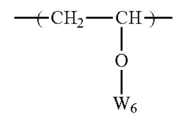

In the above-described formulae, $R_{10}$ and $R_{11}$ represent a hydrogen atom, a fluorine atom, or an alkyl group.

It is preferable that the alkyl group is a linear or branched alkyl group having 1 to 4 carbon atoms, and the alkyl group may include a substituent. As the alkyl group having a substituent, particularly a fluorinated alkyl group and preferably a perfluoroalkyl group may be exemplified. It is preferable that $R_{10}$ and $R_{11}$ represent a hydrogen atom or a methyl group.

$W_3$ represents an organic group having one or more groups selected from the group consisting of a group having fluorine atoms, a group having silicon atoms, an alkyl group having two or more carbon atoms, a cycloalkyl group, an aryl group, and an aralkyl group.

$W_4$ represents an organic group having one or more groups selected from the group consisting of a fluorine atom, a group having fluorine atoms, a group having silicon atoms, an alkyl group, and a cycloalkyl group.

$W_5$ and $W_6$ represent an organic group having one or more groups selected from the group consisting of a group having fluorine atoms, a group having silicon atoms, an alkyl group, a cycloalkyl group, an aryl group, and an aralkyl group.

Further, each of $W_3$ to $W_6$ may include a group represented by —COO—. In this case, it is preferable that each of $W_3$ to $W_6$ includes one group represented by —COO— most.

$Ar_{11}$ represents an (r+1) valent aromatic ring group.

As the (r+1) valent aromatic ring group $Ar_{11}$, a divalent aromatic ring group in a case where r represents 1 may include a substituent, and examples of the substituent include an arylene group having 6 to 18 carbon atoms such as phenylene, tolylene, naphthylene, or anthracenylene.

Preferred specific examples of the (r+1) valent aromatic ring group in a case where r represents an integer of 2 or greater may include groups formed by excluding optional (r−1) hydrogen atoms from the specific examples of the divalent aromatic ring group described above.

r represents an integer of 1 to 10.

Examples of the group having fluorine atoms as $W_3$ to $W_6$ are the same as those exemplified as the group having fluorine atoms described above.

The group having fluorine atoms as $W_3$ to $W_6$ may be bonded to a repeating unit represented by any one of Formulae (C-Ia) to (C-Id) through a group or a group formed by combining two or more kinds selected from the group consisting of —COO—, $Ar_{11}$, —$CH_2$— or —O—, an alkylene group, a phenylene group, an ether bond, a thioether bond, a carbonyl group, an ester bond, an amide bond, a urethane bond, and a ureylene bond.

Examples of the group having silicon atoms as $W_3$ to $W_6$ are the same as those exemplified as the group having silicon atoms described above.

Examples of the alkyl group having 2 or more carbon atoms as $W_3$ are the same as those exemplified as the alkyl group included in the resin (C) and having 2 or more carbon atoms, and specific examples thereof and preferable ranges thereof are also the same as those. From the viewpoint of further improving the hydrophobicity of the resin (C), the alkyl group as $W_5$ and $W_6$ has preferably 6 or more carbon atoms.

The cycloalkyl group as $W_3$, $W_5$, and $W_6$ have the same definition as that for the cycloalkyl group included in the resin (C) and the specific examples and preferred examples thereof are also the same as those.

Examples of the alkyl group and the aralkyl group as $W_3$, $W_5$, and $W_6$ are respectively the same as those exemplified as the alkyl group and the aralkyl group of the aryloxycarbonyl group included in the resin (C), and specific examples and preferable examples thereof are also the same as those.

Examples of the alkyl group and the cycloalkyl group as $W_4$ are respectively the same as those exemplified as the alkyl group in the aromatic ring group substituted with at least one alkyl group and the cycloalkyl group in the aromatic ring group substituted with at least one cycloalkyl group described above.

As $W_3$, $W_5$, and $W_6$, an organic group having fluorine atoms, an organic group having silicon atoms, an alkyl group having 6 or more carbon atoms, a cycloalkyl group having 5 or more carbon atoms, an aryl group having 6 or more carbon atoms, or an aralkyl group having 7 or more carbon atoms is preferable, an organic group having fluorine atoms, an organic group having silicon atoms, an alkyl group having 6 or more carbon atoms, a cycloalkyl group having 6 or more carbon atoms, an aryl group having 9 or more carbon atoms, or an aralkyl group having 10 or more carbon atoms is more preferable, and an organic group having fluorine atoms or an organic group having silicon atoms is still more preferable.

As W4, a fluorine atom, an organic group having fluorine atoms, an organic group having silicon atoms, an alkyl group having 3 or more carbon atoms, or a cycloalkyl group having 5 or more carbon atoms is preferable, a fluorine atom, an organic group having fluorine atoms, an organic group having silicon atoms, an alkyl group having 3 or more carbon atoms, or a cycloalkyl group having 5 or more carbon atoms is more preferable, a fluorine atom, an organic group having fluorine atoms, or an organic group having silicon atoms is still more preferable.

Hereinafter, specific examples of the repeating unit represented by any one of Formulae (C-Ia) to (C-Id) will be described, but the present invention is not limited thereto.

In the specific examples, $X_1$ represent a hydrogen atom, —$CH_3$, —F, or —$CF_3$.

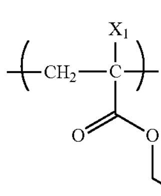
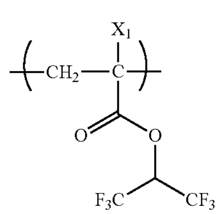

-continued

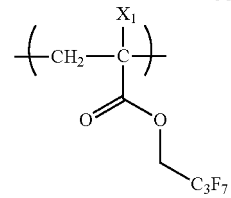
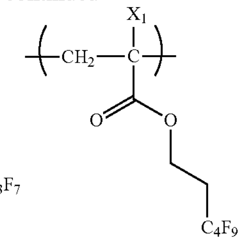
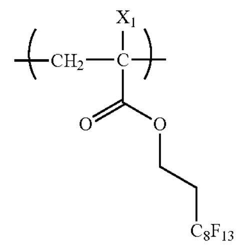
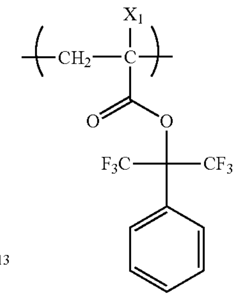
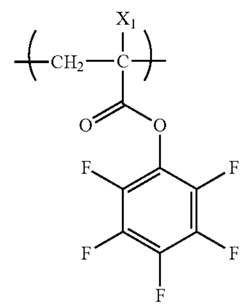
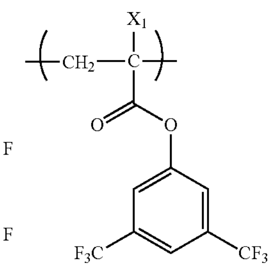
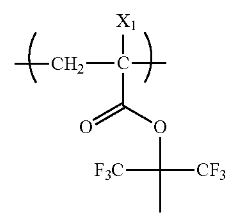
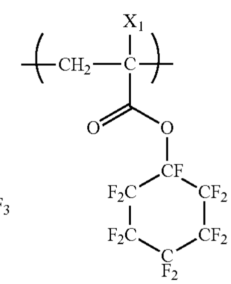
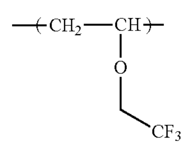
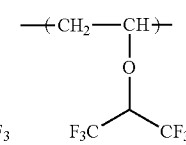
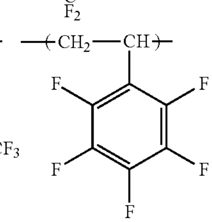
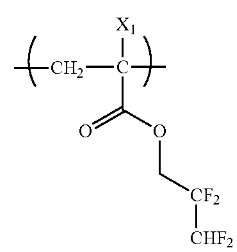
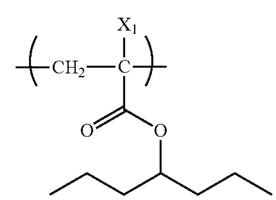
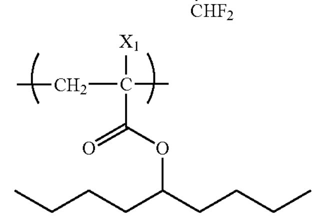

-continued
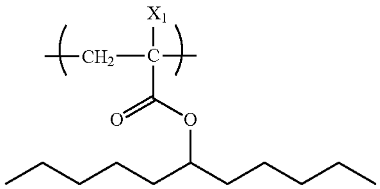
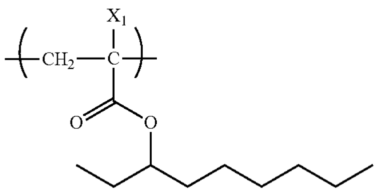
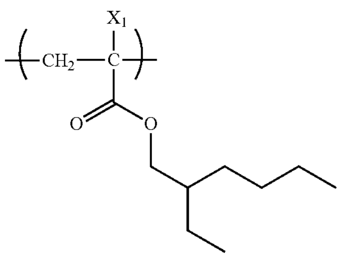
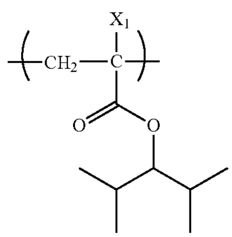
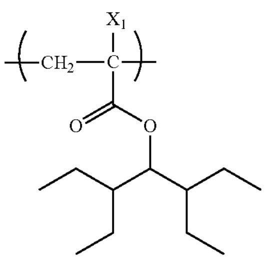
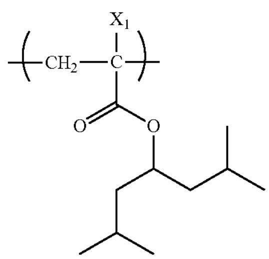
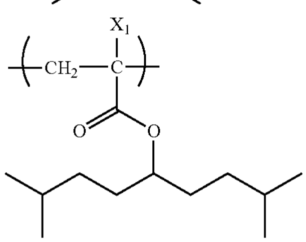
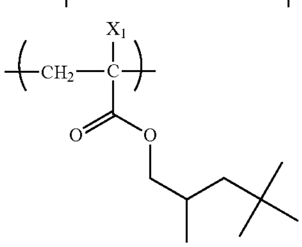
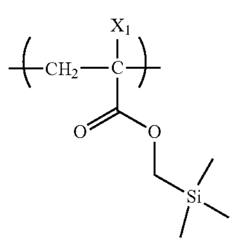
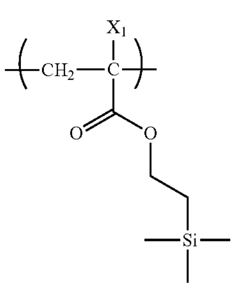
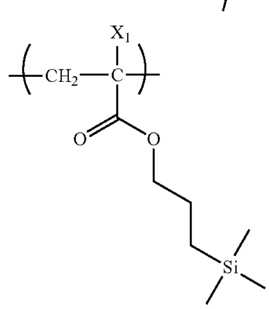
-continued
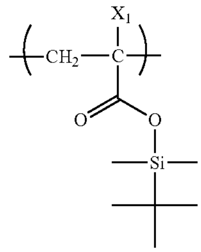
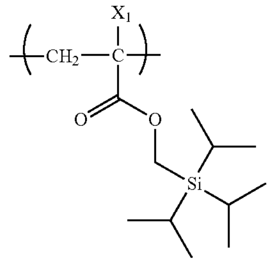
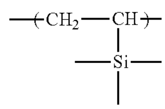
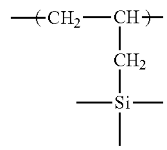
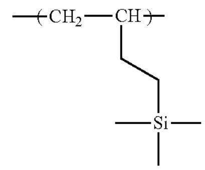
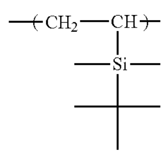
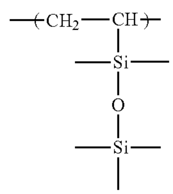
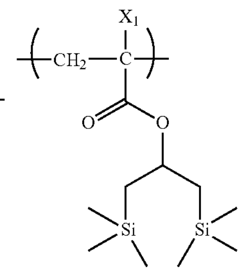
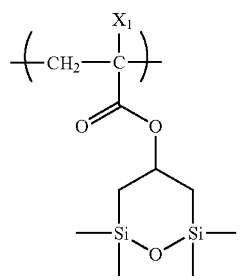
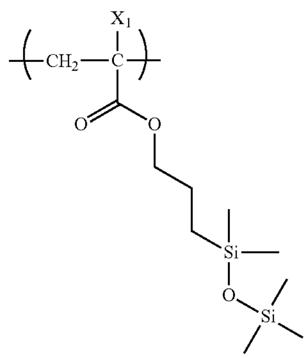
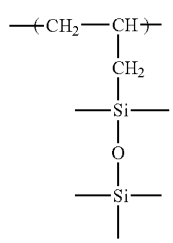
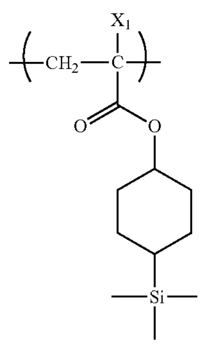
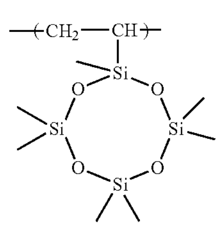
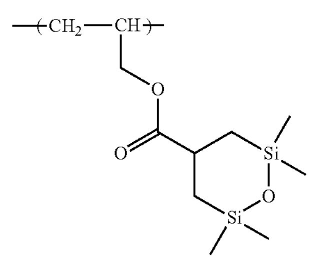

-continued

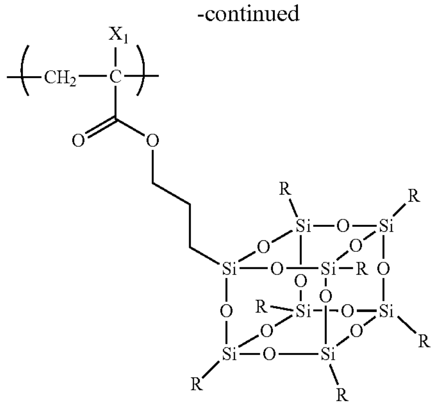

$R = CH_3, C_2H_5, C_3H_7, C_4H_9$

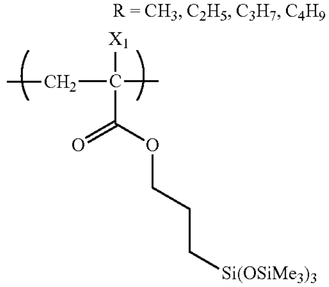

The content of the repeating unit (α) is preferably in a range of 5% by mole to 100% by mole, more preferably in a range of 10% by mole to 90% by mole, and still more preferably in a range of 10% by mole to 80% by mole with respect to all repeating units in the resin (C).

It is preferable that the resin (C) includes an aromatic ring group and more preferable that the resin (C) includes a repeating unit having an aromatic ring group.

In this case, the repeating unit (α) may include an aromatic ring group. Alternatively, the resin (C) may further include a repeating unit in addition to the repeating unit (α) and the repeating unit may include an aromatic ring group at the same time.

It is preferable that the repeating unit (α) in the case where the repeating unit (α) includes an aromatic ring group is a repeating unit represented by the following Formula (C-II).

(C-II)

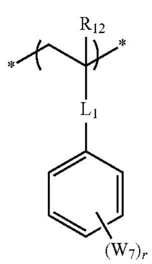

In the above-described formula, $R_{12}$ represents a hydrogen atom, a methyl group, a trifluoromethyl group, or a fluorine atom. $W_7$ represents an organic group having one or more kinds selected from the group consisting of a group having fluorine atoms, a group having silicon atoms, an alkyl group, and a cycloalkyl group.

$L_1$ represents a single bond or a —$COOL_2$- group. $L_2$ represents a single bond or an alkylene group.

r represents an integer of 1 to 5.

Examples of the group having fluorine atoms and the group having silicon atoms as $W_7$ are respectively the same as those exemplified as the group having fluorine atoms and the group having silicon atoms.

Examples of the alkyl group and the cycloalkyl group as $W_7$ are respectively the same as those exemplified as the alkyl group in the aromatic ring group substituted with at least one alkyl group and the cycloalkyl group in the aromatic ring group substituted with at least one cycloalkyl group described above.

It is preferable that $W_7$ represents a trialkylsilyl group, a trialkoxysilyl group, an alkyl group having a trialkylsilyl group, an alkyl group having a trialkoxysilyl group, an alkyl group having 3 or more carbon atoms, or a cycloalkyl group having 5 or more carbon atoms.

In the trialkylsilyl group, the trialkoxysilyl group, the alkyl group having a trialkylsilyl group, and the alkyl group having a trialkoxysilyl group as $W_7$, the carbon atoms of the alkyl group or the alkoxy group bonded to a silicon atom is preferably in a range of 1 to 5 and more preferably in a range of 1 to 3.

Moreover, in the alkyl group having a trialkylsilyl group and the alkyl group having a trialkoxysilyl group as $W_7$, the number of carbon atoms of the alkyl group bonded to the trialkylsilyl group or the trialkoxysilyl group is preferably in a range of 1 to 5 and more preferably in a range of 1 to 3.

It is preferable that $R_{12}$ represents a hydrogen atom or a methyl group.

It is preferable that the alkylene group as $L_2$ is an alkylene group having 1 to 5 carbon atoms and more preferable that the alkylene group as $L_2$ is an alkylene group having 1 to 3 carbon atoms. It is preferable that L2 represents a single bond.

It is preferable that $W_7$ represents an organic group having fluorine atoms, an organic group having silicon atoms, an alkyl group having 3 or more carbon atoms, or a cycloalkyl group having 5 or more carbon atoms, particularly preferable that $W_7$ represents an alkyl group having 3 or more carbon atoms, and more preferable that $W_7$ represents a t-butyl group.

Hereinafter, specific examples of the repeating unit represented by Formula (C-II) other than those described above will be described, but the present invention is not limited thereto.

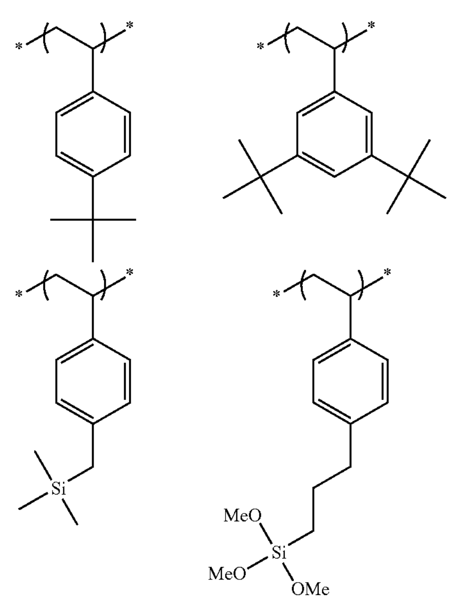

-continued

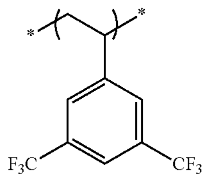
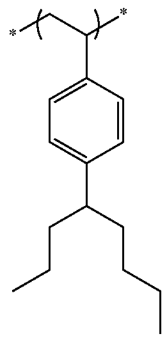
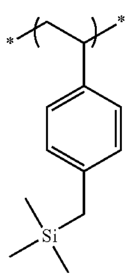
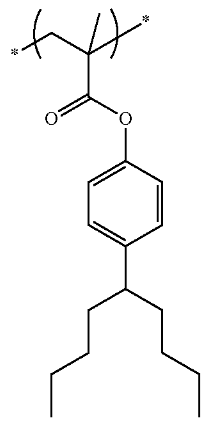
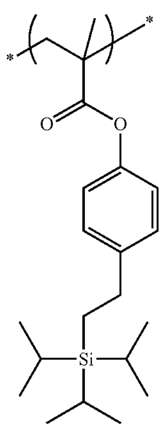
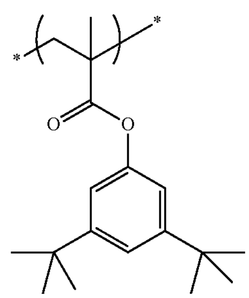
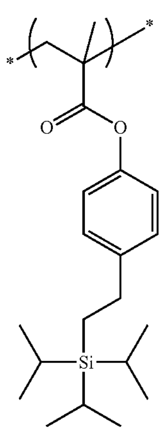
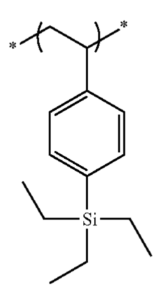

-continued

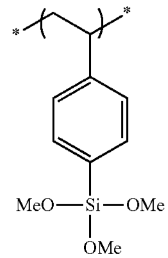
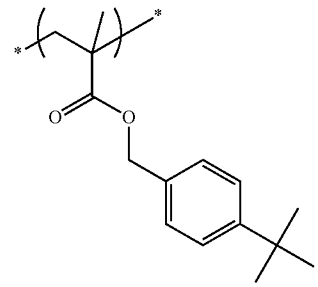
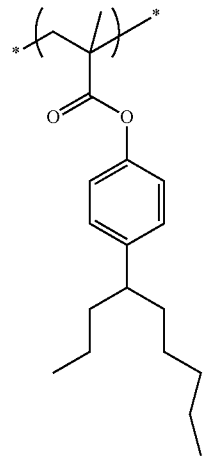
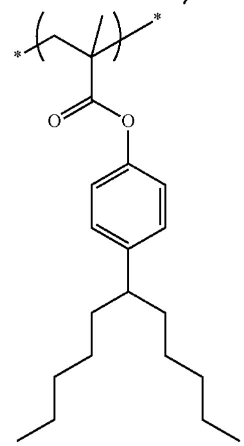

In a case where the resin (C) has a repeating unit represented by Formula (C-II), the content of the repeating unit represented by Formula (C-II) is preferably in a range of 1% by mole to 100% by mole, more preferably in a range of 3% by mole to 80% by mole, and still more preferably in a range of 5% by mole to 75% by mole with respect to all repeating units in the resin (C).

Further, other than those described above, a repeating unit represented by the following Formula (II) is also preferable as the repeating unit having an aromatic ring group.

(II)

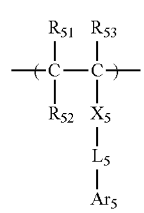

In the formula, $R_{51}$, $R_{52}$, and $R_{53}$ represent a hydrogen atom, an alkyl group, a cycloalkyl group, a halogen atom, a cyano group, or an alkoxycarbonyl group. $R_{52}$ may be bonded to $Ar_5$ and form a ring and $R_{52}$ in this case represents a single bond or an alkylene group.

$X_5$ represents a single bond, —COO—, or —CONR$_{64}$—, and $R_{64}$ represents a hydrogen atom or an alkyl group.

$L_5$ represents a single bond or an alkylene group.

$Ar_5$ represents a monovalent aromatic ring group. In a case where $Ar_5$ is bonded to $R_{52}$ to form a ring, $Ar_5$ represents a divalent aromatic ring group.

Examples of the alkyl group included in the alkyl group and the alkoxycarbonyl group as $R_{51}$, $R_{52}$, and $R_{53}$ include an alkyl group having 20 or less carbon atoms such as methyl, ethyl, propyl, isopropyl, n-butyl, sec-butyl, hexyl, 2-ethylhexyl, octyl, or dodecyl which may preferably have a substituent. Further, an alkyl group having 8 or less carbon atoms is more preferable and an alkyl group having 3 or less carbon atoms is particularly preferable.

The cycloalkyl group as $R_{51}$, $R_{52}$, and $R_{53}$ may be monocyclic or polycyclic. Preferred examples thereof include a monocyclic cycloalkyl group having 3 to 10 carbon atoms such as cyclopropyl, cyclopentyl, or cyclohexyl which may preferably have a substituent.

Examples of the halogen atom as $R_{51}$, $R_{52}$, and $R_{53}$ include a fluorine atom, a chlorine atom, a bromine atom, and an iodine atom. Among these, a fluorine atom is particularly preferable.

The monovalent aromatic ring group as Ar5 may include a substituent, and examples thereof include an arylene group having 6 to 18 carbon atoms such as phenyl, tolyl, naphthyl, or anthracenyl. Further, preferred examples thereof include an aromatic ring group having a heteroring such as thiophene, furan, pyrrole, benzothiophene, benzofuran, benzopyrrole, triazine, imidazole, benzimidazole, triazole, thiadiazole, or thiazole. Among these, a phenyl group, a naphthyl group, and a biphenyl group are particularly preferable. Preferred specific examples of the divalent aromatic ring group include groups formed by excluding optional one hydrogen atom from the specific examples of the monovalent aromatic ring group described above.

Examples of the substituent included in the alkyl group, the cycloalkyl group, the alkoxycarbonyl group, the alkylene group, and the monovalent aromatic ring group described above include the alkyl group exemplified as $R_{51}$; an alkoxy group such as methoxy, ethoxy, hydroxyethoxy, propoxy, hydroxypropoxy, or butoxy; and an aryl group such as phenyl.

Examples of the alkyl group as $R_{64}$ in —CONR$_{64}$— ($R_{64}$ represents a hydrogen atom or an alkyl group) represented by $X_5$ are the same as those of the alkyl group as $R_{51}$ to $R_{53}$. It is preferable that $X_5$ represents a single bond, —COO—, or —CONH— and more preferable that $X_5$ represents a single bond or —COO—.

Examples of the alkylene group as $L_5$ include a group having 1 to 8 carbon atoms such as methylene, ethylene, propylene, butylene, hexylene, or octylene which may preferably have a substituent.

Hereinafter, specific examples of the repeating unit represented by Formula (II) will be described, but the present invention is not limited thereto.

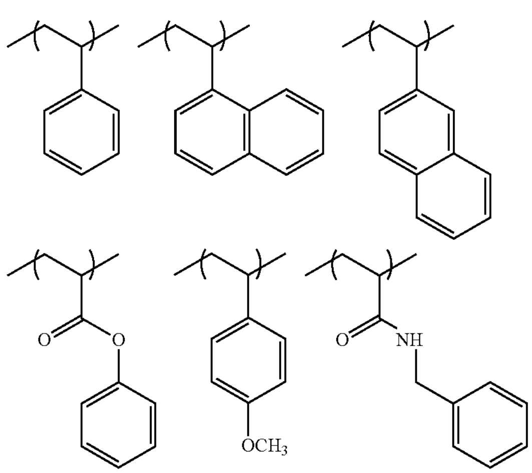

-continued

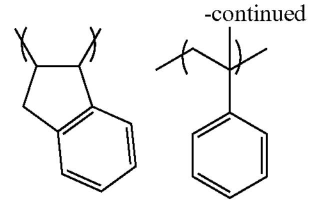

The resin (C) may or may not include a repeating unit represented by Formula (II). In the case where the resin (C) includes a repeating unit represented by Formula (II), the content of the repeating unit represented by Formula (II) is preferably in a range of 1% by mole to 80% by mole, more preferably in a range of 1% by mole to 70% by mole, and still more preferably in a range of 1% by mole to 50% by mole with respect to all repeating units in the resin (C).

<Repeating Unit (β) or (γ)>

The resin (C) may include at least one of a repeating component (hereinafter, also referred to as a "repeating unit (β)"), including a group that has at least one of a fluorine atom or a silicon atom and at least one lactone ring, or at least one repeating unit (hereinafter, also referred to as a "repeating unit (γ)") derived from a monomer represented by the following Formula (aa1-1).

(Repeating Unit (β))

As the lactone ring structure contained in the repeating unit (β), a group having a lactone structure represented by any one of the following Formulae (LC1-1) to (LC1-17) is more preferable. Further, the group having a lactone structure may be directed bonded to the main chain thereof. Preferred lactone structures, (LC1-1), (LC1-4), (LC1-5), (LC1-6), (LC1-13), (LC1-14), and (LC1-17) may be exemplified.

LC1-1

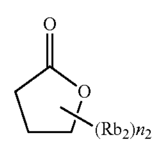

LC1-2

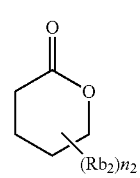

LC1-3

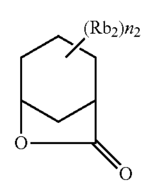

LC1-4

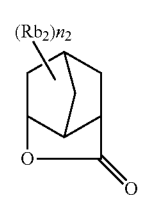

-continued

LC1-5

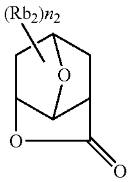

LC1-6

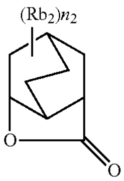

LC1-7

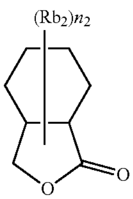

LC1-8

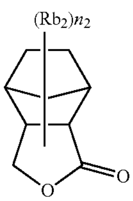

LC1-9

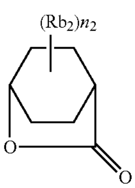

LC1-10

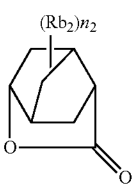

LC1-11

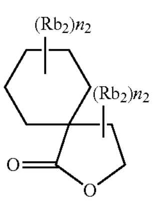

LC1-12

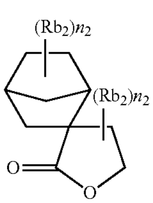

-continued

LC1-13

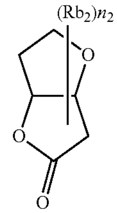

LC1-14

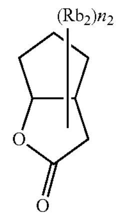

LC1-15

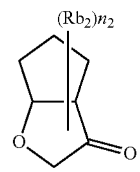

LC1-16

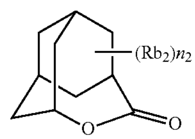

LC1-17

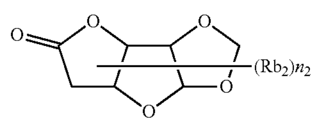

The portion of the lactone structure may or may not have a substituent $Rb_2$. Preferred examples of the substituent $Rb_2$ include an alkyl group having 1 to 8 carbon atoms, a monovalent cycloalkyl group having 4 to 7 carbon atoms, an alkoxy group having 1 to 8 carbon atoms, an alkoxycarbonyl group having 2 to 8 carbon atoms, an aryloxycarbonyl group having 6 to 10 carbon atoms, a carboxyl group, a halogen atom, a hydroxyl group, and a cyano group. Among these, an alkyl group having 1 to 4 carbon atoms, a cyano group, an alkoxycarbonyl group having 2 to 8 carbon atoms, or an aryloxycarbonyl group having 7 to 13 carbon atoms is more preferable, a cyano group, an alkyl group in which at least one hydrogen atom is substituted with a fluorine atom or a silicon atom, an alkoxycarbonyl group, or an aryloxycarbonyl group is still more preferable, and a cyano group, an alkyl group in which at least one hydrogen atom is substituted with a fluorine atom, an alkoxycarbonyl group, or an aryloxycarbonyl group.

$n_2$ represent s an integer of 0 to 4. When $n_2$ represents 2 or greater, a plurality of substituents $(Rb_2)$'s may be the same as or different from each other or the plurality of substituents $(Rb_2)$'s may be bonded to each other and form a ring.

Optical isomers are typically present in the repeating unit having a lactone group, and any optical isomer may be used. Further, one optical isomer may be used alone or plural optical isomers may be used in combination. In the case where one optical isomer is mainly used, an optical isomer having an optical purity (ee) of 90% or greater is preferable and an optical isomer having an optical purity of 95% or greater is more preferable.

The repeating unit (β) is not limited as long as the repeating unit is polymerized through addition polymerization, condensation polymerization, or addition condensation, and it is preferable that the repeating unit (β) has a carbon-carbon double bond and is polymerized through addition polymerization using this double bond. Examples thereof include an acrylate-based repeating unit (including a system which has a substituent at an α-position or a β-position), a styrene-based repeating unit (including a system which has a substituent at an α-position or a β-position), a vinyl ether-based repeating unit, a norbornene-based repeating unit, and a repeating unit of a maleic acid derivative (such as a maleic anhydride or its derivative maleimide). Among these, an acrylate-based repeating unit, a styrene-based repeating unit, a vinyl ether-based repeating unit, or a norbornene-based repeating unit is preferable, an acrylate-based repeating unit, a vinyl ether-based repeating unit, or a norbornene-based repeating unit is more preferable, and an acrylate-based repeating unit is particularly preferable.

Hereinafter, specific examples of the repeating unit (β) will be described, but the present invention is not limited thereto. Ra represents a hydrogen atom, a fluorine atom, methyl, or trifluoromethyl.

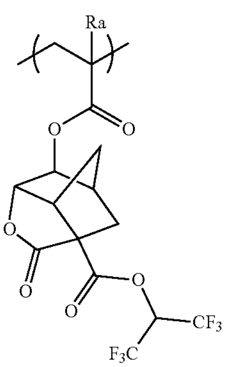
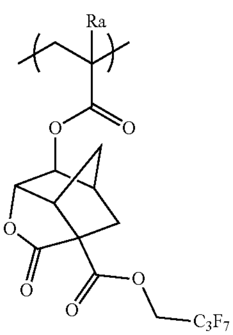
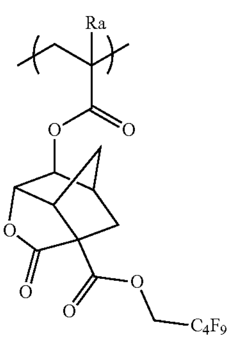
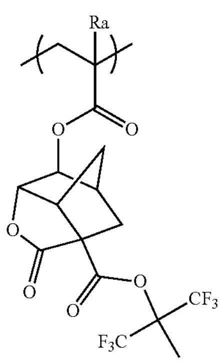
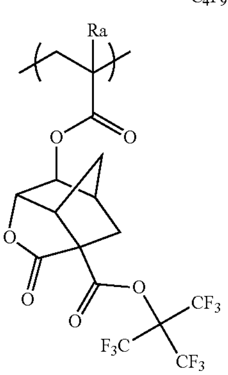
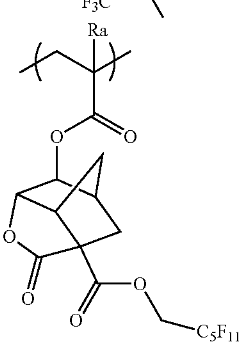

-continued

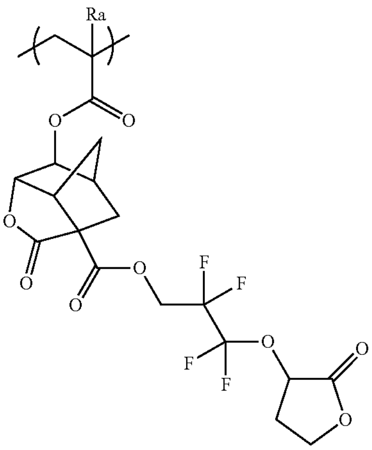
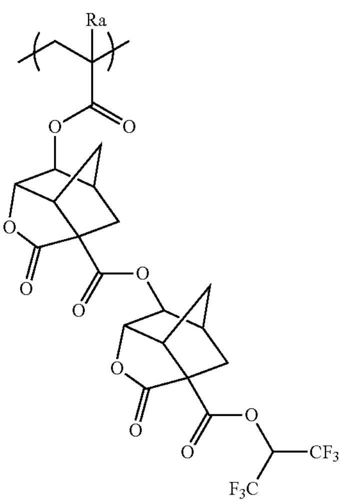
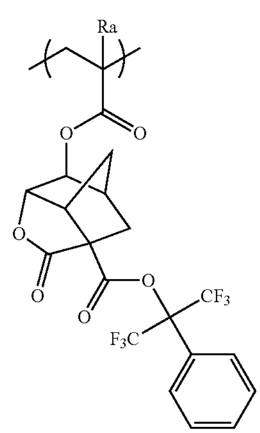
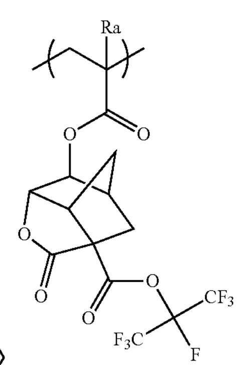

-continued
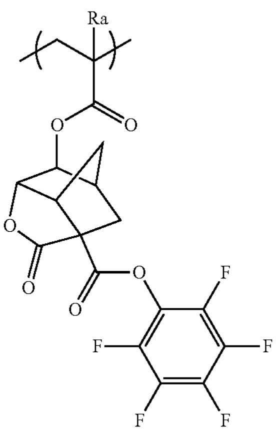
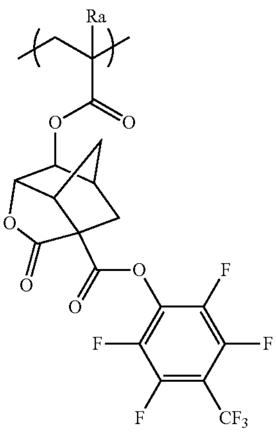
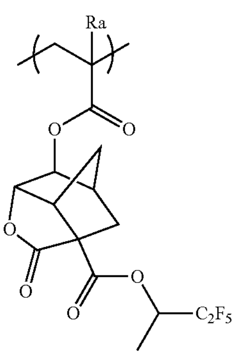
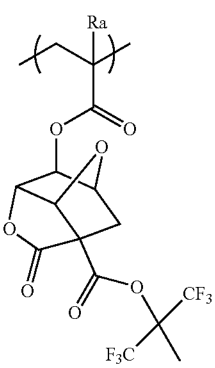
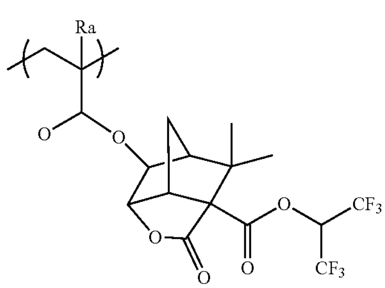
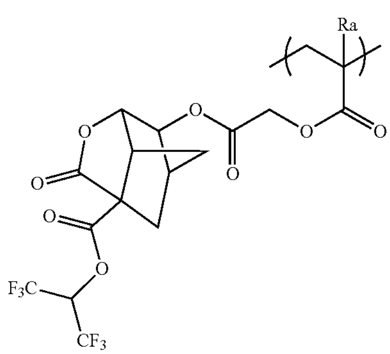
-continued
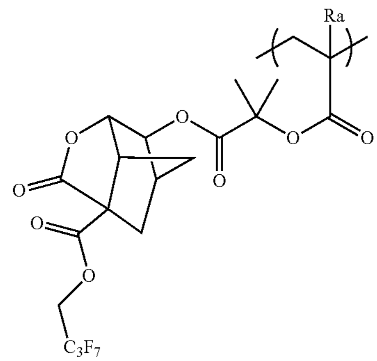
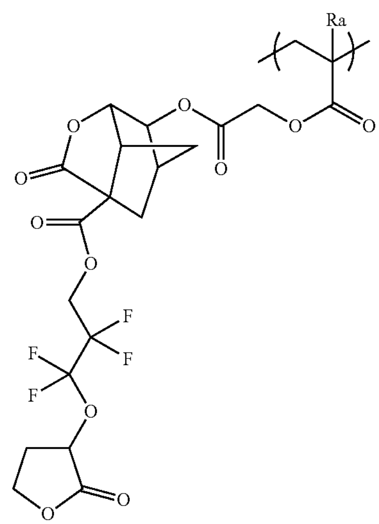
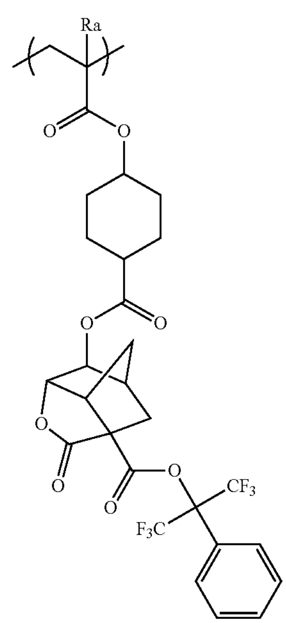

-continued
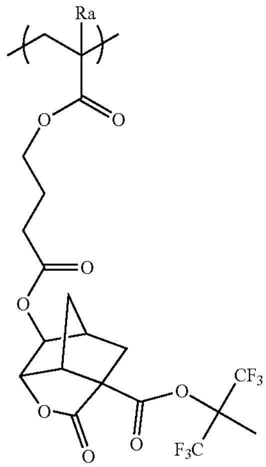
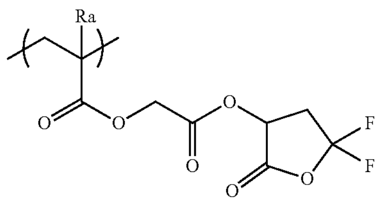
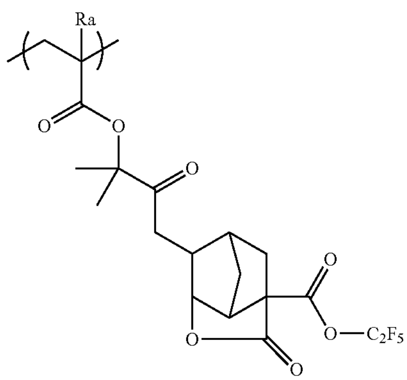
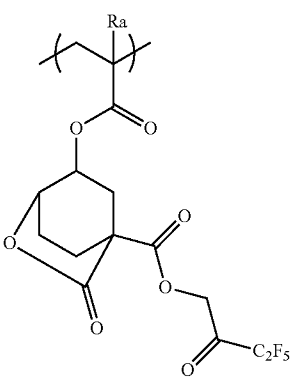
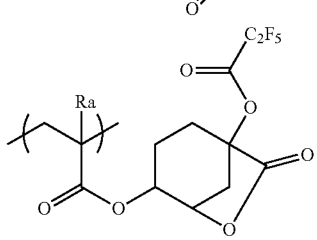
-continued
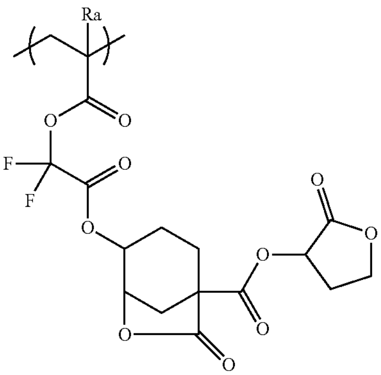
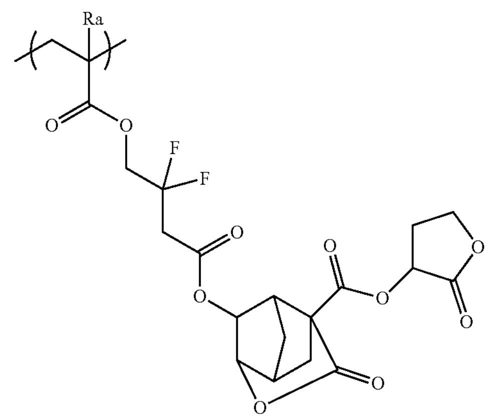
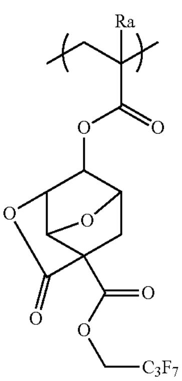
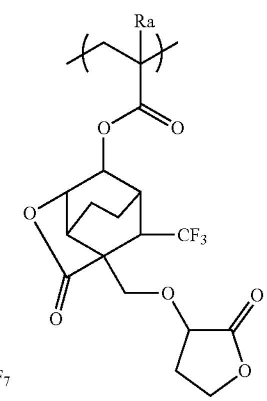
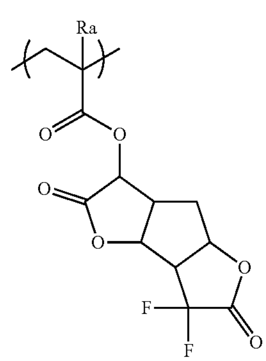
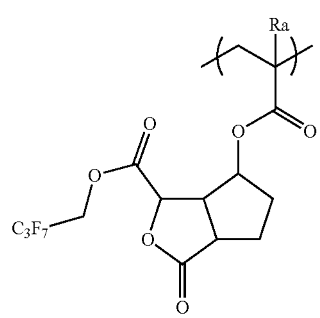

-continued
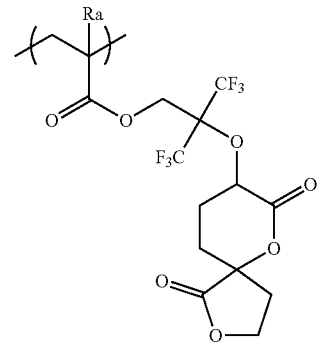
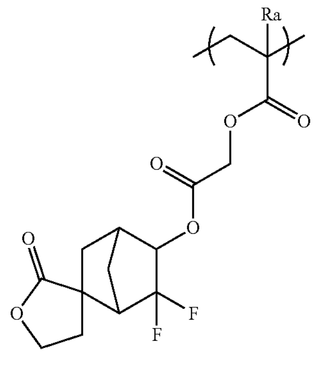
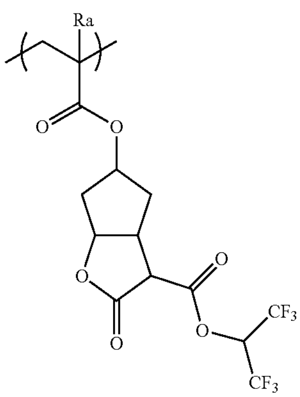
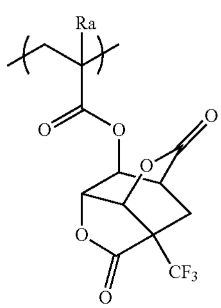
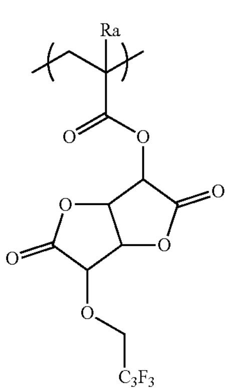
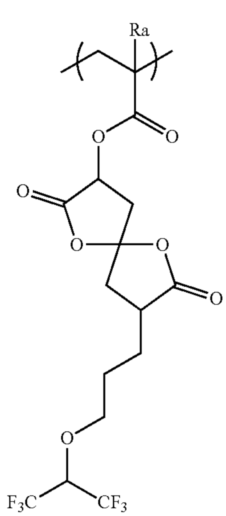
-continued
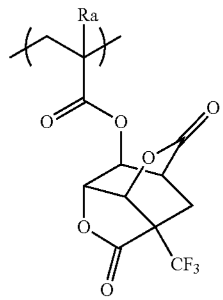
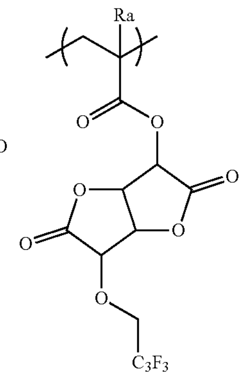
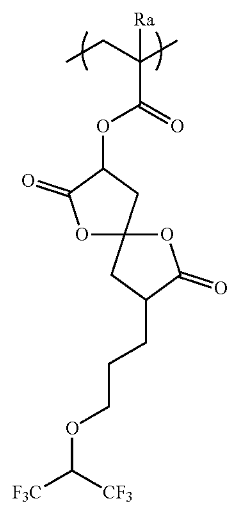
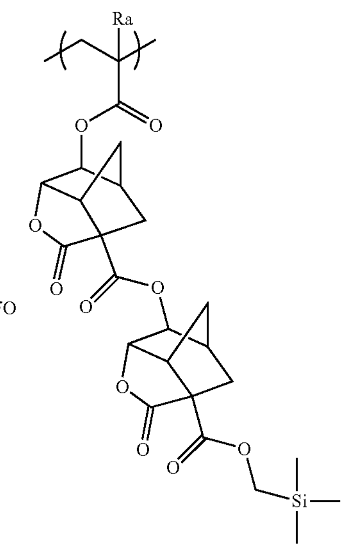
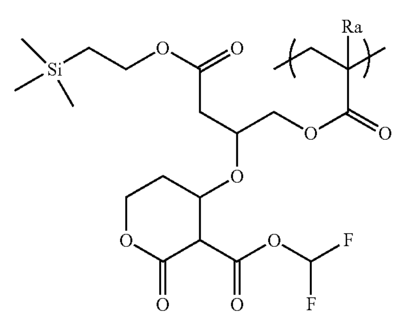
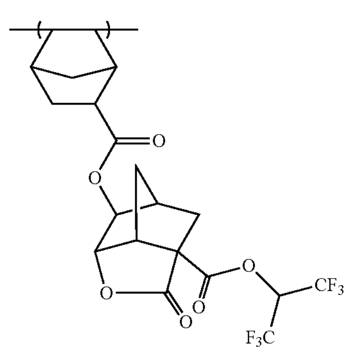

-continued

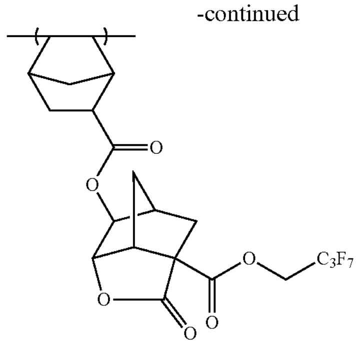

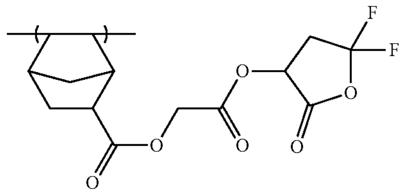

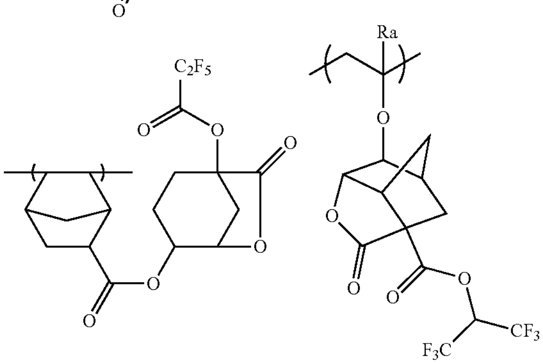

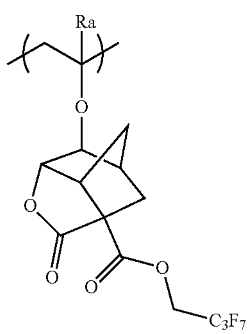

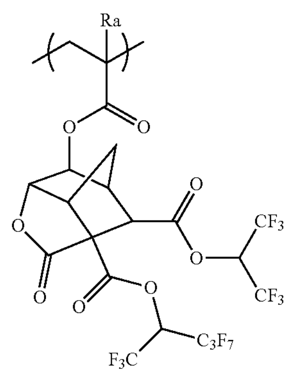

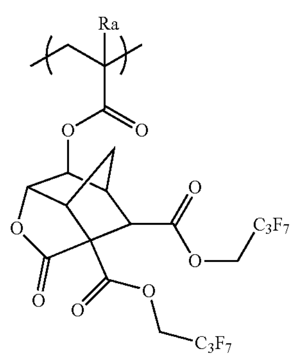

In a case where the resin (C) includes the repeating unit (β), the content of the repeating unit (β) is preferably in a range of 10% by mole to 90% by mole and more preferably in a range of 20% by mole to 85% by mole with respect to all repeating units in the resin (C).

(Repeating Unit (γ))

Next, the repeating unit (γ) derived from a monomer represented by Formula (aa1-1) will be described.

(aa1-1)

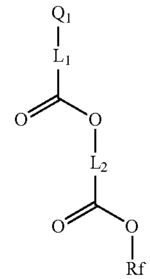

In the formula, an organic group having a polymerizable group represented by $Q_1$ is not particularly limited as long as the organic group has a polymerizable group. Examples of the polymerizable group include an acrylic group, a methacrylic group, a styryl group, a norbornenyl group, a maleimide group, and a vinyl ether group. Among these, an acrylic group, a methacrylic group, or a styryl group is particularly preferable.

Examples of the divalent linking group represented by $L_1$ and $L_2$ include a substituted or unsubstituted arylene group, a substituted or unsubstituted alkylene group, a substituted or unsubstituted cycloalkylene group, an ether bond (—O—), a carbonyl group (—CO—), or a divalent linking group formed by combining plural kinds of these.

It is preferable that the arylene group is an arylene group having 6 to 14 carbon atoms. Specific examples thereof include phenylene, naphthylene, anthrylene, phenanthrylene, biphenylene, and terphenylene.

It is preferable that the alkylene group and the cycloalkylene group are an alkylene group having 1 to 15 carbon atoms and a cycloalkylene group having 1 to 15 carbon atoms. Specific examples thereof include a group formed by removing one hydrogen atom from a linear, branched, or cyclic alkyl group described below. Examples of the alkyl group before one hydrogen atom is removed therefrom include methyl, ethyl, n-propyl, isopropyl, n-butyl, sec-butyl, tert-butyl, tert-amyl, n-pentyl, n-hexyl, n-heptyl, n-octyl, n-nonyl, and n-decyl. Further, examples of the cycloalkylene group before one hydrogen atom is removed therefrom include cyclopentyl, cyclohexyl, cyclopentylmethyl, cyclopentylethyl, cyclopentylbutyl, cyclohexylmethyl, cyclohexylethyl, cyclohexylbutyl, and adamantyl Examples of the substituent which may be included in the arylene group, the alkylene group, and the cycloalkylene group include an alkyl group, an aralkyl group, an alkoxy group, and a fluorine atom.

According to an aspect of the present invention, it is more preferable that $L_1$ represents a single bond, a phenylene group, an ether bond, a carbonyl group, or a carbonyloxy group and $L_2$ represents an alkylene group, an ether bond, a carbonyl group, or a carbonyloxy group.

The organic group having fluorine atoms as Rf is a group including at least one carbon atom, and an organic group including a part of a carbon-hydrogen bond is preferable as the organic group. Rf represents an alkyl group substituted with a fluorine atom or a cycloalkyl group substituted with a fluorine atom. Examples of the alkyl group and the cycloalkyl group are the same as those of the alkyl group and the cycloalkyl group as $L_1$ and $L_2$ before one hydrogen atom is removed therefrom.

According to an aspect of the present invention, it is preferable that the repeating unit (γ) is a repeating unit represented by the following Formula (aa1-2-1) or (aa1-3-1).

(aa1-2-1)

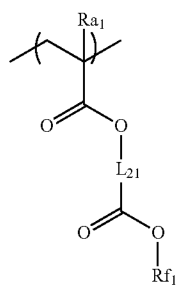

(aa1-3-1)

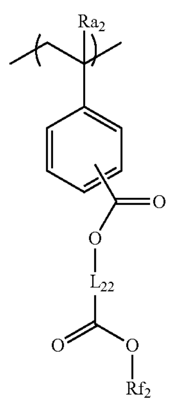

In Formulae (aa1-2-1) and (aa1-3-1), $Ra_1$ and $Ra_2$ represent a hydrogen atom or an alkyl group. It is preferable that $Ra_1$ and $Ra_2$ represent a hydrogen atom or methyl.

$L_{21}$ and $L_{22}$ represent a single bond or a divalent linking group and have the same definition as that for $L_2$ in Formula (aa1-1).

$Rf_1$ and $Rf_2$ represent an organic group having fluorine atoms and have the same definition as that for Rf in Formula (aa1-1).

Moreover, according to an aspect of the present invention, it is preferable that the repeating unit (γ) is a repeating unit represented by the following Formula (aa1-2-2) or (aa1-3-2).

(aa1-2-2)

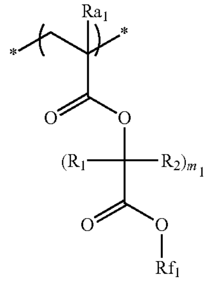

-continued (aa1-3-2)

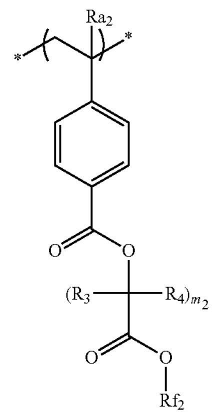

In Formulae (aa1-2-2) and (aa1-3-2), $Ra_1$ and $Ra_2$ represent a hydrogen atom or an alkyl group.

$R_1$, $R_2$, $R_3$, and $R_4$ represent a hydrogen atom or an alkyl group.

$m_1$ and $m_2$ represent an integer of 0 to 5.

$Rf_1$ and $Rf_2$ represent an organic group having fluorine atoms.

It is preferable that $Ra_1$ and $Ra_2$ represent a hydrogen atom or methyl.

It is preferable that the alkyl group represented by $R_1$, $R_2$, $R_3$, and $R_4$ may be a linear or branched alkyl group having 1 to 10 carbon atoms. The alkyl group may include a substituent, and examples of the substituent include an alkoxy group, an aryl group, and a halogen atom.

$m_1$ and $m_2$ represent preferably an integer of 0 to 3, more preferably 0 or 1, and particularly preferably 1.

The organic group having fluorine atoms as $Rf_1$ and $Rf_2$ has the same definition as that for Rf in Formula (aa1-1).

In addition, according to an aspect of the present invention, it is preferable that the repeating unit (γ) is a repeating unit represented by the following Formula (aa1-2-3) or (aa1-3-3).

(aa1-2-3)

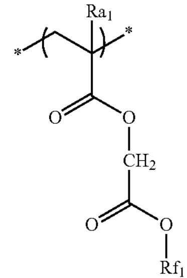

-continued
(aa1-3-3)
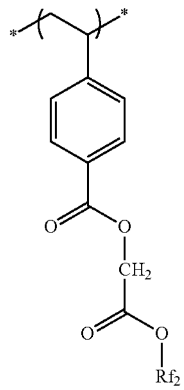
In Formulae (aa1-2-3) and (aa1-3-3), $Ra_1$ represents a hydrogen atom or methyl.
$Rf_1$ and $Rf_2$ represent an organic group having fluorine atoms and have the same definition as that for Rf in Formula (aa1-1).
Hereinafter, specific examples of the repeating unit (γ) will be described, but the present invention is not limited thereto.
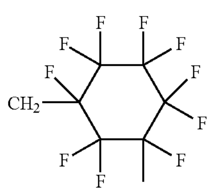
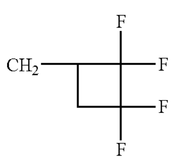
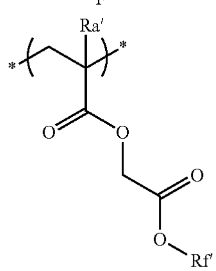
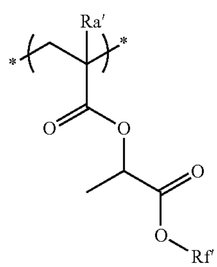
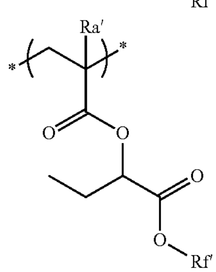
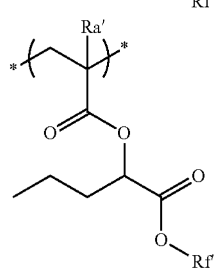
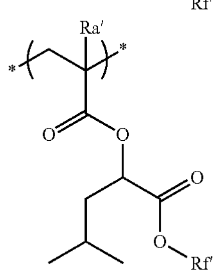
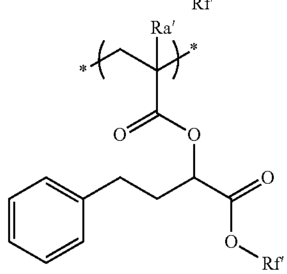
-continued
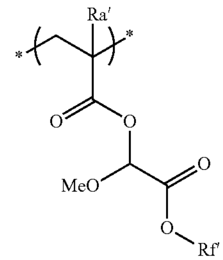
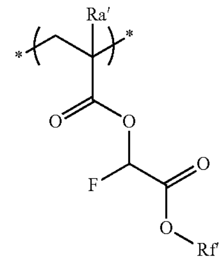
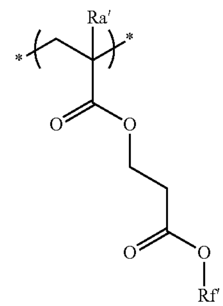
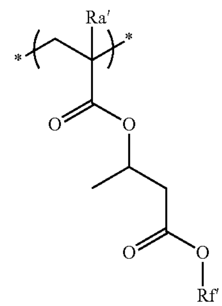
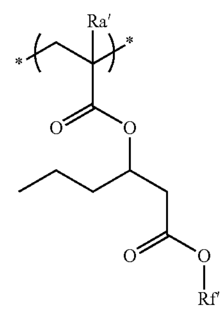
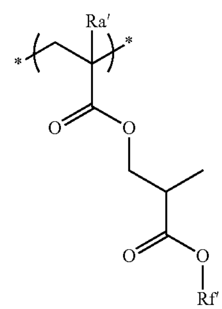
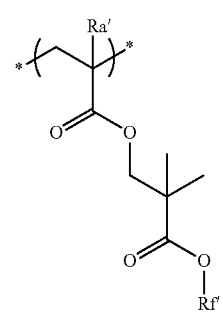
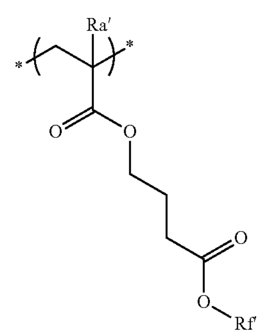
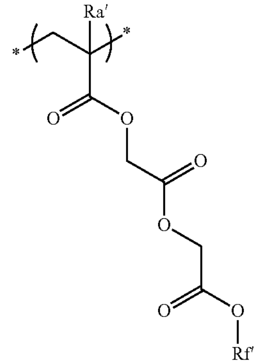
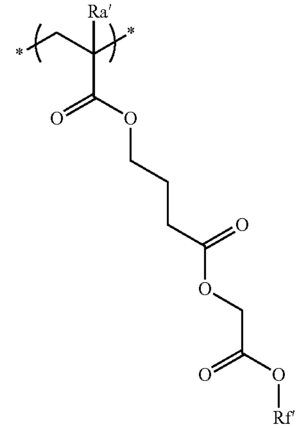

-continued
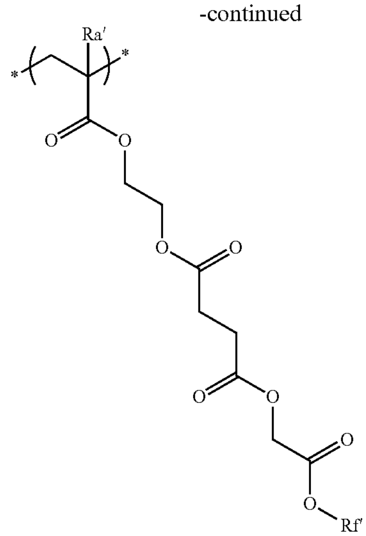
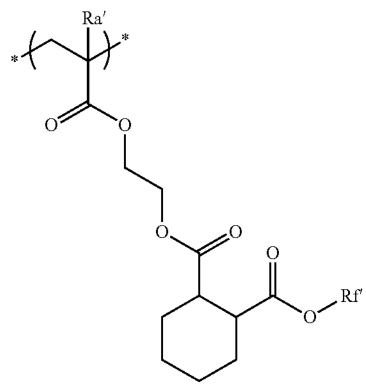
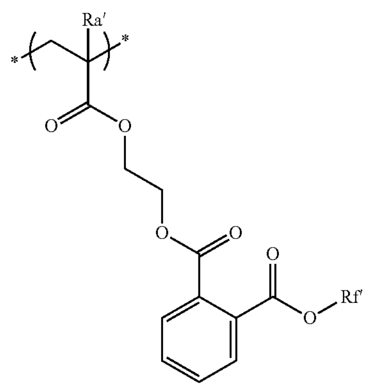
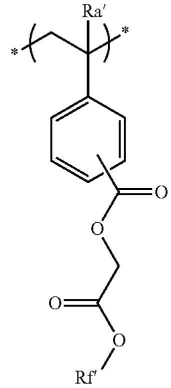
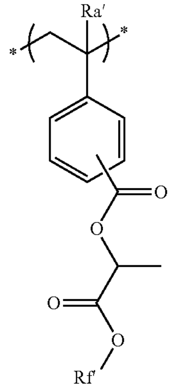
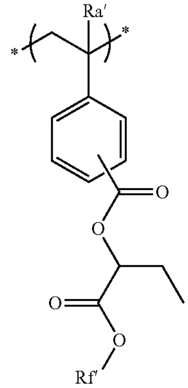
-continued
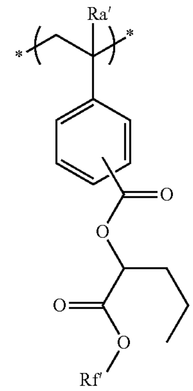
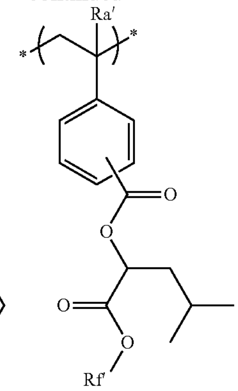
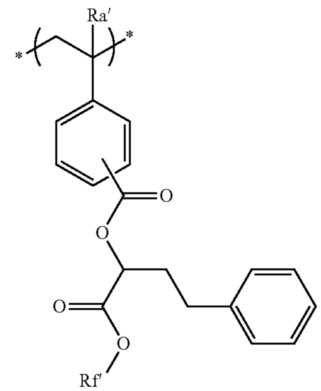
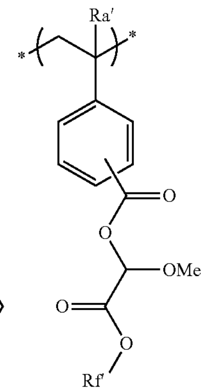
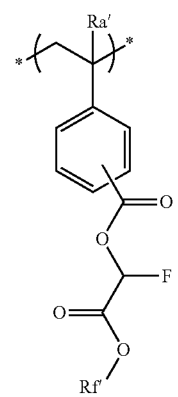
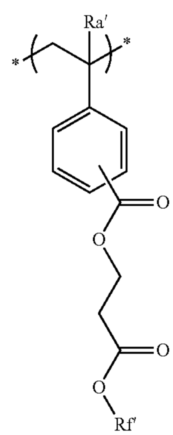
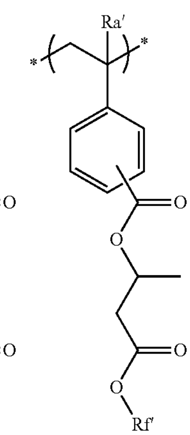
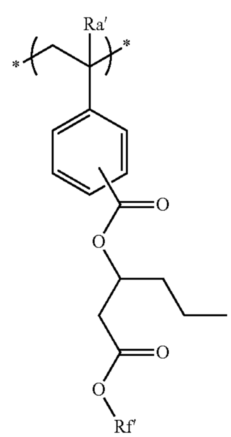
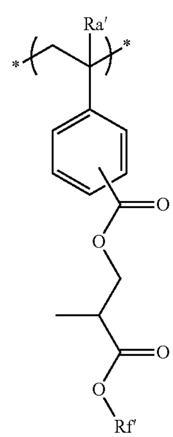
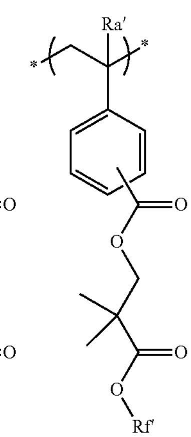

-continued

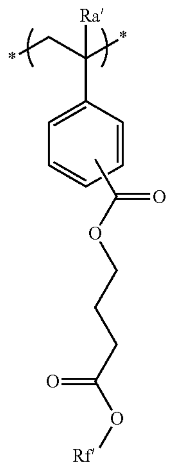

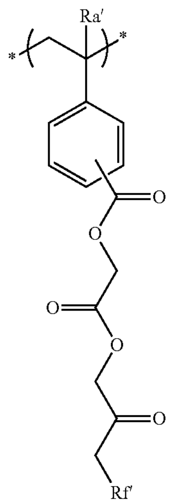

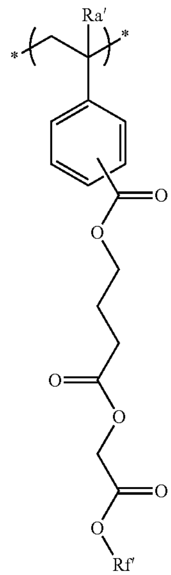

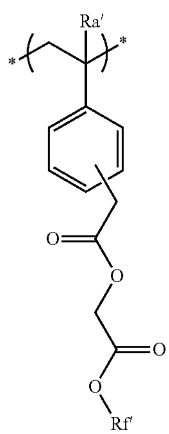

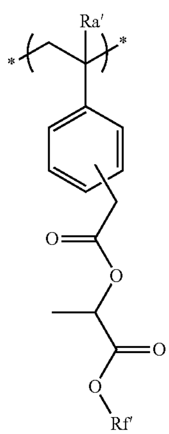

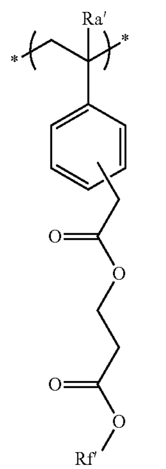

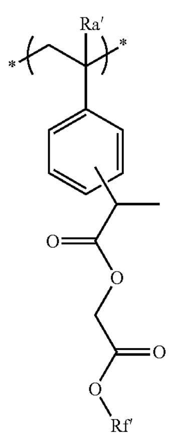

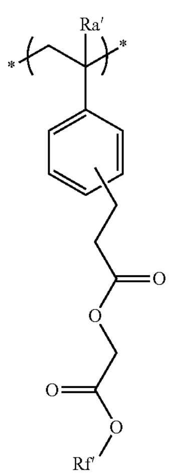

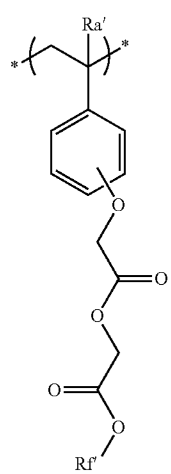

-continued

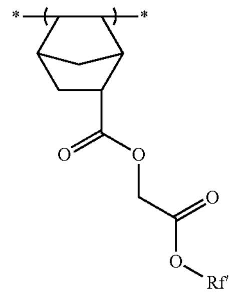

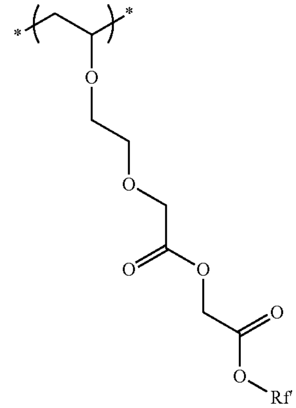

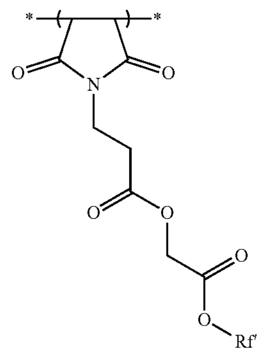

In a case where the resin (C) includes the repeating unit (γ), the content of the repeating unit (γ), on a % by mole basis, is preferably in a range of 10% by mole to 90% by mole and more preferably in a range of 20% by mole to 85% by mole with respect to all repeating units in the resin (C).

The weight-average molecular weight (Mw) of the resin (C) in terms of standard polystyrene is preferably in a range of 1,000 to 1,000,000, more preferably in a range of 10,000 to 700,000, and still more preferably in a range of 20,000 to 500,000. A method of measuring the weight-average molecular weight thereof will be described later.

The dispersity (weight-average molecular weight/number average molecular weight) of the resin (C) used in the present invention is not particularly limited, but is preferably in a range of 1.0 to 3.0, more preferably in a range of 1.0 to 2.5, still more preferably in a range of 1.1 to 2.3, and particularly preferably greater than 1.2 and 2.0 or less.

In a case where the resin (C) includes a group having fluorine atoms, the content of the repeating unit that includes a group having fluorine atoms is preferably in a range of 5% by mole to 100% by mole and more preferably in a range of 10% by mole to 100% by mole with respect to all repeating units in the resin (C). In a case where the resin (C) includes a repeating unit having an aromatic ring group, the content of the repeating unit having an aromatic ring group is preferably in a range of 3% by mole to 100% by mole and more preferably in a range of 5% by mole to 100% by mole with respect to all repeating units in the resin (C).

In a case where the resin (C) is a copolymer, the resin (C) may be a random copolymer or a block copolymer, but it is preferable that the resin (C) is a random copolymer. In addition, the resin (C) may be a linear polymer, a branched polymer, a comb polymer, or a star polymer.

Various kinds of commercially available products can be used as the resin (C), or the resin (C) can be synthesized according to a known method (for example, radical polymerization).

For example, the resin (C) can be synthesized radical, cationic, or anionic polymerization of unsaturated monomers corresponding to respective structures. Moreover, a target resin can be obtained by performing a polymer reaction after polymerization is carried out using unsaturated monomers corresponding to precursors of the respective structures.

For example, examples of the known method include a batch polymerization method of performing polymerization by dissolving unsaturated monomers and an initiator in a solvent and heating the solution and a dropping polymerization method of dropping a solution of monomers and an initiator into a heated solvent for 1 hour to 10 hours for addition. Both of the methods, the dropping polymerization method is preferable.

A reaction solvent, a polymerization initiator, reaction conditions (the temperature, the concentration, and the like), and a purification method after the reaction can be referred to the description in the paragraphs [0173] to [0183] of JP2012-208447A, and the contents of which are incorporated herein.

In the synthesis of the resin (C), the concentration of the reaction is preferably in a range of 30% by mass to 50% by mass.

The resin (C) may be used alone or in combination of plural kinds thereof.

Hereinafter, specific examples of the resin (C) will be described. Further, molar ratios (corresponding to respective repeating units from the left), the weight-average molecular weights, and the dispersities of repeating units in respective resins are listed in the following Table 1.

(HR-1)

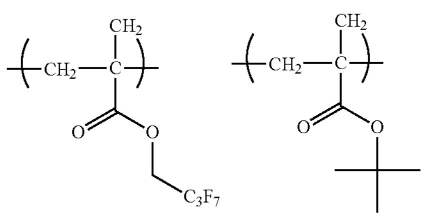

(HR-2)

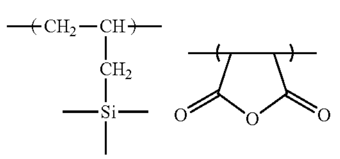

(HR-3)

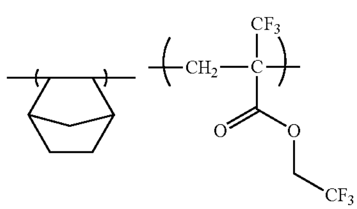

(HR-4)

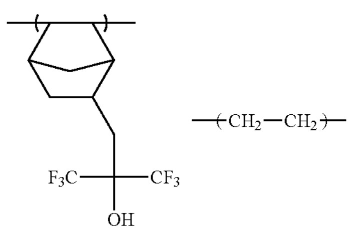

-continued (HR-5)

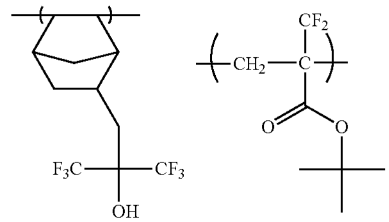

(HR-6)

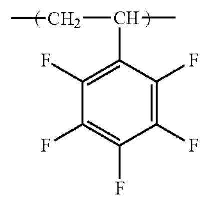

(HR-7)

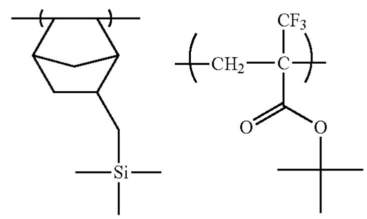

(HR-8)

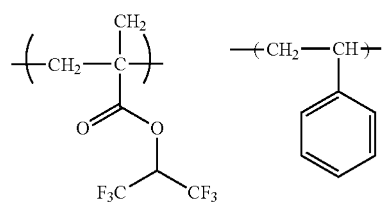

(HR-9)

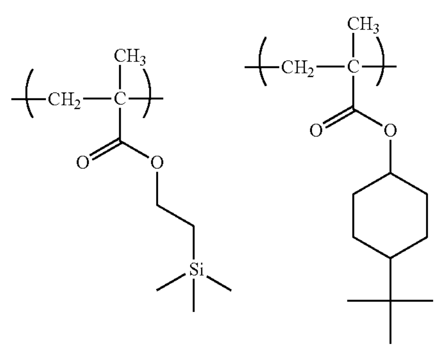

(HR-10)

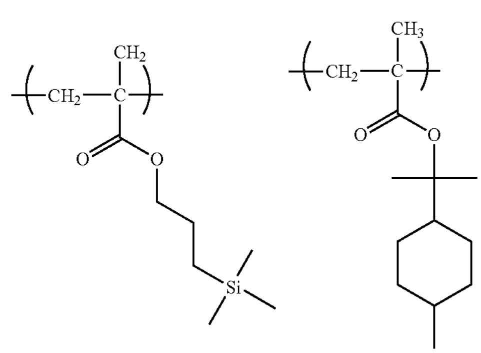

-continued
(HR-11)
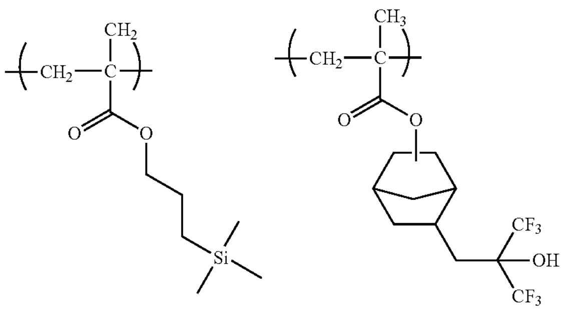
(HR-12)
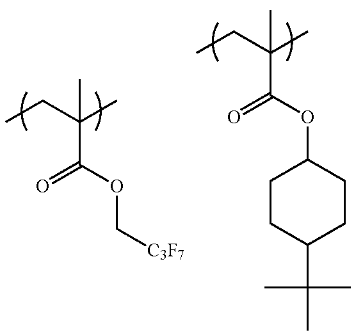
(HR-13)
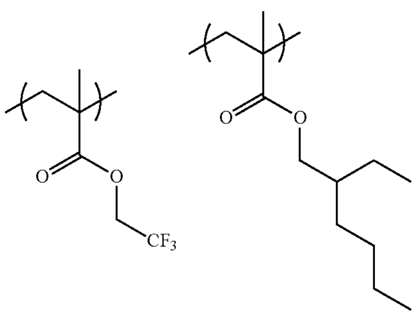
(HR-14)
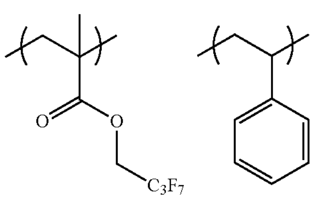
(HR-15)
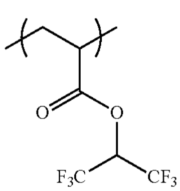
(HR-16)
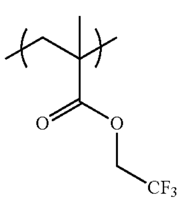
-continued
(HR-17)
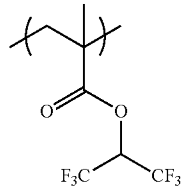
(HR-18)
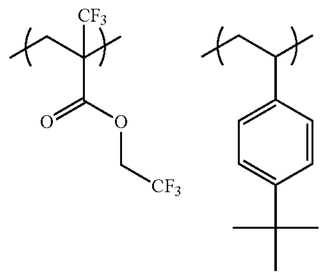
(HR-19)
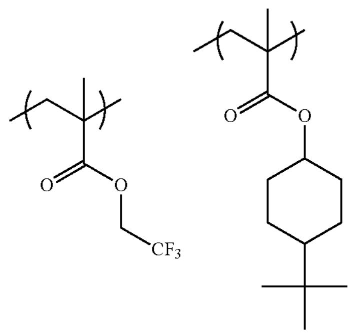
(HR-20)
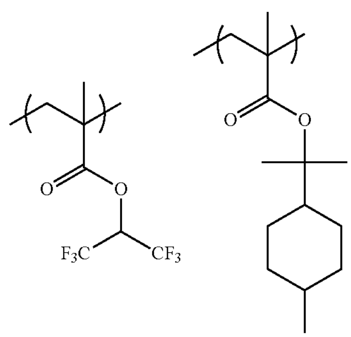
(HR-21)
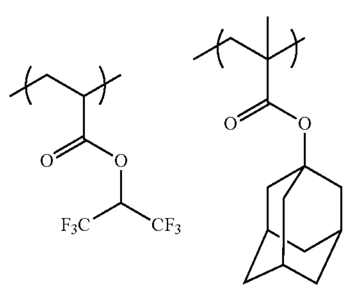
(HR-22)
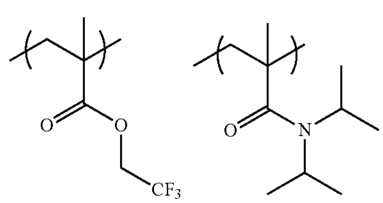

-continued
(HR-23)
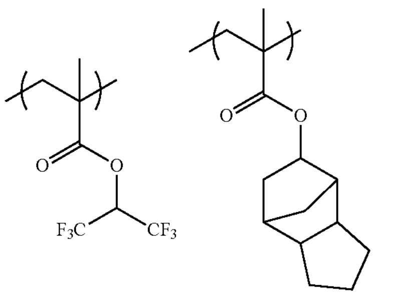
(HR-24)
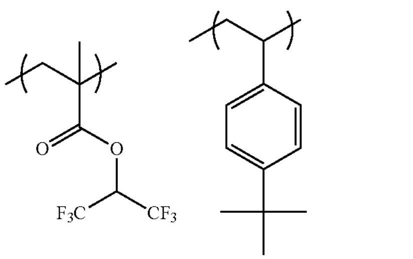
(HR-25)
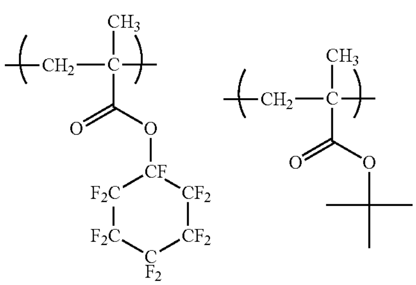
(HR-26)
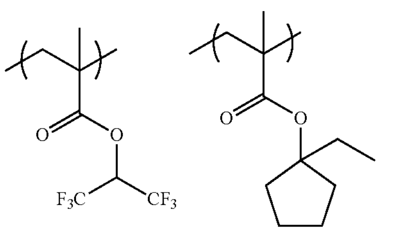
(HR-27)
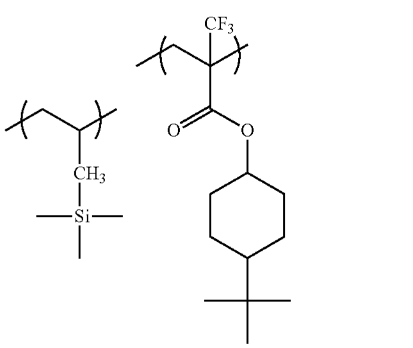
(HR-28)
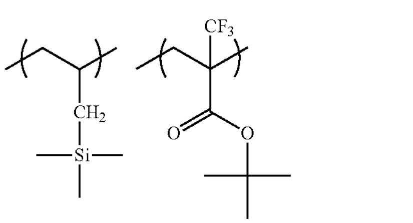
-continued
(HR-29)
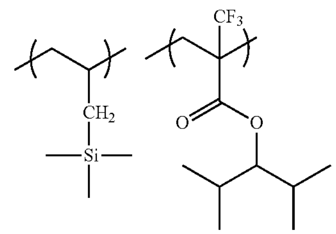
(HR-30)
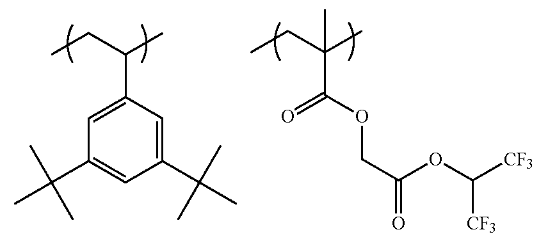
(HR-31)
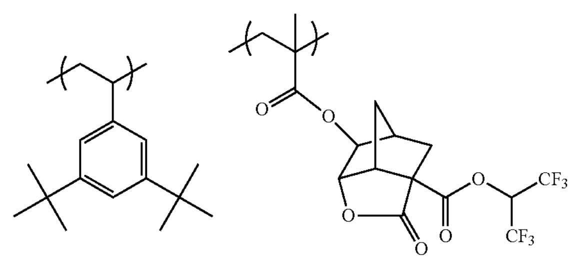
(HR-32)
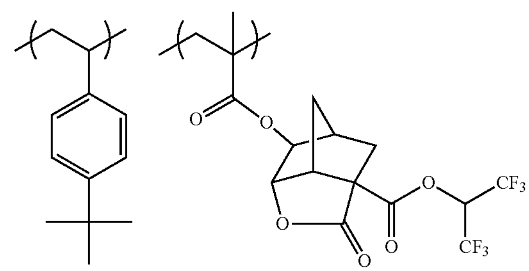
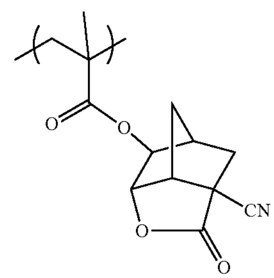
(HR-33)
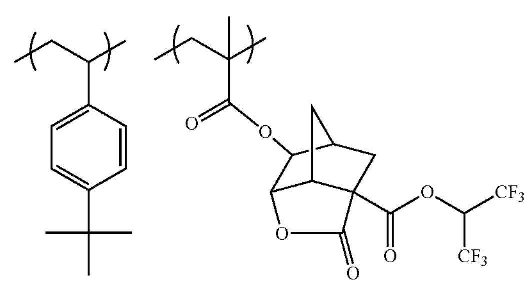

-continued
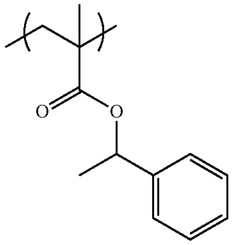
(HR-34)
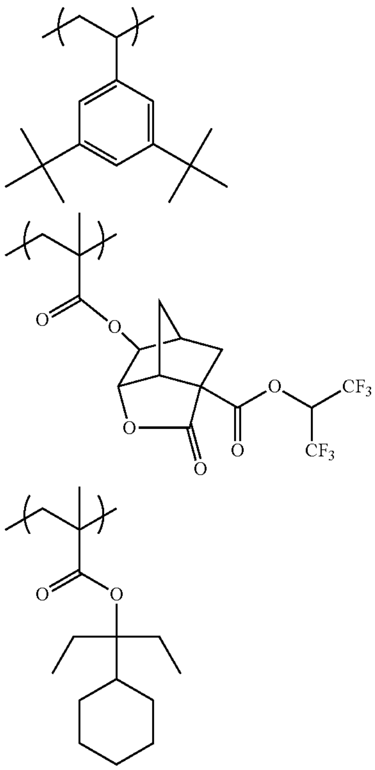
(HR-35)
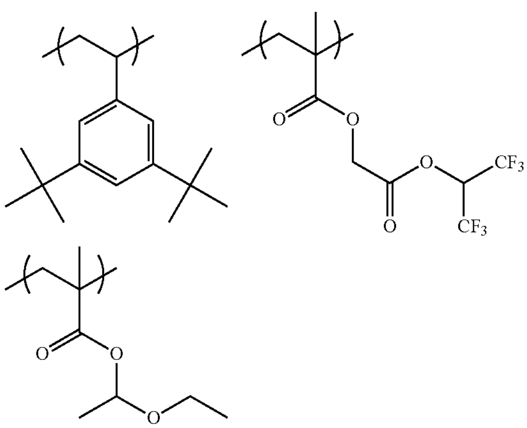
(HR-36)
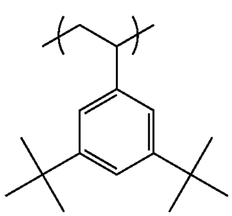
-continued
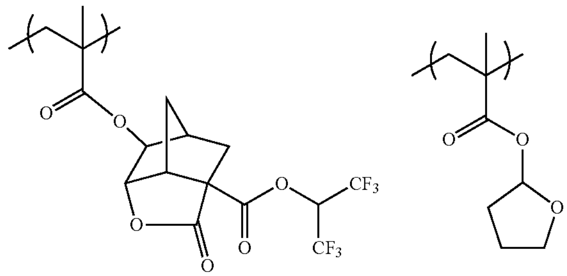
(HR-37)
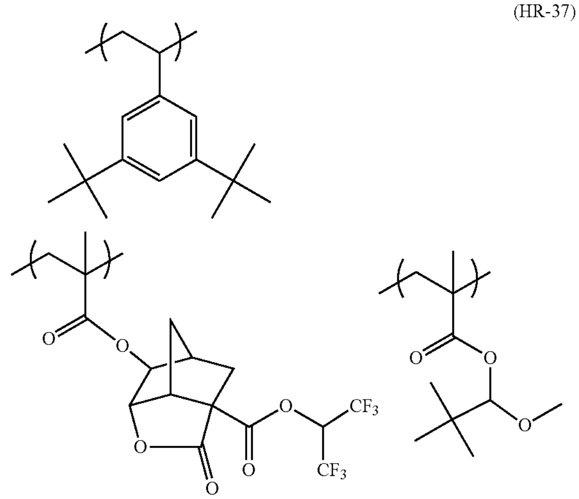
(HR-38)
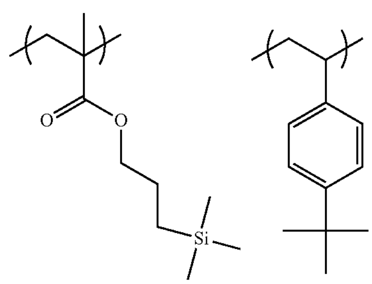
(HR-39)
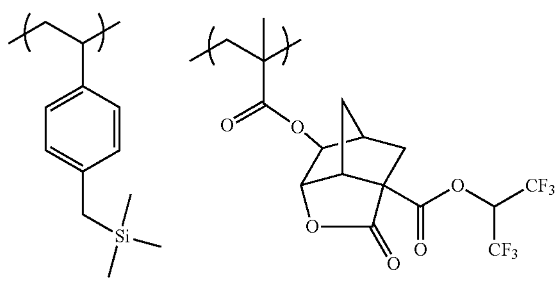
(HR-40)
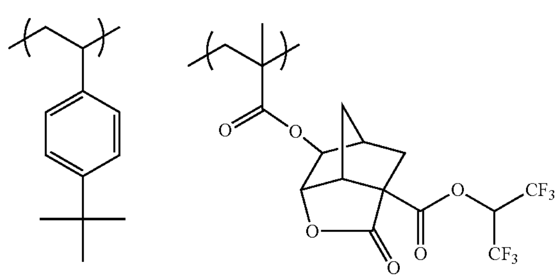

-continued
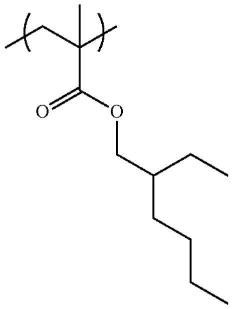
(HR-41)
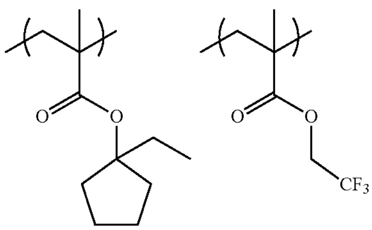
(HR-42)
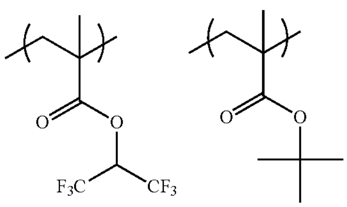
(HR-43)
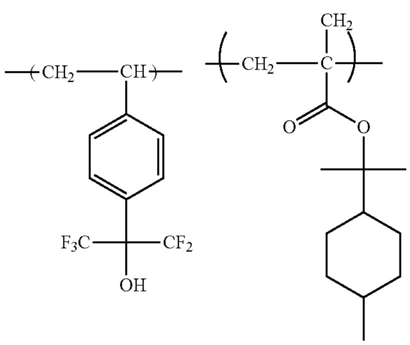
(HR-44)
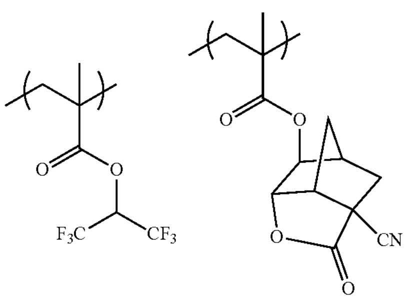
(HR-45)
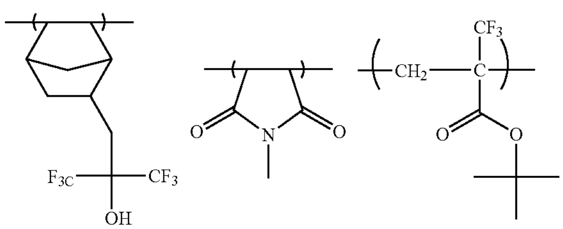
-continued
(HR-46)
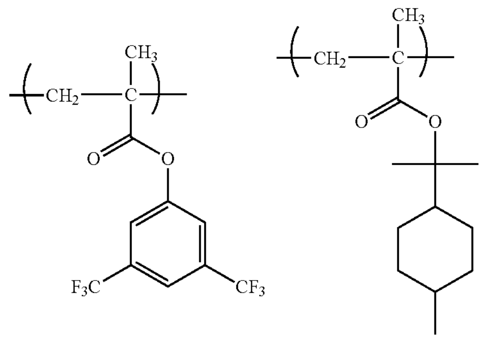
(HR-47)
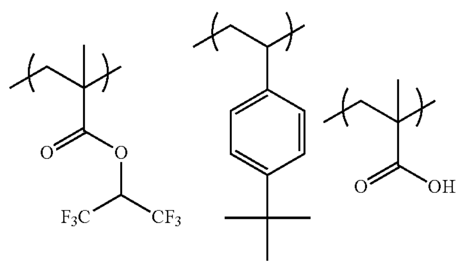
(HR-48)
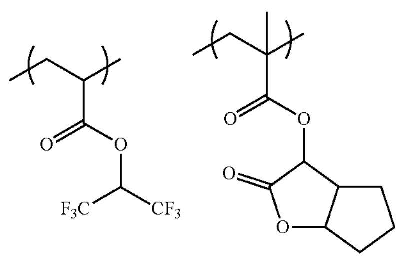
(HR-49)
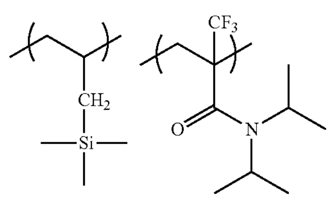
(HR-50)
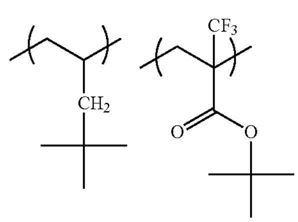

-continued
(HR-51)
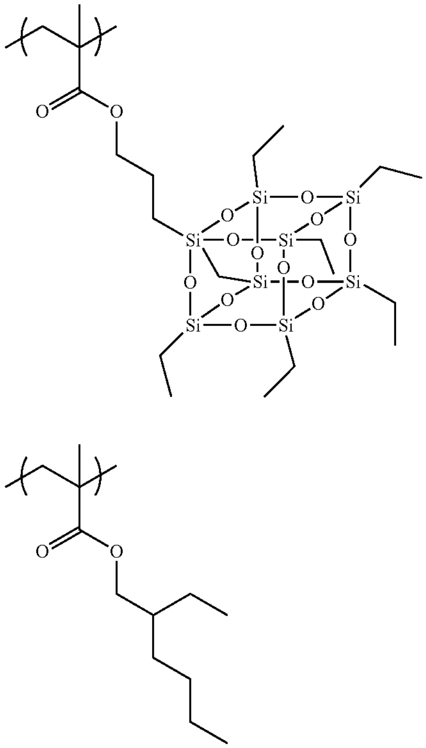
(HR-52)
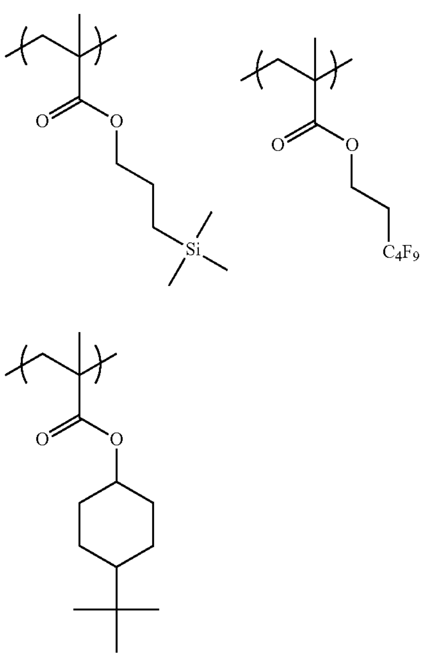
(HR-53)
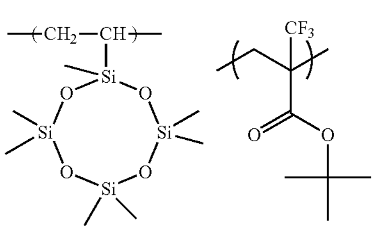
-continued
(HR-54)
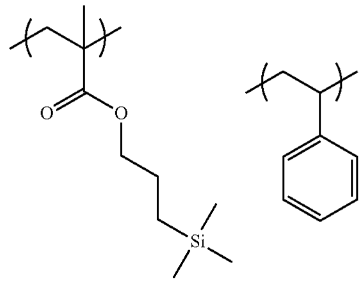
(HR-55)
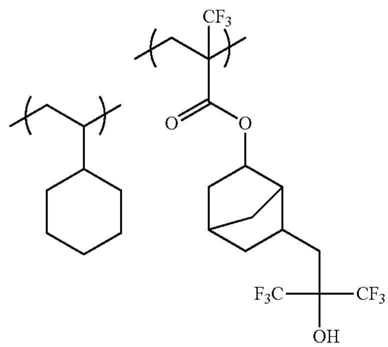
(HR-56)
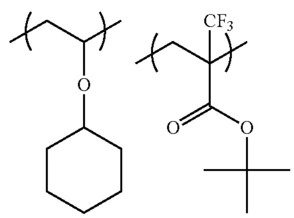
(HR-57)
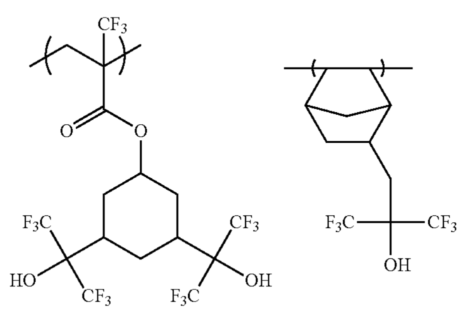
(HR-58)
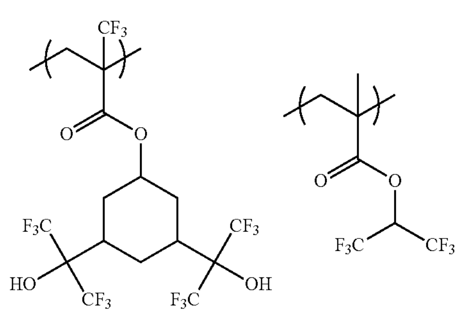

-continued
(HR-59)
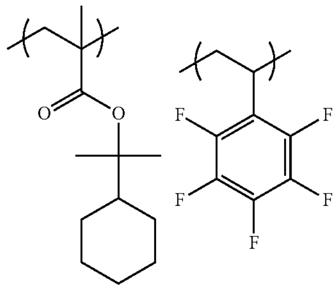
(HR-60)
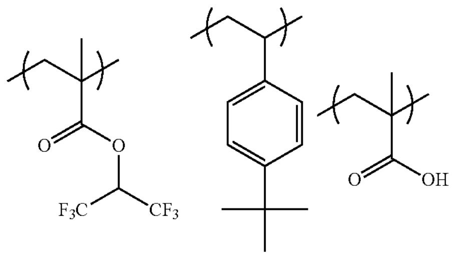
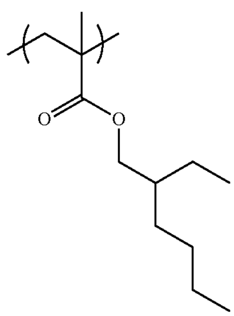
(HR-61)
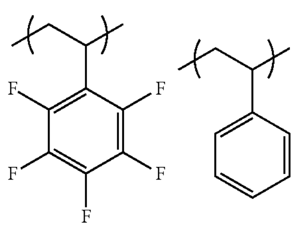
(HR-62)
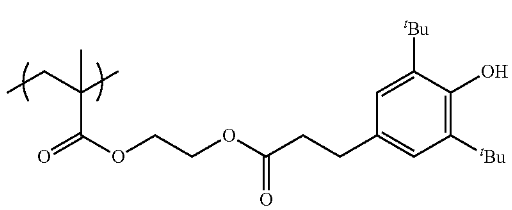
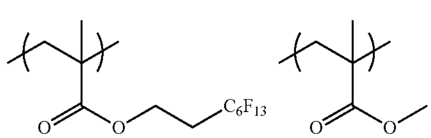
-continued
(HR-63)
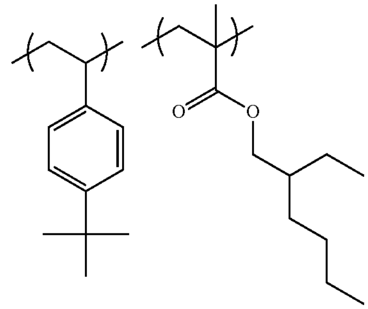
HR-64
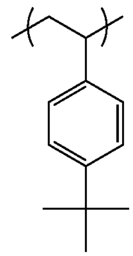
HR-65
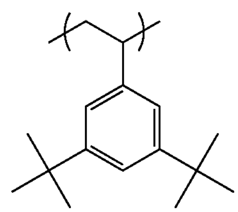
HR-66
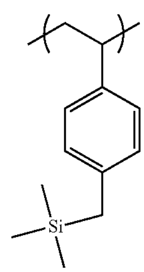
HR-67
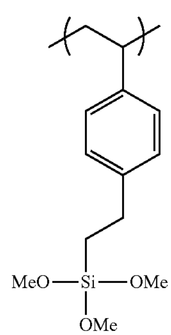
HR-68
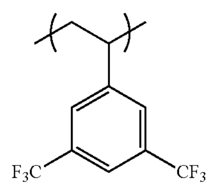

-continued
HR-69
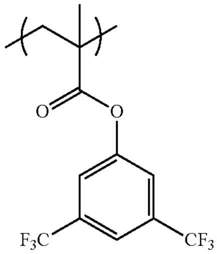
HR-70
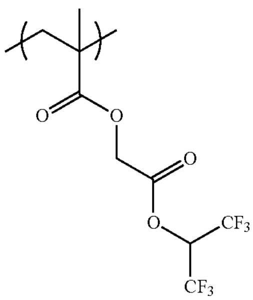
HR-71
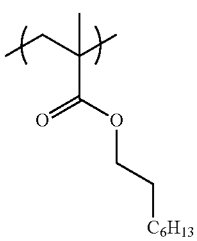
HR-72
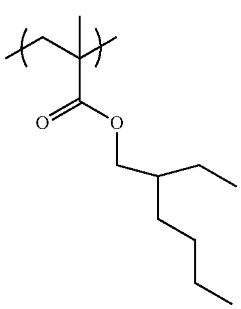
HR-73
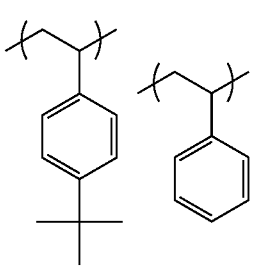
-continued
HR-74
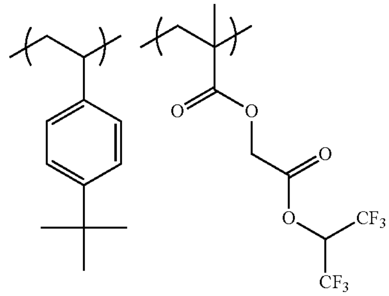
HR-75
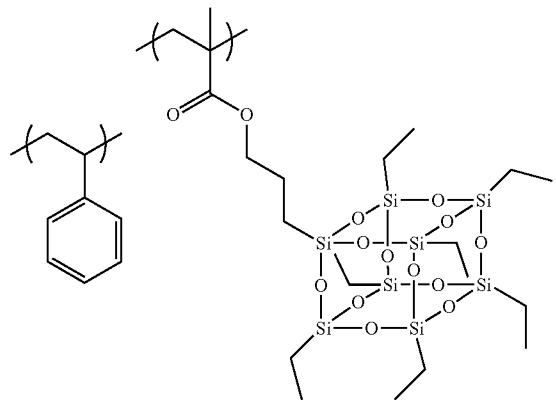
HR-76
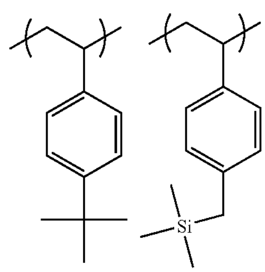
HR-77
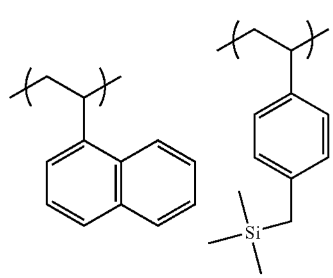

-continued
HR-78
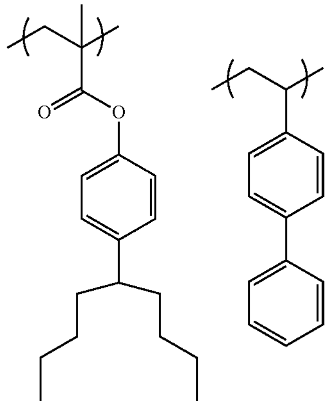
HR-79
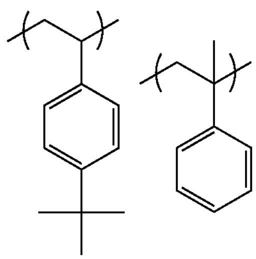
HR-80
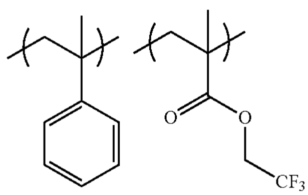
HR-81
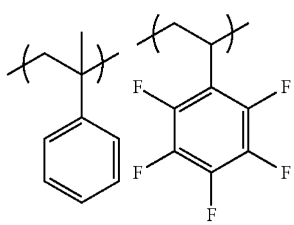
HR-82
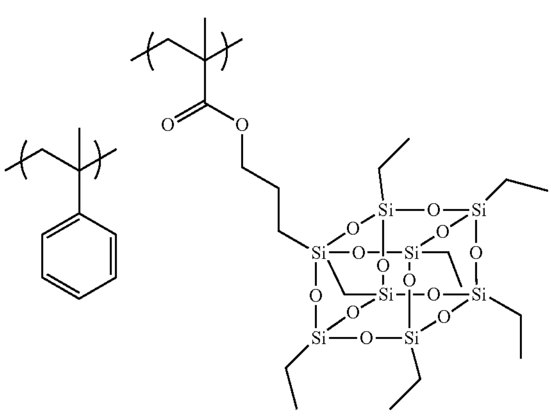
-continued
HR-83
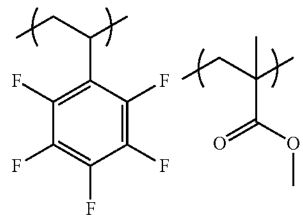
TABLE 1
| Resin | Composition | Mw | Mw/Mn |
|---|---|---|---|
| HR-1 | 90/10 | 18000 | 1.55 |
| HR-2 | 50/50 | 15100 | 1.62 |
| HR-3 | 50/50 | 4800 | 1.50 |
| HR-4 | 90/10 | 5300 | 1.62 |
| HR-5 | 50/50 | 14500 | 1.47 |
| HR-6 | 100 | 25500 | 1.61 |
| HR-7 | 50/50 | 15800 | 1.92 |
| HR-8 | 50/50 | 44200 | 1.34 |
| HR-9 | 50/50 | 35900 | 1.80 |
| HR-10 | 50/50 | 37500 | 1.62 |
| HR-11 | 70/30 | 26600 | 1.81 |
| HR-12 | 40/60 | 33900 | 1.33 |
| HR-13 | 50/50 | 49500 | 1.81 |
| HR-14 | 50/50 | 25300 | 1.68 |
| HR-15 | 100 | 26200 | 1.27 |
| HR-16 | 100 | 25600 | 1.64 |
| HR-17 | 100 | 24400 | 1.31 |
| HR-18 | 50/50 | 14300 | 1.38 |
| HR-19 | 50/50 | 26500 | 1.60 |
| HR-20 | 30/70 | 36500 | 1.50 |
| HR-21 | 50/50 | 26000 | 1.62 |
| HR-22 | 50/50 | 3000 | 1.21 |
| HR-23 | 50/50 | 25000 | 1.25 |
| HR-24 | 30/70 | 34000 | 1.68 |
| HR-25 | 30/70 | 15000 | 1.43 |
| HR-26 | 80/20 | 15000 | 1.62 |
| HR-27 | 50/50 | 23500 | 1.34 |
| HR-28 | 50/50 | 16200 | 1.47 |
| HR-29 | 50/50 | 26500 | 1.68 |
| HR-30 | 15/85 | 30000 | 1.52 |
| HR-31 | 10/90 | 38000 | 1.50 |
| HR-32 | 20/70/10 | 29000 | 1.54 |
| HR-33 | 10/75/15 | 18000 | 1.65 |
| HR-34 | 10/80/10 | 11000 | 1.43 |
| HR-35 | 5/80/15 | 26000 | 1.39 |
| HR-36 | 15/75/10 | 23000 | 1.44 |
| HR-37 | 10/80/10 | 20000 | 1.42 |
| HR-38 | 50/50 | 38000 | 1.56 |
| HR-39 | 20/80 | 27000 | 1.52 |
| HR-40 | 15/80/5 | 25000 | 1.55 |
| HR-41 | 50/50 | 26500 | 1.61 |
| HR-42 | 50/50 | 25200 | 1.60 |
| HR-43 | 50/50 | 6000 | 1.42 |
| HR-44 | 70/30 | 25500 | 1.61 |
| HR-45 | 50/20/30 | 14200 | 1.40 |
| HR-46 | 30/70 | 27500 | 1.68 |
| HR-47 | 40/58/2 | 24300 | 1.49 |
| HR-48 | 50/50 | 26800 | 1.67 |
| HR-49 | 50/50 | 6500 | 1.50 |
| HR-50 | 50/50 | 4500 | 1.40 |
| HR-51 | 30/70 | 150000 | 2.56 |
| HR-52 | 30/30/40 | 16500 | 1.80 |
| HR-53 | 50/50 | 4000 | 1.32 |
| HR-54 | 50/50 | 26500 | 1.70 |
| HR-55 | 50/50 | 16000 | 1.58 |
| HR-56 | 50/50 | 15000 | 1.62 |
| HR-57 | 50/50 | 14000 | 1.42 |
| HR-58 | 20/80 | 26000 | 1.44 |
| HR-59 | 50/50 | 27000 | 1.45 |
| HR-60 | 39/57/2/2 | 21000 | 1.35 |
| HR-61 | 35/65 | 81000 | 1.95 |
| HR-62 | 6/12/82 | 276000 | 2.20 |

TABLE 1-continued

| Resin | Composition | Mw | Mw/Mn |
|---|---|---|---|
| HR-63 | 50/50 | 51000 | 1.45 |
| HR-64 | 100 | 51000 | 1.42 |
| HR-65 | 100 | 62000 | 1.45 |
| HR-66 | 100 | 41500 | 1.43 |
| HR-67 | 100 | 21000 | 1.67 |
| HR-68 | 100 | 9000 | 1.55 |
| HR-69 | 100 | 15000 | 1.82 |
| HR-70 | 100 | 21000 | 1.50 |
| HR-71 | 100 | 20000 | 1.62 |
| HR-72 | 100 | 25000 | 1.54 |
| HR-73 | 80/20 | 55000 | 1.45 |
| HR-74 | 70/30 | 28000 | 1.56 |
| HR-75 | 55/45 | 169000 | 2.56 |
| HR-76 | 50/50 | 42000 | 1.87 |
| HR-77 | 30/70 | 28000 | 1.65 |
| HR-78 | 80/20 | 19000 | 1.56 |
| HR-79 | 80/20 | 120000 | 1.30 |
| HR-80 | 70/30 | 130000 | 1.28 |
| HR-81 | 70/30 | 125000 | 1.38 |
| HR-82 | 70/30 | 180000 | 1.45 |
| HR-83 | 50/50 | 60000 | 1.54 |

In addition to the resin (C) used in the present invention, it is preferable to use a resin (D) other than the resin (C). Examples of the resin (D) include an insulating polymer such as polystyrene, poly α-methylstyrene, polycarbonate, polyacrylate, polyester, polyamide, polyimide, polyurethane, polysiloxane, polysilsesquioxane, polysulfone, polymethacrylate represented by polymethyl methacrylate, polyacrylate represented by polymethyl acrylate, cellulose represented by triacetyl cellulose, polyethylene, polypropylene, polyvinyl phenol, polyvinyl alcohol, or polyvinyl butyral, and a copolymer obtained by copolymerizing two or more kinds of these constituent components.

In a case of using the resin (D), the mass ratio of the resin (C) is preferably 10% by mass or greater and less than 100% by mass and more preferably 20% by mass or greater and less than 100% by mass with respect to the total amount of the resin (C) and the resin (D).

The total content of the resin (C) and the resin (D) in the organic semiconductor layer is preferably in a range of 1% by mass to 80% by mass, more preferably in a range of 5% by mass to 60% by mass, and still more preferably in a range of 10% by mass to 50% by mass. When the content of the resin (C) is in the above-described range, the resin (C) and the organic semiconductor can be respectively unevenly distributed or phase-separated on the surface side and the substrate side in the organic semiconductor layer, the maintenance factor (durability) of the mobility is increased, a conductive path of the organic semiconductor can be secured, and the mobility can be improved.

It is preferable that the content of the organic semiconductor in the organic semiconductor layer is the same as the content of a coating solution in the total solid content described below.

When the organic semiconductor layer is formed on the gate insulating layer using a wet method (wet coating method), it is easy to obtain a high-performance OTFT at low cost in a simple manner and this method is suitable for a large area. Accordingly, a wet method is preferable as the method of forming the organic semiconductor layer.

The wet method is not particularly limited, and the organic semiconductor layer can be formed by coating the gate insulating layer with a semiconductor material using a spin coating method, an ink-jet method, nozzle printing, stamp printing, screen printing, gravure printing, or an electrospray deposition method and drying the layer.

In a case where the organic semiconductor layer is formed on the gate insulating layer using a wet coating method, since the OTFT is likely to have high performance, it is preferable that the organic semiconductor layer is subjected to a crystallization treatment and particularly preferable that the organic semiconductor layer is subjected to a crystallization treatment through heating or irradiation with laser.

The method of the crystallization treatment is not particularly limited, and examples thereof include heating using a hot plate or an oven and irradiation with laser. As the heating temperature, a high temperature is preferable from the viewpoint that crystallization easily progresses and a low temperature is preferable from the viewpoint that a substrate or the like is unlikely to be affected by the heat. Specifically, the heating temperature thereof is preferably 50° C. or higher and particularly preferably 100° C. or higher. Further, the heating temperature is preferably 300° C. or lower and particularly preferably 250° C. or lower.

The film thickness of the organic semiconductor layer is optional, and preferably 1 nm or greater and more preferably 10 nm or greater. Further, the film thickness thereof is preferably 10 μm or less, more preferably 1 μm or less, and particularly preferably 500 nm or less.

[Source Electrode and Drain Electrode]

In the OTFT of the present invention, a source electrode is an electrode into which a current from the outside flows through wiring. Further, a drain electrode is an electrode that sends the current to the outside through the wiring and is typically provided in contact with the above-described semiconductor layer.

As materials of the source electrode and the drain electrode, conductive materials used for organic thin-film transistors of the related art can be used, and examples thereof include the conductive materials described in the section of the gate electrode above.

The source electrode and the drain electrode can be respectively formed according to the same method as the method of forming the above-described gate electrode.

The above-described photolithography method, a lift-off method or an etching method can be employed.

Particularly, since the gate insulating layer has excellent resistance to an etching solution or a stripping solution, the source electrode and the drain electrode can be suitably formed even when an etching method is employed. The etching method is a method of removing unnecessary portions by etching after a film is formed using a conductive material. When patterning is performed according to the etching method, it is possible to prevent peeling of a conductive material remaining on a base at the time of removing a resist and to prevent re-attachment of resist residues or the removed conductive material to the base. Accordingly, the shape of an electrode edge portion is excellent. From this viewpoint, the etching method is preferred than the lift-off method.

The lift-off method is a method of coating a portion of a base with a resist, forming a film thereon with a conductive material, and eluting or peeling the resist and the like using a solvent so that the conductive material on the resist is entirely removed, and then forming a film of the conductive material only on the portion which is not coated with the resist.

The thicknesses of the source material and the drain material are optional, but are respectively preferably 1 nm or greater and particularly preferably 10 nm or greater. Further, the thickness thereof is preferably 500 nm or less and particularly preferably 300 nm or less.

The space (channel length) between the source electrode and the drain electrode is optional, but is preferably 100 μm or less and particularly preferably 50 μm or less. Further, the channel width thereof is preferably 5000 μm or less and particularly preferably 1000 μm or less.

[Overcoat Layer]

The OTFT of the present invention may have an overcoat layer. The overcoat layer is typically a layer formed on the surface of an OTFT as a protective layer. The overcoat layer may have a single-layer structure or a multi-layer structure.

The overcoat layer may be organic or inorganic.

The material forming an organic overcoat layer is not particularly limited, and examples thereof include organic polymers such as polystyrene, an acrylic resin, polyvinyl alcohol, polyolefin, polyimide, polyurethane, polyacenaphthylene, and an epoxy resin, and derivatives obtained by introducing a crosslinkable group or a water-repellent group into these organic polymers. These organic polymers or derivatives thereof can be also used in combination with a crosslinking component, a fluorine compound, or a silicon compound.

The material forming an inorganic overcoat layer is not particularly limited, and examples thereof include metal oxides such as silicon oxide and aluminum oxide, and metal nitrides such as silicon nitride.

These materials may be used alone or in combination of optional two or more kinds thereof at an optional ratio.

A method of forming an overcoat layer is not limited and an overcoat layer can be formed according to known various methods.

For example, an organic overcoat layer can be formed using a method of coating an underlayer with a solution containing a material which becomes the overcoat layer and drying the layer, or a method of coating an underlayer with a solution containing a material which becomes the overcoat layer, drying the layer, exposing the layer to light, and developing the layer to be patterned. Moreover, the patterning of the overcoat layer can be directly formed using a printing method or an ink-jet method. In addition, after the overcoat layer is patterned, the overcoat layer may be cross-linked by being exposed to light or heated.

Meanwhile, an inorganic overcoat layer can be formed using a dry method such as a sputtering method or a vapor deposition method or a wet method such as a sol-gel method.

[Other Layers]

The OTFT of the present invention may be provided with other layers or members.

As other layers or members, a bank may be exemplified. A bank is used for the purpose of holding a discharge liquid in a predetermined position when a semiconductor layer or an overcoat layer is formed using an ink-jet method. For this reason, a bank typically has liquid repellency. Examples of forming a bank include a method of performing a liquid repellent treatment such as a fluorine plasma method after patterning is performed according to a photolithography method or the like and a method of curing a photosensitive composition or the like containing liquid repellent components such as a fluorine compound.

In a case of the organic thin-film transistor of the present invention, since a gate insulating layer is an organic layer, the latter method of curing a photosensitive composition containing liquid repellent components is preferable from the viewpoint that the gate insulating layer is not affected by the liquid repellent treatment. In addition, a technique of allowing a base to have a contrast of liquid repellency without using a bank so that the base plays the same role as that of a bank may be used.

[Manufacturing Method]

A method of manufacturing the organic thin-film transistor of the present invention (hereinafter, also referred to as a method of the present invention) is a method of by coating the substrate 6 or the gate insulating layer 2 with a coating solution containing the organic semiconductor and the resin (C), drying the same, and allowing the resin (C) to be unevenly distributed on the opposite side to the substrate 6 or the gate insulating layer 2.

The organic semiconductor and the resin (C) are as described above.

The coating solution may contain components other than the organic semiconductor and the resin (C). Examples thereof include a resin other than the resin (C), a compound that self-assembled such as a silane coupling agent, and a surfactant.

It is preferable that the coating solution contains a solvent. The solvent is not particularly limited as long as the solvent is allowed to dissolve and disperse the organic semiconductor and the block copolymer. Examples thereof include an organic solvent, water, and a mixed solvent of these.

Examples of the organic solvent include a hydrocarbon-based solvent such as hexane, octane, decane, toluene, xylene, mesitylene, ethylbenzene, tetralin, decalin, or 1-methylnaphthalene; a ketone-based solvent such as acetone, methyl ethyl ketone, methyl isobutyl ketone, or cyclohexanone; a halogenated hydrocarbon-based solvent such as dichloromethane, chloroform, tetrachloromethane, dichloroethane, trichloroethane, tetrachloroethane, chlorobenzene, dichlorobenzene, or chlorotoluene; an ester-based solvent such as ethyl acetate, butyl acetate, or amyl acetate; an alcohol-based solvent such as methanol, propanol, butanol, pentanol, hexanol, cyclohexanol, methyl cellosolve, ethyl cellosolve, or ethylene glycol; an ether-based solvent such as dibutyl ether, tetrahydrofuran, dioxane, or anisole; an amide or imide-based solvent such as N,N-dimethylformamide, N,N-dimethylacetamide, 1-methyl-2-pyrrolidone, or 1-methyl-2-imidazolidinone; a sulfoxide-based solvent such as dimethyl sulfoxide; and a nitrile-based solvent such as acetonitrile or benzonitrile.

The organic solvent may be used alone or in combination of two or more kinds thereof. As the organic solvent, toluene, xylene, mesitylene, tetralin, methyl ethyl ketone, cyclopentanon, dichloromethane, chloroform, chlorobenzene, dichlorobenzene, anisole, or benzonitrile is particularly preferable.

The concentration of the total solid content in the coating solution is preferably in a range of 0.01% by mass to 20% by mass, more preferably in a range of 0.1% by mass to 10% by mass, and particularly preferably in a range of 0.2% by mass to 5% by mass.

The total content of the resin (C) and the resin (D) in the coating solution is preferably in a range of 1% by mass to 80% by mass, more preferably in a range of 5% by mass to 60% by mass, and still more preferably in a range of 10% by mass to 50% by mass with respect to the total solid content.

Moreover, the mass ratio of the resin (C) is preferably 10% by mass or greater and less than 100% by mass and more preferably 20% by mass or greater and less than 100% by mass with respect to the total amount of the resin (C) and the resin (D).

The content of the organic semiconductor in the coating solution is preferably in a range of 20% by mass to 99% by mass, more preferably in a range of 40% by mass to 95% by mass, and still more preferably in a range of 50% by mass to 90% by mass with respect to the total solid content of the coating solution.

In the method of the present invention, the coating solution is applied. The coating solution is applied to the substrate or the gate insulating layer according to the type of the OTFT to be produced. That is, in a case of producing a bottom-gate type OTFT, the gate electrode and the gate insulating layer are prepared on the substrate, and the gate insulating layer is coated with the coating solution. Meanwhile, in a case of producing a top-gate type OTFT, the substrate (the source electrode and the drain electrode further provided on the substrate in a bottom-contact type OTFT) is coated with the coating solution.

The method of coating the substrate with the coating solution is not particularly limited, and the above-described methods can be employed. Among the methods, a printing method is preferable and a spin coating method is more preferable.

The coating conditions are not particularly limited. The substrate may be coated with the coating solution near room temperature or in a state in which heating is performed in order to increase the solubility of the organic semiconductor in the coating solvent. The coating temperature is preferably in a range of 15° C. to 150° C., more preferably in a range of 15° C. to 100° C., still more preferably in a range of 15° C. to 50° C., and particularly preferably near room temperature (20° C. to 30° C.).

When a spin coating method is used, it is preferable that the rotation speed is set to be in a range of 100 rpm to 3000 rpm.

In the method of the present invention, it is preferable that the applied coating solution is dried. The drying may be performed under the conditions in which the solvent can be volatilized and removed, and examples of the drying method include leaving the solution at room temperature, heating the solution for drying, blast drying, and drying the solution under reduced pressure.

In the method of the present invention, when the coating solution is applied and dried in the above described manner, the resin (C) and the organic semiconductor are unevenly distributed or phase-separated as described above.

Accordingly, in the manufacturing method of the present invention, a special treatment for uneven distribution of the resin (C) and the organic semiconductor is not necessary, but can be carried out. As such a treatment, annealing by heating (heating preferably at a temperature of Tg or higher of a resin) or solvent annealing that is performed through exposure to solvent vapor may be exemplified.

In addition, the gate electrode, the gate insulating film, the source electrode, and the drain electrode can be formed or provided by the above-described method.

In this manner, the OTFT of the present invention can be manufactured.

According to the method of the present invention, the coating solution containing the resin (C) and the organic semiconductor is applied, preferably dried, and then the resin (C) and the organic semiconductor are unevenly distributed so that the organic semiconductor layer 1 having a region 1A in which the resin (C) is unevenly distributed and a region 1B in which the organic semiconductor is unevenly distributed can be formed. Therefore, the organic semiconductor layer 1 exhibiting the above-described excellent characteristics can be formed while taking advantages of the method of applying a solution using an organic semiconductor.

[Display Panel]

A display panel may be exemplified as an example of the application of the organic thin-film transistor of the present invention. Examples of the display panel include a liquid crystal panel, an organic EL panel, and an electronic paper panel.

EXAMPLES

Hereinafter, the present invention will be described in detail based on examples, but the present invention is not limited to those examples.

Synthesis Example

Organic semiconductors used in the respective examples are shown below.

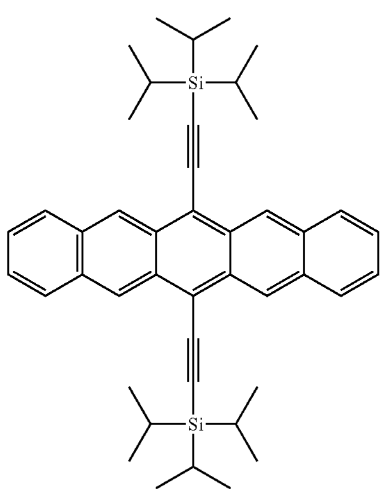

A6 (TIPS-pentacene)

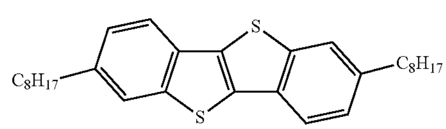

M3 (C8-BTBT)

-continued

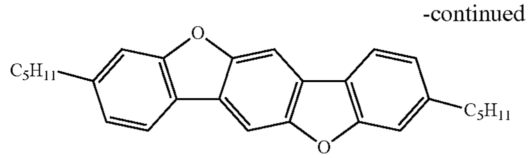

L9

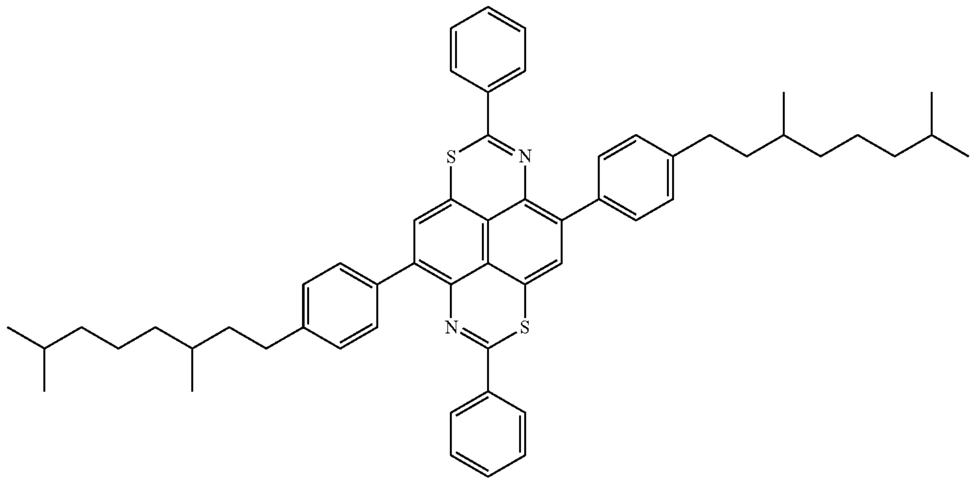

C16

The above-described compound L9 is a compound represented by Formula (L) and was synthesized according to a method described in Japan Society of Applied Physics Molecular Electronics an Bioelectronics Journal, 2011, 22, 9-12, and WO2009/148016A.

The above-described compound C16 is a compound represented by Formula (C) and was synthesized according to the following method of synthesizing the following compound C1.

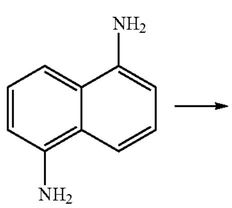

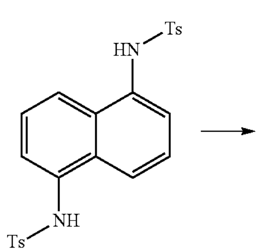

C1a

-continued

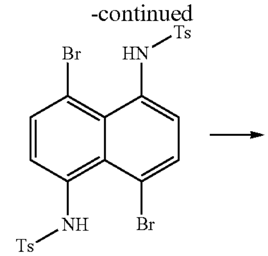

C1b

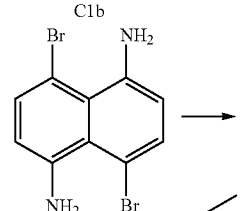

C1c

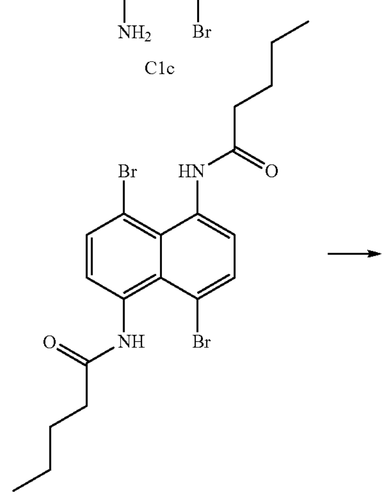

C1d

-continued

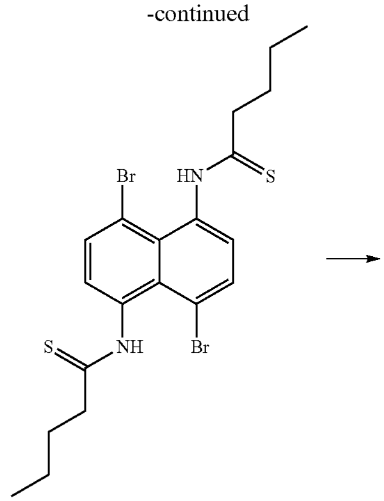

C1e

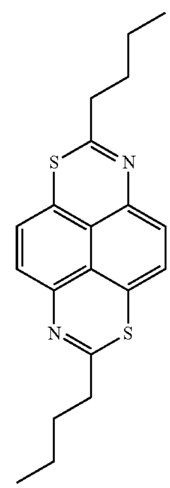

Compound C1

(Synthesis of Compound C1a)

p-toluenesulfonyl chloride (34 g) was slowly added to a pyridine solution (125 mL) of 1,5-diaminonaphthalene (10 g), and the solution was stirred at room temperature for 2 hours. The reaction solution was poured into ice water, and the precipitate was filtered under reduced pressure. The obtained crude crystals were washed with methanol, thereby obtaining a compound C1a (29 g).

(Synthesis of Compound C1b)

A glacial acetic acid solution of the compound C1a (10 g) was heated and stirred at 95° C., and bromine (2 mL) diluted with 10 mL of glacial acetic acid was slowly added dropwise to the solution. The solution was reacted for 10 minutes and filtered after the solution was left to be cooled, thereby obtaining crude crystals in the form of a gray solid. The crude crystals were re-crystallized in nitrobenzene, thereby obtaining a compound C1b (6.8 g).

(Synthesis of Compound C1c)

A concentrated sulfuric acid solution of the compound C1b (5 g) was stirred at room temperature for 24 hours. The reaction solution was poured into ice water, and the precipitated solid was filtered and collected. The solid was dispersed in ice water again, and neutralized in ammonia water, thereby obtaining a compound C1c (0.5 g).

(Synthesis of Compound C1d)

Pentanoyl chloride (valeric acid chloride) (2.6 mL) was added dropwise to a pyridine solution of the compound C1c (2 g) at room temperature, and the solution was stirred for 2 hours. The reaction solution was poured into ice water, and a solid was filtered under reduced pressure. The solid was dispersed in methanol and the solution was stirred for 1 hour, and the solid was filtered, thereby obtaining a compound C1d (1.39 g).

(Synthesis of Compound C1e)

The compound C1d (1.2 g) and a Lawesson's reagent (1.48 g) were added to a mixed solution of THF (360 mL) and toluene (72 mL), and then the solution was stirred for 3 hours while being heated and refluxed. Only THF was removed through evaporation to obtain a toluene solution, and then the solution was stirred at 60° C. for 1 hour. Thereafter, insoluble matters were filtered, thereby obtaining a compound C1e (0.5 g).

(Synthesis of Compound C1)

The compound C1e (0.4 g) and cesium carbonate (1.33 g) were allowed to react with each other in dimethylacetamide at 120° C. for 2 hours. The reaction solution was poured into water, and the precipitate was filtered. The filtered solid was repeatedly re-crystallized in THF, and a target compound C1 (0.12 g) was synthesized. The obtained compound C1 was identified by $^{1}$H-NMR and a mass spectrum.

Moreover, a compound A6 (TIPS-pentacene) and a compound M3 (C8-BTBT) were synthesized according to a known method.

The following resins were respectively used as the resin (C).

The weight-average molecular weight (Mw, in terms of standard polystyrene) and the dispersity (Pd) of each resin were measured using gel permeation chromatography (GPC, manufactured by Tosoh Corporation; HLC-8120; Tskgel Multipore HXL-M) and THF as a solvent.

Further, the compositional ratio of each resin (C) was calculated by $^{1}$H-NMR or $^{13}$C-NMR using an NMR determination device (AVANCEIII 400 type, manufactured by Bruker BioSpin K.K.).

Further, the surface energy of each resin was measured as described above.

The obtained results are described below. Further, the unit of the surface energy is $mNm^{-1}$.

(HR-40)

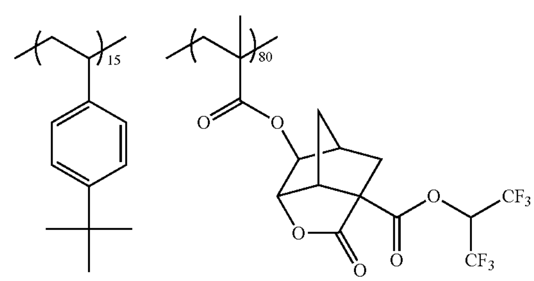

-continued
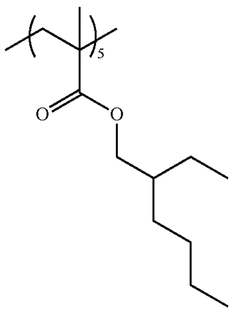
Mw 25000 Pd 1.55
Surface energy 18.0
(HR-60)
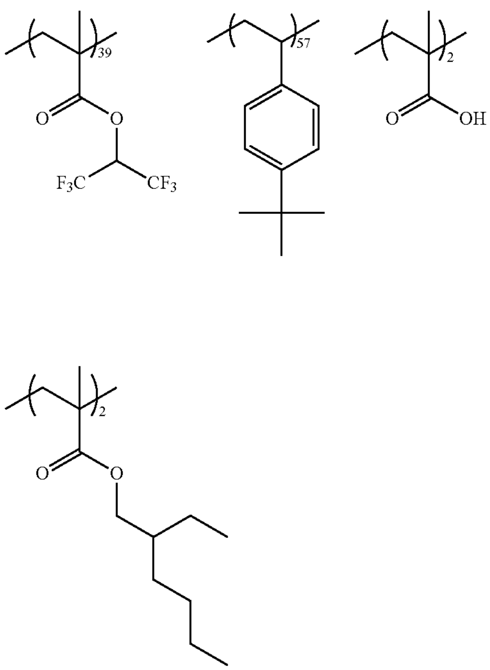
Mw 21000 Pd 1.35
Surface energy 17.5
(HR-24)
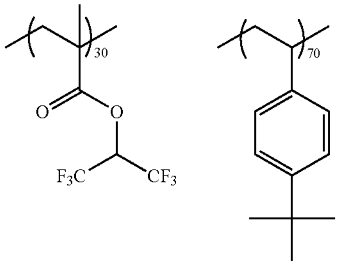
Mw 34000 Pd 1.68
Surface energy 17.5
-continued
(HR-61)
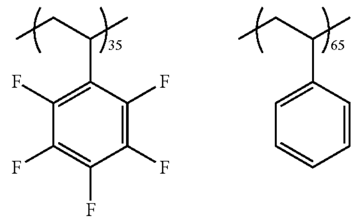
Mw 81000 Pd 1.95
Surface energy 24.9
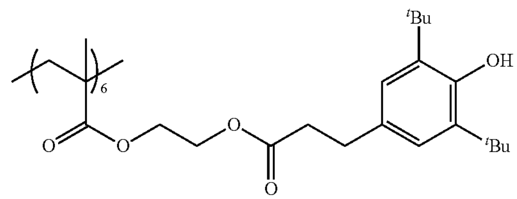
(HR-62)
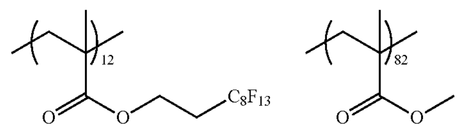
Mw 276000 Pd 2.20
Surface energy 13.8
(HR-14)
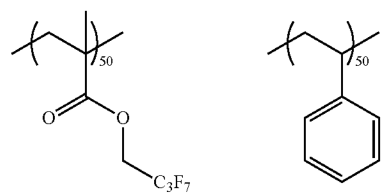
Mw 25300 Pd 1.60
Surface energy 16.5
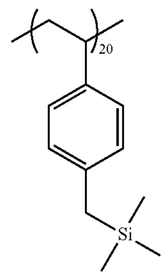
(HR-39)
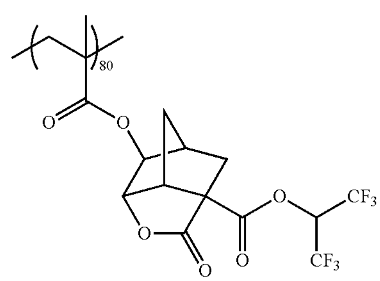
Mw 27000 Pd 1.52
Surface energy 17.7

-continued (HR-9)

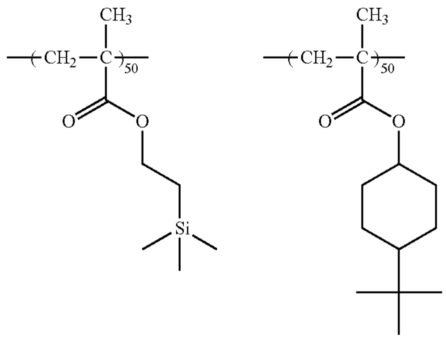

Mw 35900 Pd 1.80
Surface energy 26.8

(HR-38)

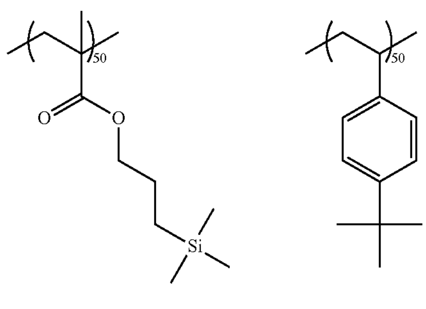

Mw 38000 Pd 1.56
Surface energy 25.0

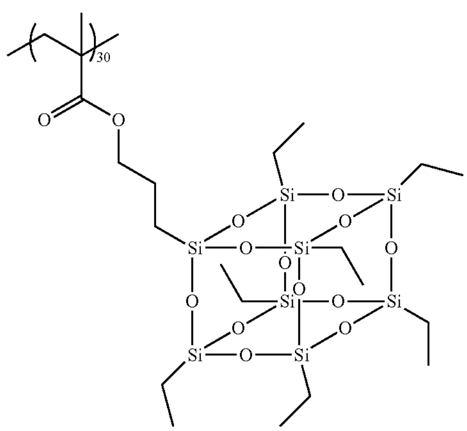

(HR-51)

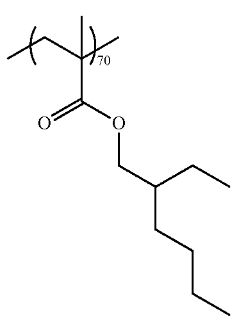

Mw 15000 Pd 2.56
Surface energy 19.5

-continued (HR-63)

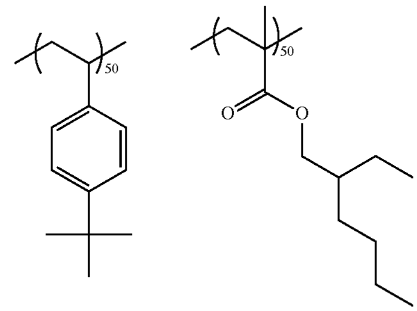

Mw 51000 Pd 1.45
Surface energy 29.6

The resin (HR-40) was synthesized according to the following scheme.

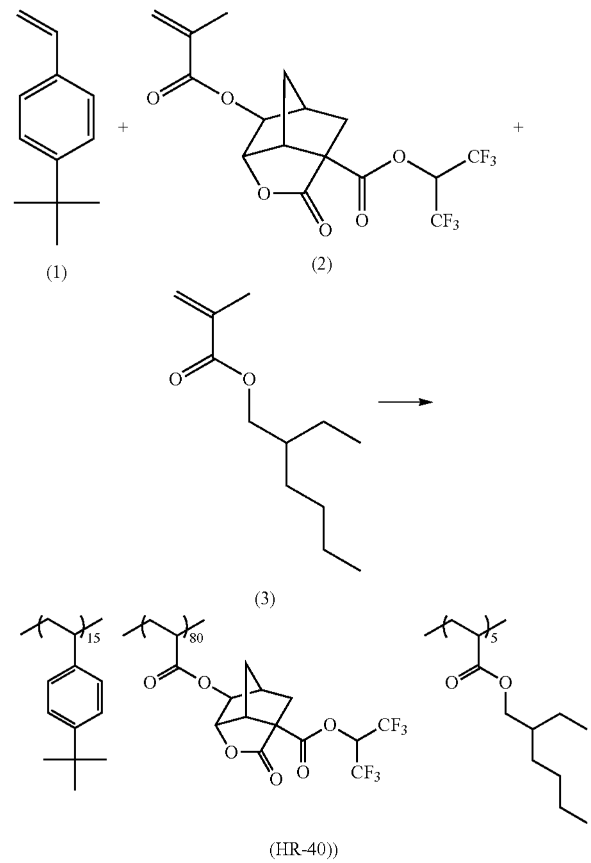

(HR-40))

1.20 g (7.5 mmol) of a compound (1), 16.69 g (40 mmol) of a compound (2), 0.46 g (2.5 mmol) of a compound (3), 0.69 g of a polymerization initiator V-601 (manufactured by Wako Pure Chemical Industries, Inc.) were dissolved in 90 g of cyclohexanone. 23 g of cyclohexanone was put into a reaction container and added dropwise to the system at 85° C. for 4 hours in a nitrogen gas atmosphere. After the reaction solution was heated and stirred for 2 hours and then left to be cooled to room temperature.

The reaction solution was added dropwise to 1350 g of a mixture of heptane and ethyl acetate at a mass ratio of 8:2, and the polymer was allowed to be precipitated and filtered. 400 g of a mixture of heptane and ethyl acetate at a mass ratio of 8:2 was used to wash the filtered solid. Thereafter, the washed solid was dried under reduced pressure, thereby obtaining 12.85 g of a resin (resin (HR-40)).

Other resins (C) used in the respective examples were synthesized in the same manner as described above.

The following resins were prepared for comparison.

Polystyrene (PS): manufactured by Sigma-Aldrich Co., LLC., weight-average molecular weight of 280000, surface energy of 38.4 $mNm^{-1}$ Poly(α-methylstyrene) (PαPS): synthesized according to a known method, weight-average molecular weight of 407000, dispersity of 1.34, surface energy of 33.7 $mNm^{-1}$ Polytetrafluoroethylene: manufactured by Sigma-Aldrich Co., LLC.

Polychlorotrifluoroethylene: manufactured by Sigma-Aldrich Co., LLC.

Example 1

[Manufacture of Bottom-Gate Type OTFT]

A bottom-gate bottom-contact type OTFT illustrated in FIG. 1A was prepared.

A doped silicon substrate (also serving as a gate electrode 5) having a thickness of 1 mm was used as a substrate 6, and a gate insulating layer 2 was formed thereon. The gate insulating layer 2 was formed in the following manner.

6.3 g of poly(4-vinylphenol) (trade name: VP-8000, manufactured by Nippon Soda Co., Ltd., Mn: 11000, dispersity: 1.1) and 2.7 g of 2,2-bis(3,5-dihydroxymethyl-4-hydroxy)propane serving as a crosslinking agent were completely dissolved in 91 g of a solvent in which 1-butanol and ethanol were mixed at a volume ratio of 1:1 at room temperature. The solution was filtered through a polytetrafluoroethylene (PTFE) membrane filter having a diameter (ϕ) of 0.2 μm. 0.18 g of diphenyliodonium hexafluorophosphate salt serving as an acid catalyst was added to the obtained filtrate, and the substrate 6 was coated with the solution and dried so that a film was formed thereon. Next, the film was heated at 100° C. to be cross-linked, and then the gate insulating layer 2 having a thickness of 0.7 μm was formed.

Subsequently, as the source electrode 3 and the drain electrode 4 illustrated in FIG. 1A, electrodes (gate width W=100 mm, gate length L=100 μm) formed of chromium and gold arranged in a comb shape were formed.

A coating solution forming an organic semiconductor layer was prepared by dissolving 2.5 mg of an organic semiconductor listed in the following Table 2 and 2.5 mg of a resin (C) listed in the following table 2 in 1 mL of toluene. Further, polytetrafluoroethylene and polychlorotrifluoroethylene were not dissolved in toluene and thus a coating solution was not able to be prepared.

The gate insulating layer 2, the source electrode 3, and the drain electrode 4 were coated with the prepared coating solution at 25° C. using a spin coating method (rotation speed: 500 rpm) such that the layer thickness after being dried became 150 nm. Next, the layer was dried at 80° C., thereby forming an organic semiconductor layer 1.

In the above-described manner, the OTFTs (sample Nos. 1-1 to 1-11, 2-1 to 2-11, 3-1 to 3-11, and 4-1 to 4-11 and sample Nos. c1-1 to c1-3, c2-1 to c2-3, c3-1 to c3-3, and c4-1 to c4-3 for comparison) illustrated in FIG. 1A were respectively prepared.

[Evaluation of Bottom-Gate Type OTFT]

The characteristics of the respective manufactured OTFTs were evaluated in the following manner. The results thereof are listed in Table 2.

(Evaluation of Uneven Distribution of Resin and Organic Semiconductor: Horizontal Direction)

Elemental mapping measurement was performed on the obtained respective OTFTs according to time-of-flight secondary ion mass spectrometry (TOF-SIMS) using ion beams for etching together by observing a plurality of optional sites of the surface of the organic semiconductor layer using a polarizing microscope.

As a result, in all the manufactured samples, the surface of the organic semiconductor layer had a substantially uniform composition.

(Evaluation of Uneven Distribution of Resin and Organic Semiconductor: Thickness Direction)

Elemental mapping measurement was performed on a plurality of optional sites selected in the thickness direction of the section obtained by cutting the organic semiconductor layer in the thickness direction in the respective OTFTs according to time-of-flight secondary ion mass spectrometry (TOF-SIMS) using ion beams for etching together in the same manner as in the above-described "evaluation of uneven distribution of resin (C): horizontal direction," and the state of uneven distribution of the resin (C) was evaluated based on the following evaluation standard. Further, the meaning of the uneven distribution and the phase separation is as described above.

A: A case where the organic semiconductor was unevenly distributed in the organic semiconductor layer 1 in the depth direction (gate insulating layer 2 side)

B: A case where the organic semiconductor was unevenly distributed (not including phase separation) in the organic semiconductor layer 1 in the depth direction C: A case where the organic semiconductor was unevenly distributed (not including phase separation) on the surface side of the organic semiconductor layer 1

D: A case where the resin and the organic semiconductor were not unevenly distributed (Evaluation of Carrier Mobility μ)

A voltage of −40 V was applied to a space between the source electrode 3 and the drain electrode 4 of each OTFT so that a gate voltage Vg was changed within a range of 40 V to −40 V, and a carrier mobility μ ($cm^2/Vs$) was calculated using the following equation representing a drain current Id.

$$Id=(w/2L)\mu Ci(Vg-Vth)^2$$

In the equation, L represents the gate length, w represents the gate width, Ci represents the capacity per unit area of the gate insulating layer 2, Vg represents the gate voltage, and Vth represents the threshold voltage.

(Evaluation of Maintenance Factor of Carrier Mobility)

After each OTFT was allowed to stand still at 25° C. for 2 weeks under atmospheric pressure, the carrier mobility μ was measured and the maintenance factor of the carrier mobility was calculated using the following equation.

Maintenance Factor of Carrier Mobility (%)=Mobility (after Standing Still for 2 Weeks)/Mobility (Initial Value)

(Measurement of On/Off Ratio)

The expression (maximum value of |Id|)/(minimum value of |Id|) was set as the On/Off ratio when the voltage applied to the space between the source electrode 3 and the drain electrode 4 of each OTFT was fixed to −40 V and the gate voltage Vg was changed from 40 V to −40 V.

(Measurement of Threshold Voltage Vth)

The threshold voltage Vth was measured by applying a voltage of −40 V to the space between the source electrode 3 and the drain electrode 4 of each OTFT and changing the gate voltage within the range of 40 V to −40 V.

TABLE 2

| Sample No. | Organic semiconductor | Resin (C) | Surface energy ($mNm^{-1}$) | Evaluation of uneven distribution | Mobility μ | Maintenance factor of mobility μ | On/Off ratio | Threshold voltage | Remarks |
|---|---|---|---|---|---|---|---|---|---|
| 1-1 | A6 | HR-40 | 18.0 | A | 0.9 | 99 | $1 \times 10^7$ | 4.0 | Present invention |
| 1-2 | A6 | HR-60 | 17.5 | A | 1.0 | 99 | $1 \times 10^7$ | 4.0 | Present invention |
| 1-3 | A6 | HR-24 | 17.5 | A | 1.0 | 99 | $2 \times 10^7$ | 3.9 | Present invention |
| 1-4 | A6 | HR-61 | 24.9 | A | 1.0 | 99 | $2 \times 10^7$ | 4.0 | Present invention |
| 1-5 | A6 | HR-62 | 13.8 | A | 0.8 | 98 | $8 \times 10^6$ | 4.3 | Present invention |
| 1-6 | A6 | HR-14 | 16.5 | A | 0.9 | 99 | $1 \times 10^7$ | 4.2 | Present invention |
| 1-7 | A6 | HR-39 | 17.7 | A | 0.8 | 98 | $8 \times 10^6$ | 4.3 | Present invention |
| 1-8 | A6 | HR-9 | 26.8 | B | 0.6 | 95 | $6 \times 10^6$ | 4.5 | Present invention |
| 1-9 | A6 | HR-38 | 25.0 | A | 0.7 | 96 | $6 \times 10^6$ | 4.4 | Present invention |
| 1-10 | A6 | HR-51 | 19.5 | B | 0.6 | 94 | $6 \times 10^6$ | 4.5 | Present invention |
| 1-11 | A6 | HR-63 | 29.6 | B | 0.4 | 92 | $4 \times 10^6$ | 4.7 | Present invention |
| c1-1 | A6 | PS | 38.4 | C | 0.1 | 75 | $5 \times 10^5$ | 5.1 | Comparative example |
| c1-2 | A6 | PαMS | 33.7 | C | 0.1 | 80 | $6 \times 10^5$ | 5.0 | Comparative example |
| c1-3 | A6 | Not available | | D | 0.1 | 70 | $6 \times 10^5$ | 5.5 | Comparative example |
| 2-1 | M3 | HR-40 | 18.0 | A | 1.0 | 97 | $1 \times 10^7$ | 4.3 | Present invention |
| 2-2 | M3 | HR-60 | 17.5 | A | 1.0 | 98 | $1 \times 10^7$ | 4.4 | Present invention |
| 2-3 | M3 | HR-24 | 17.5 | A | 1.1 | 98 | $2 \times 10^7$ | 4.2 | Present invention |
| 2-4 | M3 | HR-61 | 24.9 | A | 1.1 | 98 | $2 \times 10^7$ | 4.3 | Present invention |
| 2-5 | M3 | HR-62 | 13.8 | A | 1.1 | 98 | $1 \times 10^7$ | 4.3 | Present invention |
| 2-6 | M3 | HR-14 | 16.5 | A | 1.0 | 97 | $1 \times 10^7$ | 4.5 | Present invention |
| 2-7 | M3 | HR-39 | 17.7 | A | 0.9 | 96 | $8 \times 10^6$ | 4.6 | Present invention |
| 2-8 | M3 | HR-9 | 26.8 | B | 0.8 | 94 | $7 \times 10^6$ | 4.8 | Present invention |
| 2-9 | M3 | HR-38 | 25.0 | B | 0.8 | 95 | $7 \times 10^6$ | 4.7 | Present invention |
| 2-10 | M3 | HR-51 | 19.5 | B | 0.7 | 93 | $6 \times 10^6$ | 4.8 | Present invention |
| 2-11 | M3 | HR-63 | 29.6 | B | 0.5 | 90 | $4 \times 10^6$ | 4.9 | Present invention |
| c2-1 | M3 | PS | 38.4 | C | 0.1 | 70 | $5 \times 10^5$ | 5.3 | Comparative example |
| c2-2 | M3 | PαMS | 33.7 | C | 0.1 | 75 | $5 \times 10^5$ | 5.3 | Comparative example |
| c2-3 | M3 | Not available | | D | 0.1 | 65 | $5 \times 10^5$ | 5.8 | Comparative example |
| 3-1 | L9 | HR-40 | 18.0 | A | 1.2 | 98 | $2 \times 10^7$ | 3.7 | Present invention |
| 3-2 | L9 | HR-60 | 17.5 | A | 1.3 | 99 | $3 \times 10^7$ | 3.7 | Present invention |
| 3-3 | L9 | HR-24 | 17.5 | A | 1.3 | 99 | $3 \times 10^7$ | 3.6 | Present invention |
| 3-4 | L9 | HR-61 | 24.9 | A | 1.3 | 99 | $3 \times 10^7$ | 3.7 | Present invention |
| 3-5 | L9 | HR-62 | 13.8 | A | 1.2 | 98 | $2 \times 10^7$ | 3.9 | Present invention |
| 3-6 | L9 | HR-14 | 16.5 | A | 1.1 | 98 | $1 \times 10^7$ | 3.9 | Present invention |

TABLE 2-continued

| Sample No. | Organic semiconductor | Resin (C) | Surface energy ($mNm^{-1}$) | Evaluation of uneven distribution | Mobility μ | Maintenance factor of mobility μ | On/Off ratio | Threshold voltage | Remarks |
|---|---|---|---|---|---|---|---|---|---|
| 3-7 | L9 | HR-39 | 17.7 | A | 1.0 | 97 | $1 \times 10^7$ | 4.0 | Present invention |
| 3-8 | L9 | HR-9 | 26.8 | B | 0.7 | 95 | $8 \times 10^6$ | 4.2 | Present invention |
| 3-9 | L9 | HR-38 | 25.0 | A | 0.8 | 96 | $9 \times 10^6$ | 4.1 | Present invention |
| 3-10 | L9 | HR-51 | 19.5 | B | 0.7 | 95 | $7 \times 10^6$ | 4.2 | Present invention |
| 3-11 | L9 | HR-63 | 29.6 | B | 0.6 | 93 | $6 \times 10^6$ | 4.4 | Present invention |
| c3-1 | L9 | PS | 38.4 | C | 0.3 | 80 | $1 \times 10^6$ | 4.8 | Comparative example |
| c3-2 | L9 | PαMS | 33.7 | C | 0.3 | 85 | $1 \times 10^6$ | 4.9 | Comparative example |
| c3-3 | L9 | Not available | — | D | 0.3 | 75 | $1 \times 10^6$ | 5.2 | Comparative example |
| 4-1 | C16 | HR-40 | 18.0 | A | 1.3 | 98 | $3 \times 10^7$ | 3.9 | Present invention |
| 4-2 | C16 | HR-60 | 17.5 | A | 1.4 | 99 | $4 \times 10^7$ | 3.8 | Present invention |
| 4-3 | C16 | HR-24 | 17.5 | A | 1.4 | 99 | $4 \times 10^7$ | 3.8 | Present invention |
| 4-4 | C16 | HR-61 | 24.9 | A | 1.4 | 99 | $4 \times 10^7$ | 3.9 | Present invention |
| 4-5 | C16 | HR-62 | 13.8 | A | 1.3 | 99 | $3 \times 10^7$ | 4.0 | Present invention |
| 4-6 | C16 | HR-14 | 16.5 | A | 1.2 | 98 | $2 \times 10^7$ | 4.1 | Present invention |
| 4-7 | C16 | HR-39 | 17.7 | A | 1.0 | 97 | $1 \times 10^7$ | 4.2 | Present invention |
| 4-8 | C16 | HR-9 | 26.8 | B | 0.8 | 95 | $8 \times 10^6$ | 4.4 | Present invention |
| 4-9 | C16 | HR-38 | 25.0 | A | 0.9 | 96 | $1 \times 10^7$ | 4.3 | Present invention |
| 4-10 | C16 | HR-51 | 19.5 | B | 0.8 | 96 | $9 \times 10^6$ | 4.4 | Present invention |
| 4-11 | C16 | HR-63 | 29.6 | B | 0.6 | 93 | $6 \times 10^6$ | 4.6 | Present invention |
| c4-1 | C16 | PS | 38.4 | C | 0.5 | 80 | $1 \times 10^6$ | 5.1 | Comparative example |
| c4-2 | C16 | PαMS | 33.7 | C | 0.5 | 85 | $1 \times 10^6$ | 5.1 | Comparative example |
| c4-3 | C16 | Not available | — | D | 0.5 | 75 | $1 \times 10^6$ | 5.5 | Comparative example |

As listed in Table 2, when organic semiconductor layers were formed by combining resins (C) having the above-described specific groups with organic semiconductors, it was understood that the resins (C) and the organic semiconductor were unevenly distributed in the organic semiconductor layers in the thickness direction thereof and particularly the resins (C) were unevenly distributed on the surface side of the organic semiconductor layers.

Even when the types of the resin (C) and the organic semiconductor were changed, the uneven distribution of the resin (C) was confirmed.

In this manner, in an organic semiconductor layer formed by a resin (C) and an organic semiconductor being unevenly distributed, a region in which the organic semiconductor is unevenly distributed is adjacent to the gate insulating layer and the organic semiconductor layer is suitable for improving the performance of a bottom-gate type OTFT, particularly, a bottom-gate bottom-contact type OTFT. Specifically, even when any organic semiconductor was used, the OTFT of the present invention comprising the organic semiconductor layer formed by the resin (C) and the organic semiconductor being unevenly distributed was higher in the carrier mobility μ and the maintenance factor of the carrier mobility μ (excellent in durability) compared to the OTFTs (sample Nos. c1-3, c2-3, c3-3, and c4-3) comprising an organic semiconductor layer formed using only organic semiconductors. Further, the OTFT of the present invention had excellent characteristics of a high On/Off ratio, and a low threshold voltage Vth.

It was understood that the effect for improving the performance of the OTFT of the present invention was excellent compared to a case where organic semiconductor layers are formed by phase separation of PS and PαPS with respect to organic semiconductors (sample Nos. c1-1, c1-2, c2-1, c2-2, c3-1, c3-2, c4-1, and c4-2).

In consideration of the surface energy, particularly in a case where the surface energy of the resin (C) is 30 $mNm^{-1}$ or less, it was understood that the resin (C) is easily unevenly distributed on the surface side of the organic semiconductor layer and particularly this surface energy is preferable for a bottom-gate type OTFT.

When the surface energy of the resin (C) is 27 $mNm^{-1}$ or less, the above-described tendency becomes stronger, which is preferable. When the surface energy of the resin (C) is 25 $mNm^{-1}$ or less, the tendency of uneven distribution becomes even stronger so that phase separation occurs, which is more preferable.

When focusing on the specific groups included in the resin (C), there is a tendency that the characteristics of the OTFT are improved in order of a group having fluorine atoms, a group having silicon atoms, and a group which does not have a fluorine atom nor a silicon atom.

When focusing on the state of uneven distribution of the resin (C) and the organic semiconductor, there is a tendency that the characteristics of the OTFT are improved in order of phase separation (evaluated as A), uneven distribution (evaluated as B), uneven distribution (evaluated as C), and absence of uneven distribution (evaluated as D).

Further, polytetrafluoroethylene and polychlorotrifluoroethylene were not dissolved in toluene so that an OTFT was not able to be manufactured. Since a resin having fluorine directly in the main chain thereof has extremely low solubility in a solvent that dissolves an organic semiconductor, such as toluene, it is substantially difficult to use the resin for the purpose of the present invention.

Example 2

[Manufacture and Evaluation of Bottom-Gate Type OTFT]

In Example 2, a bottom-gate type OTFT was manufactured by changing the contents of the organic semiconductor and the resin (C), and the characteristics thereof were evaluated.

In other words, in each of the sample Nos. 1-4, 1-6, 1-10, 2-4, 2-6, 2-10, 3-4, 3-6, 3-10, 4-4, 4-6, and 4-10 in Example 1, OTFTs illustrated in FIG. 1A were respectively produced in the same manner as those in Example 1 except that 4 mg of the organic semiconductor and 1 mg of the resin (C) were dissolved in 1 mL of toluene for application or 3 mg of the organic semiconductor and 2 mg of the resin (C) were dissolved in 1 mL of toluene for application.

In each of the manufactured OTFTs, the carrier mobility μ, the maintenance factor of the carrier mobility μ, the On/Off ratio, the threshold voltage Vth were evaluated in the same manner as those in Example 1. As a result, the same results as those in Example 1 were obtained.

Example 3

[Manufacture and Evaluation of Bottom-Gate Type OTFT]

In Example 3, a bottom-gate type OTFT was manufactured using the resin (C) and PαMS as resins combined with the organic semiconductor, and the characteristics thereof were evaluated.

In other words, OTFTs illustrated in FIG. 1A were respectively manufactured in the same manner as those of the sample Nos. 1-3, 2-3, 3-3, and 4-3 except that a half (1.25 mg) of the resin (HR-24) was replaced by PαMS (the total amount of the resin (HR-24) and PαMS was 2.5 mg) in the sample Nos. 1-3, 2-3, 3-3, and 4-3 of Example 1.

Further, OTFTs illustrated in FIG. 1A were respectively manufactured in the same manner as those of the sample Nos. 1-4, 2-4, 3-4, and 4-4 except that a half (1.25 mg) of the resin (HR-61) was replaced by PαMS (the total amount of the resin (HR-24) and PαMS was 2.5 mg) in the sample Nos. 1-4, 2-4, 3-4, and 4-4 of Example 1.

In each of the manufactured OTFTs, the carrier mobility μ, the maintenance factor of the carrier mobility μ, the On/Off ratio, the threshold voltage Vth were evaluated in the same manner as those in Example 1. As a result, the same results as those in Example 1 were obtained.

Example 4

[Manufacture and Evaluation of Bottom-Gate Type OTFT]

In Example 4, a bottom-gate type OTFT was manufactured using an organic semiconductor other than the above-described organic semiconductors, and the characteristics thereof were evaluated.

In other words, OTFTs illustrated in FIG. 1A were respectively produced in the same manner as in Example 1 except that A26, A27, C1, C4, C7, D1, E2, F2, F5, F10, G12, G14, H10, H11, J2, J3, K2, K3, L2, L5, L5, L6, L8, L15, M8, N4, P3, Q3, R1, S1, or T1 described above was used as the organic semiconductor in Example 1.

In each of the manufactured OTFTs, the carrier mobility μ, the maintenance factor of the carrier mobility μ, the On/Off ratio, the threshold voltage Vth were evaluated in the same manner as those in Example 1. As a result, the same results as those in Example 1 were obtained.

Example 5

[Manufacture and Evaluation of Bottom-Gate Type OTFT]

In Example 5, a bottom-gate type OTFT was manufactured by changing the organic polymer forming the gate insulating layer 2, and the characteristics thereof were evaluated.

In other words, OTFTs illustrated in FIG. 1A were respectively produced in the same manner as in Example 1 except that the organic polymer forming the gate insulating layer 2 was replaced by poly(4-vinylphenol) and polyvinyl phenol (VP-8000, manufactured by Nippon Soda Co., Ltd., Mn: 11000, dispersity: 1.1), polysilsesquioxane (OX-SQ HDXOX-SQ NDX, manufactured by Toagosei Company, Ltd.), or a fluorine resin (CYTOP (registered trademark), CTL-809M, manufactured by ASAHI GLASS CO., LTD.) was used in Example 1.

In each of the manufactured OTFTs, the carrier mobility μ, the maintenance factor of the carrier mobility μ, the On/Off ratio, the threshold voltage Vth were evaluated in the same manner as those in Example 1. As a result, the same results as those in Example 1 were obtained.

Example 6

[Manufacture and Evaluation of Bottom-Gate Type OTFT]

In Example 6, a bottom-gate type OTFT comprising the gate insulating layer 2 formed of an inorganic oxide was manufactured, and the characteristics thereof were evaluated.

In other words, OTFTs illustrated in FIG. 1A were respectively produced in the same manner as in Example 1 except that a silicon substrate formed by thermally oxidizing 0.3 μm of the surface thereof and forming $SiO_2$ was used as the gate insulating layer 2 in place of the organic polymer forming the gate insulating layer 2 in Example 1.

In each of the manufactured OTFTs, the carrier mobility μ, the maintenance factor of the carrier mobility μ, the On/Off ratio, the threshold voltage Vth were evaluated in the same manner as those in Example 1. As a result, the same results as those in Example 1 were obtained.

The present invention has been described with reference to the embodiments, but the detailed description of the invention is not limited unless otherwise noted and the present invention should be broadly interpreted without departing from the spirit and the scope described in the aspects of the invention.

The present application claims priority based on Japanese Patent Application No. 2014-40903 filed in Japan on Mar. 3, 2014 and the contents of which are incorporated herein by reference.

EXPLANATION OF REFERENCES

1: organic semiconductor layer
1A: region having large content of resin (C) (layer formed of resin (C))
1B: region having large content of organic semiconductor (layer formed of organic semiconductor)
2: gate insulating layer
3: source electrode
4: drain electrode
5: gate electrode
6: substrate

What is claimed is:

1. An organic thin-film transistor comprising, on a substrate:

a gate electrode;
an organic semiconductor layer;
a gate insulating layer provided between the gate electrode and the organic semiconductor layer; and
a source electrode and a drain electrode provided in contact with the organic semiconductor layer and connected to each other through the organic semiconductor layer,
wherein the organic semiconductor layer includes an organic semiconductor and a resin (C) having one or more groups selected from the group consisting of a group having fluorine atoms, a group having silicon atoms, an alkyl group having one or more carbon atoms or having two or more carbon atoms in a case of forming an alkoxycarbonyl group, a cycloalkyl group, an aralkyl group, an aryloxycarbonyl group, an aromatic ring group substituted with at least one alkyl group, and an aromatic ring group substituted with at least one cycloalkyl group,
wherein the organic semiconductor is a condensed polycyclic aromatic compound selected from the group consisting of an acene represented by the following Formula (A4) and a compound represented by any one of the following Formulae (C), (L) and (M),
wherein the resin (C) has a repeating unit represented by any one of the following Formulae (C-Ia) and (C-Ib):

Formula (A4)

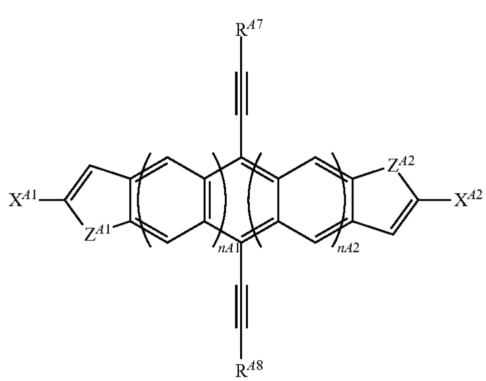

wherein, in the formula (A4), $R^{A7}$, $R^{A8}$, $X^{A1}$, and $X^{A2}$ represent a hydrogen atom or a substituent; $R^{A7}$, $R^{A8}$, $X^{A1}$, and $X^{A2}$ may be the same as or different from each other; $Z^{A1}$ and $Z^{A2}$ represent S, O, Se, or Te;
nA1 and nA2 represent an integer of 0 to 3; and
nA1 and nA2 do not represent 0 at the same time, Formula (C)

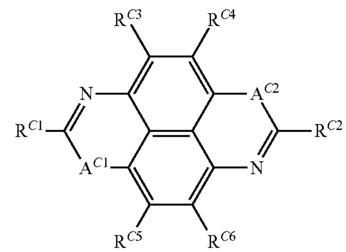

Formula (L)

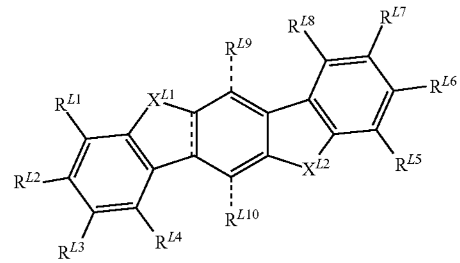

Formula (M)

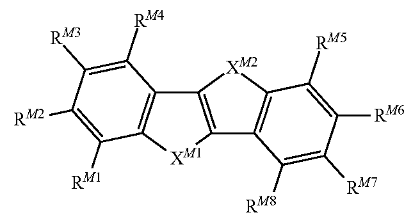

wherein, in Formula (C), $A^{C1}$ and $A^{C2}$ represent an oxygen atom, a sulfur atom, or a selenium atom;
$R^{C1}$ to $R^{C6}$ represent a hydrogen atom or a substituent, and at least one of $R^{C1}$ to $R^{C6}$ represents a substituent represented by the following Formula (W);
wherein, in Formula (L), $X^{L1}$ and $X^{L2}$ represent an oxygen atom, a sulfur atom, or $NR^{L11}$;
$R^{L1}$ to $R^{L11}$ represent a hydrogen atom or a substituent, and at least one of $R^{L1}$ to $R^{L11}$ represents a substituent represented by the following Formula (W);
wherein, in Formula (M), $X^{M1}$ and $X^{M2}$ represent an oxygen atom, a sulfur atom, a selenium atom, or $NR^{M9}$;
$R^{M1}$ to $R^{M9}$ represent a hydrogen atom or a substituent, and at least one of $R^{M1}$ to $R^{M9}$ represents a substituent represented by the following Formula (W);

$$-L-R^W \qquad \text{Formula (W):}$$

wherein, in Formula (W), L represents a divalent linking group represented by any one of the following Formulae (L-1) to (L-25) or a divalent linking group in which two or more divalent linking groups represented by any one of the following Formulae (L-1) to (L25) are bonded to each other;
$R^W$ represents a substituted or unsubstituted alkyl group, a cyano group, a vinyl group, an ethynyl group, an oxyethylene group, an oligooxyethylene group in which a repeating number v of oxyethylene units is 2 or greater, a siloxane group, an oligosiloxane group having 2 or more silicon atoms, or a substituted or unsubstituted trialkylsilyl group;

(L-1)
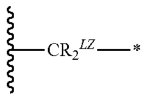
(L-2)
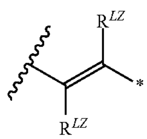
(L-3)
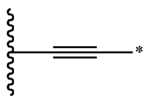
(L-4)
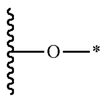
(L-5)
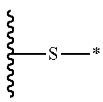
(L-6)
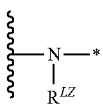
(L-7)
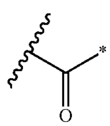
(L-8)
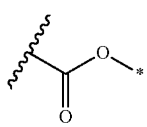
(L-9)
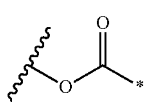
(L-10)
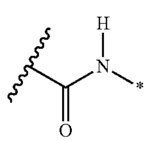
(L-11)
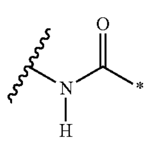
(L-12)
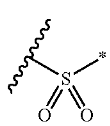
(L-13)
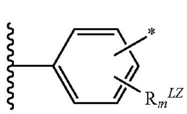
-continued
(L-14)
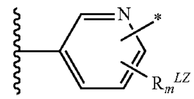
(L-15)
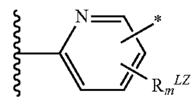
(L-16)
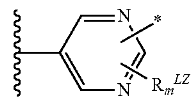
(L-17)
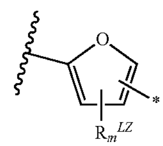
(L-18)
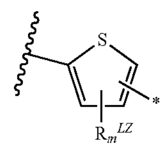
(L-19)
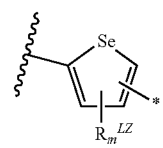
(L-20)
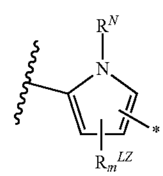
(L-21)
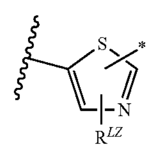
(L-22)
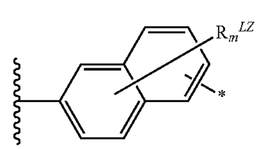
(L-23)
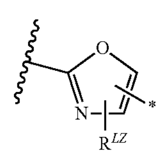
(L-24)
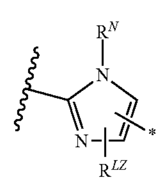

-continued (L-25)

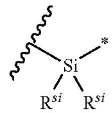

wherein, in Formulae (L-1) to (L-25), each wavy line part represents a binding position with respect to a ring forming each skeleton represented by any one of Formulae (C), (L) and (M), and the symbol "*" represents a binding position with respect to $R^w$ or a binding position with respect to a wavy line part represented by Formula (L-1) to (L-25);

m in Formula (L-13) represents 4, m's in Formulae (L-14) and (L-15) represent 3, m's in Formulae (L-16) to (L-20) represent 2, and m in Formula (L-22) represents 6;

$R^{LZ}$'s in Formulae (L-1), (L-2), (L-6), and (L-13) to (L-24) each independently represent a hydrogen atom or a substituent; and $R^N$'s represent a hydrogen atom or a substituent, and $R^{si}$'s each independently represent a hydrogen atom, an alkyl group, an alkenyl group, or an alkynyl group, (C-Ia)

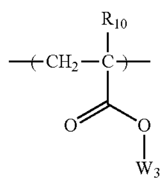

(C-Ib)

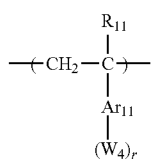

wherein, in the formulae (C-Ia) and (C-Ib), $R_{10}$ and $R_{11}$ represent a hydrogen atom, a fluorine atom, or an alkyl group;

$W_3$ represents an organic group having one or more groups selected from the group consisting of a group having fluorine atoms, a group having silicon atoms, an alkyl group having two or more carbon atoms, a cycloalkyl group, an aryl group, and an aralkyl group;

$W_4$ represents an organic group having one or more groups selected from the group consisting of a fluorine atom, a group having fluorine atoms, a group having silicon atoms, an alkyl group having 2 or more carbon atoms, and a cycloalkyl group;

$Ar_{11}$ represents an (r+1)-valent aromatic ring group; and r represents an integer of 1 to 10.

2. The organic thin-film transistor according to claim 1, wherein the resin (C) has at least one of a group having fluorine atoms or a group having silicon atoms.

3. The organic thin-film transistor according to claim 1, wherein the organic semiconductor is unevenly distributed on the gate insulating layer side, and the resin (C) is unevenly distributed on the opposite side to the gate insulating layer.

4. The organic thin-film transistor according to claim 1, wherein the organic semiconductor is phase-separated on the gate insulating layer side, and the resin (C) is phase-separated on the opposite side to the gate insulating layer.

5. The organic thin-film transistor according to claim 1, wherein the surface energy of the resin (C) is 30 $mNm^{-1}$ or less.

6. The organic thin-film transistor according to claim 1, wherein the organic thin-film transistor is a bottom-gate type OTFT.

7. The organic thin-film transistor according to claim 6, wherein the organic thin-film transistor is a bottom-contact type OTFT.

8. The organic thin-film transistor according to claim 1, wherein the organic semiconductor is a low molecular weight compound.

9. The organic thin-film transistor according to claim 1, wherein the organic semiconductor is a condensed polycyclic aromatic compound.

10. The organic thin-film transistor according to claim 1, wherein the organic semiconductor is a compound represented by any one of the Formulae (C), (F), (J), and (L).

11. The organic thin-film transistor according to claim 1, wherein the gate insulating layer is formed of an organic polymer.

12. A method for manufacturing an organic thin-film transistor which includes, on a substrate, a gate electrode; an organic semiconductor layer; a gate insulating layer provided between the gate electrode and the organic semiconductor layer; and a source electrode and a drain electrode provided in contact with the organic semiconductor layer and connected to each other through the organic semiconductor layer, the method comprising:

coating the substrate or the gate insulating layer with a coating solution which contains an organic semiconductor and a resin (C) having one or more groups selected from the group consisting of a group having fluorine atoms, a group having silicon atoms, an alkyl group having one or more carbon atoms or having two or more carbon atoms in a case of forming an alkoxycarbonyl group, a cycloalkyl group, an aralkyl group, an aryloxycarbonyl group, an aromatic ring group substituted with at least one alkyl group, and an aromatic ring group substituted with at least one cycloalkyl group, wherein the organic semiconductor is a condensed polycyclic aromatic compound selected from the group consisting of an acene represented by the following Formula (A4) and a compound represented by any one of the following Formulae (C), (L) and (M), wherein the resin (C) has a repeating unit represented by any one of the following Formulae (C-Ia) and (C-Ib):

Formula (A4)

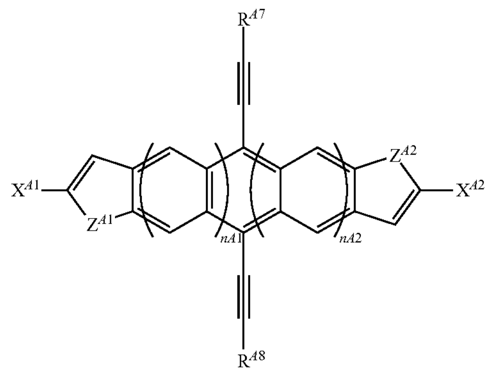

wherein, in the formula (A4), $R^{A7}$, $R^{A8}$, $X^{A1}$, and $X^{A2}$ represent a hydrogen atom or a substituent;

$R^{A7}$, $R^{A8}$, $X^{A1}$, and $X^{A2}$ may be the same as or different from each other; $Z^{A1}$ and $Z^{A2}$ represent S, O, Se, or Te;

nA1 and nA2 represent an integer of 0 to 3; and nA1 and nA2 do not represent 0 at the same time, Formula (C)

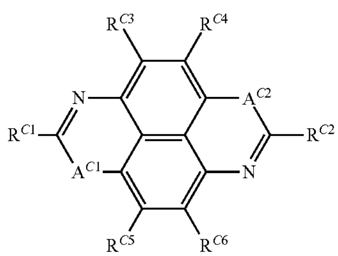

Formula (L)

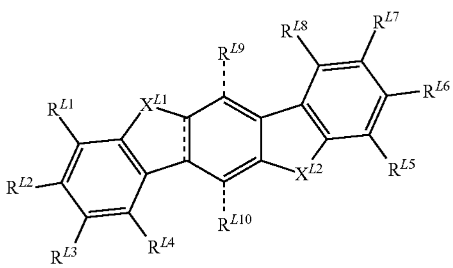

Formula (M)

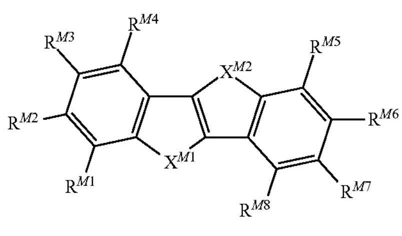

wherein, in Formula (C), $A^{C1}$ and $A^{C2}$ represent an oxygen atom, a sulfur atom, or a selenium atom;

$R^{C1}$ to $R^{C6}$ represent a hydrogen atom or a substituent, and at least one of $R^{C1}$ to $R^{C6}$ represents a substituent represented by the following Formula (W);

wherein, in Formula (L), $X^{L1}$ and $X^{L2}$ represent an oxygen atom, a sulfur atom, or $NR^{L11}$;

$R^{L1}$ to $R^{L11}$ represent a hydrogen atom or a substituent, and at least one of $R^{L1}$ to $R^{L11}$ represents a substituent represented by the following Formula (W);

wherein, in Formula (M), $X^{M1}$ and $X^{M2}$ represent an oxygen atom, a sulfur atom, a selenium atom, or $NR^{M9}$;

$R^{M1}$ to $R^{M9}$ represent a hydrogen atom or a substituent, and at least one of $R^{M1}$ to $R^{M9}$ represents a substituent represented by the following Formula (W);

$$-L-R^{W} \quad \text{Formula (W):}$$

wherein, in Formula (W), L represents a divalent linking group represented by any one of the following Formulae (L-1) to (L-25) or a divalent linking group in which two or more divalent linking groups represented by any one of the following Formulae (L-1) to (L25) are bonded to each other;

$R^{W}$ represents a substituted or unsubstituted alkyl group, a cyano group, a vinyl group, an ethynyl group, an oxyethylene group, an oligooxyethylene group in which a repeating number v of oxyethylene units is 2 or greater, a siloxane group, an oligosiloxane group having 2 or more silicon atoms, or a substituted or unsubstituted trialkylsilyl group;

(L-1)

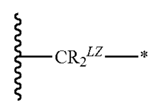

(L-2)

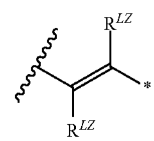

(L-3)

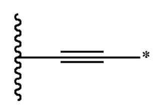

(L-4)

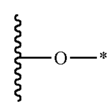

(L-5)

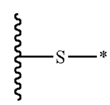

(L-6)

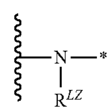

(L-7)

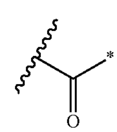

(L-8)

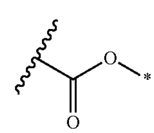

(L-9)

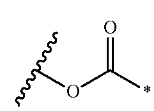

-continued (L-10)

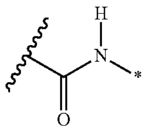

(L-11)

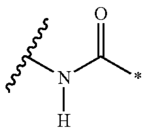

(L-12)

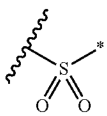

(L-13)

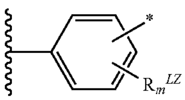

(L-14)

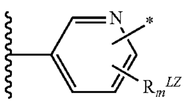

(L-15)

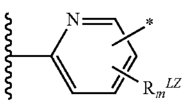

(L-16)

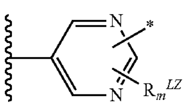

(L-17)

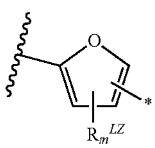

(L-18)

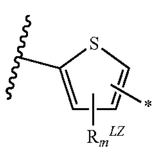

(L-19)

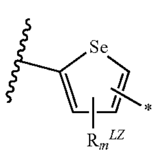

(L-20)

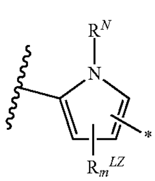

-continued (L-21)

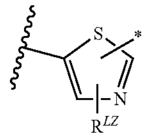

(L-22)

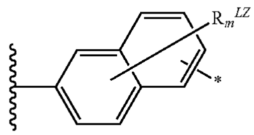

(L-23)

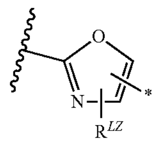

(L-24)

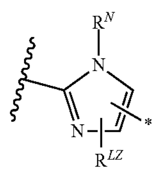

(L-25)

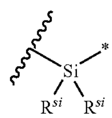

wherein, in Formulae (L-1) to (L-25), each wavy line part represents a binding position with respect to a ring forming each skeleton represented by any one of Formulae (C), (L) and (M), and the symbol "*" represents a binding position with respect to $R^w$ or a binding position with respect to a wavy line part represented by Formula (L-1) to (L-25);

m in Formula (L-13) represents 4, m's in Formulae (L-14) and (L-15) represent 3, m's in Formulae (L-16) to (L-20) represent 2, and m in Formula (L-22) represents 6;

$R^{LZ}$'s in Formulae (L-1), (L-2), (L-6), and (L-13) to (L-24) each independently represent a hydrogen atom or a substituent; and $R^N$'s represent a hydrogen atom or a substituent, and $R^{si}$'s each independently represent a hydrogen atom, an alkyl group, an alkenyl group, or an alkynyl group, (C-Ia)

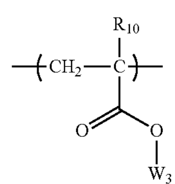

(C-Ib)

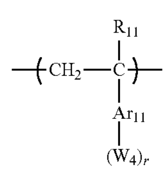

wherein, in the formulae (C-Ia) and (C-Ib), $R_{10}$ and $R_{11}$ represent a hydrogen atom, a fluorine atom, or an alkyl group;

$W_3$ represents an organic group having one or more groups selected from the group consisting of a group having fluorine atoms, a group having silicon atoms, an alkyl group having two or more carbon atoms, a cycloalkyl group, an aryl group, and an aralkyl group;

$W_4$ represents an organic group having one or more groups selected from the group consisting of a fluorine atom, a group having fluorine atoms, a group having silicon atoms, an alkyl group having 2 or more carbon atoms, and a cycloalkyl group;

$Ar_{11}$ represents an (r+1)-valent aromatic ring group; and r represents an integer of 1 to 10.

13. The method for manufacturing an organic thin-film transistor according to claim 12, wherein the resin (C) is unevenly distributed on the opposite side to the substrate or the gate insulating layer by the coating of the substrate or the gate insulating layer with the coating solution.

* * * * *